(12) United States Patent
Umehara et al.

(10) Patent No.: US 7,854,960 B2
(45) Date of Patent: *Dec. 21, 2010

(54) METHOD OF MANUFACTURING AN OPTICAL DEVICE, A METHOD OF MANUFACTURING A COLOR FILTER AND A METHOD OF MANUFACTURING AN ORGANIC ELECTROLUMINESCENCE DEVICE

(75) Inventors: Masaaki Umehara, Tokyo (JP); Teruhiko Kai, Tokyo (JP); Masayuki Kotani, Tokyo (JP)

(73) Assignee: Toppan Printing Co., Ltd. (JP)

( * ) Notice: Subject to any disclaimer, the term of this patent is extended or adjusted under 35 U.S.C. 154(b) by 832 days.

This patent is subject to a terminal disclaimer.

(21) Appl. No.: 11/807,268

(22) Filed: May 24, 2007

(65) Prior Publication Data

US 2008/0055350 A1 Mar. 6, 2008

(30) Foreign Application Priority Data

Aug. 31, 2006 (JP) .............................. 2006-235261

(51) Int. Cl.
*B05D 5/12* (2006.01)
*B05D 5/06* (2006.01)
(52) U.S. Cl. ............................ 427/58; 427/66; 427/162
(58) Field of Classification Search ................... 427/58, 427/66, 162
See application file for complete search history.

(56) References Cited

U.S. PATENT DOCUMENTS 5,956,063 A 9/1999 Yokoi et al.
5,984,470 A * 11/1999 Sakino et al. ............... 347/106
6,022,647 A 2/2000 Hirose et al.
6,136,481 A 10/2000 Aoki
6,158,858 A 12/2000 Fujiike et al.
6,203,604 B1 * 3/2001 Kashiwazaki et al. ...... 106/31.5
6,207,948 B1 3/2001 Yokoi et al.
6,244,702 B1 6/2001 Sakino et al.
6,270,178 B1 8/2001 Wada et al.
6,394,578 B1 5/2002 Akahira et al.
6,471,352 B2 * 10/2002 Akahira ..................... 347/106
6,500,485 B1 12/2002 Yamaguchi et al.
6,604,821 B1 8/2003 Akahira et al.

(Continued)

FOREIGN PATENT DOCUMENTS

JP 08-292319 11/1996

(Continued)

*Primary Examiner*—Shamim Ahmed
(74) *Attorney, Agent, or Firm*—Squire, Sanders & Dempsey L.L.P.

(57) ABSTRACT

In one embodiment of the present invention, an optical device is manufactured by printing a pixel, wherein said method includes deciding plural discharging positions inside each pixel of the optical device, arranging these plural discharging positions on different positions in lateral direction of the pixel respectively, specifying each of the plural nozzles by a natural number n counted sequentially from the end of the ink jet head, defining a surplus as b when dividing the natural number n with the repetitive number a (b is an integer satisfying: $0 \leq b \leq a-1$), corresponding the surplus b to each of the plural nozzles, repeating a unit step of discharging an ink from nozzles corresponding to the surplus b, finding "discharge coefficient" by measuring unevenness of ink discharging and changing the number of times of ink discharging.

24 Claims, 37 Drawing Sheets

U.S. PATENT DOCUMENTS

| | | | |
|---|---|---|---|
| 6,627,364 | B2 | 9/2003 | Kiguchi et al. |
| 6,645,029 | B2 | 11/2003 | Akahira |
| 6,660,332 | B2 | 12/2003 | Kawase et al. |
| 6,692,095 | B1 | 2/2004 | Marumoto et al. |
| 6,758,550 | B2 | 7/2004 | Ito et al. |
| 6,783,208 | B2 * | 8/2004 | Kawase et al. ............... 347/41 |
| 6,871,943 | B2 | 3/2005 | Ogawa |
| 7,015,503 | B2 | 3/2006 | Seki et al. |
| 7,090,728 | B2 | 8/2006 | Nakamura |
| 7,101,440 | B2 | 9/2006 | Nakamura et al. |
| 7,252,359 | B2 * | 8/2007 | Udagawa .................... 347/19 |
| 7,368,145 | B2 * | 5/2008 | Ito et al. ..................... 427/66 |
| 2002/0105688 | A1 * | 8/2002 | Katagami et al. ........... 358/505 |
| 2002/0167268 | A1 | 11/2002 | Aruga et al. |
| 2004/0048950 | A1 | 3/2004 | Nishida et al. |
| 2004/0174469 | A1 * | 9/2004 | Takagi et al. ................. 349/57 |
| 2004/0229139 | A1 | 11/2004 | Tanaka et al. |
| 2006/0134315 | A1 * | 6/2006 | Elrod .......................... 427/8 |

FOREIGN PATENT DOCUMENTS

| | | |
|---|---|---|
| JP | 2001-228320 | 8/2001 |
| JP | 2002-022929 | 1/2002 |
| JP | 2002-022930 | 1/2002 |
| JP | 2002-035666 | 2/2002 |
| JP | 2002-107528 | 4/2002 |
| JP | 2002-207112 | 7/2002 |
| JP | 2002-214421 | 7/2002 |
| JP | 2002-221616 | 8/2002 |
| JP | 2002-221617 | 8/2002 |
| JP | 2002-347238 | 12/2002 |
| JP | 2003-084127 | 3/2003 |
| JP | 2003-121384 | 4/2003 |
| JP | 2003-127343 | 5/2003 |
| JP | 2003-270425 | 9/2003 |
| JP | 2004-004803 | 1/2004 |
| JP | 2004-094218 | 3/2004 |
| JP | 2004-105948 | 4/2004 |
| JP | 2006-095427 | 4/2006 |
| JP | 2006-133396 | 5/2006 |
| JP | 2006-171453 | 6/2006 |
| WO | WO2005101910 | 10/2005 |

* cited by examiner

A:1 discharge, B:the number of times of discharging, C:total amount of discharged ink $$b = \begin{bmatrix} \begin{array}{cccccccc} 2 & 0 & 1 & 2 & 0 & 1 & 2 & 0 \\ \circ & \circ & \bullet & \circ & \circ & \bullet & \circ & \circ \end{array} \end{bmatrix}$$

drop 12.2pl    6.0pl

FIG.31 b = 2 0 1 2 0 1 2 0

○ ○ ● ○ ○ ● ○ ○ drop

| a surplus $b_n$ | the number of times of ink discharging | discharge coefficient (n) | discharge coefficient (a, left) | discharge coefficient (a, right) | discharge coefficient (a) | total coefficient | an amount of discharged ink from a nozzle | a total of an amount of discharged ink |
|---|---|---|---|---|---|---|---|---|
| 1 | 7 | 0.96 | 1.09 |  | 1.09 | 1.046 | 43.949 | 402.009 |
| 2 | 10 | 0.978 | 1.13 |  | 1.13 | 1.105 | 66.308 |  |
| 0 | 9 | 1.06 | 1.12 | 1.01 | 1.13 | 1.198 | 64.681 |  |
| 1 | 9 | 1.02 | 1.03 | 1.04 | 1.07 | 1.091 | 58.936 | difference between an ideal amount and a calculated amount |
| 2 | 10 | 1.038 |  | 1.13 | 1.13 | 1.173 | 70.376 | 0.009 |
| 0 | 8 | 1.081 |  | 1.11 | 1.11 | 1.2 | 57.596 |  |
| 1 | 6 | 1.033 |  | 1.08 | 1.08 | 1.116 | 40.163 |  |

FIG.37

METHOD OF MANUFACTURING AN OPTICAL DEVICE, A METHOD OF MANUFACTURING A COLOR FILTER AND A METHOD OF MANUFACTURING AN ORGANIC ELECTROLUMINESCENCE DEVICE

CROSS REFERENCE

This application claims priority to Japanese application number 2006-235261, filed on Aug. 31, 2006, which is incorporated herein by reference.

BACKGROUND OF THE INVENTION

The present invention concerns a method of manufacturing an optical device having an ink film by using an ink jet printing apparatus having an ink jet head. The optical device includes mainly color filters and organic electroluminescence devices.

According to the manufacturing method of the optical device of the invention, each of layers, that is, a coloration layer of a color filter, a color transformation layer of a color transformation filter, an organic light emitting layer of an organic electroluminescence device (hereinafter also referred to as an organic EL device), or charge transporting layer can be formed, as well as, a circuit pattern of a circuit substrate, a wiring pattern of a thin film transistor, a lens pattern of a micro lens, a flow channel pattern of a biochip, etc. can also be formed.

For example, as the method of manufacturing the color filter, a photolithographic method, an etching method, etc. have been known. In the manufacturing method of the color filter by the photolithographic method, a coating film of a photosensitive resin layer for each color is formed over the entire substrate and exposed patternwise, then an unnecessary portion of the coating film is removed and a remained pattern is used as each pixel. In the method, since a lot of the coating film is removed upon development, a great amount of material is wasted. Further, since exposure and development steps are conducted on every pixels, the number of step is increased. The photolithographic method has been utilized for the manufacture not only of color filters but also of various optical devices or electric devices such as organic electroluminescence devices.

However, the substrate size of the color filter has been increased year by year. For reducing the cost of the color filter, since existent pigment dispersion method, etc. of repeating photolithographic steps result in much loss, a manufacturing method of using an ink jet head has been studied in recent years.

An ink jet printing apparatus has an ink jet head in which plural nozzles are arranged and disposed. In the ink jet printing apparatus, drawing is conducted by relatively moving nozzles and a substrate bed along the surface of the substrate bed. In the ink jet printing apparatus, considering the yield along with increase in the size of the substrate, a plurality of ink jet heads are arranged and disposed and discharge pattern information is formed so as to make the amount of a discharged liquid uniform. Further, as a method of preparing optical devices having a pattern of plural colors arranged in a stripe shape by using an ink jet printing apparatus, several methods have been known. For example, it has been known a first method of arranging the longitudinal direction of a stripe pattern and the direction of an ink jet for a specified color substantially in perpendicular to each other and causing the ink jet head to conduct main scanning along the longitudinal direction of the stripe pattern (JP-A Nos. 8-292319, and 2001-228320), or a second method of arranging the longitudinal direction of a stripe pattern and the direction of an ink jet head of a specified color substantially in parallel each other and causing the ink jet head to conduct scanning in a direction substantially perpendicular to the longitudinal direction of the stripe pattern (JP-A No. 2003-127343).

In the ink jet printing apparatus, a high positional accuracy is required for nozzles during printing. Further, fineness has become higher in display apparatus in recent years and in a case of manufacturing, for example, a color filter for use in liquid display apparatus corresponding to a full-spec high definition television (1920 row×1080 column), it is necessary to provide a higher pixel density than usual in a case of manufacture by using an ink jet printing apparatus.

However, in the first method, in a case of manufacturing an optical device or the like of high pixel density, since there is a problem that color mixing occurs when the arrangement of the ink jet head displaces even slightly and the displacement can not be amended in the course of main scanning, it was not possible to manufacture an optical device of high pixel density at a good accuracy.

On the other hand, in the second method, even in a case where color mixing occurs between pixels of different colors, failure can be prevented by changing the discharge timing of nozzles belonging to the ink jet head. However, in the second method, since the longitudinal direction of the stripe pattern and the direction of the ink jet head were in parallel, it was necessary to narrow the gap between the nozzles of the ink jet head to increase the discharging density of the ink jet head. Accordingly, when the ink jet head passes the stripe pattern, it was necessary to conduct discharge while using all the nozzles belonging to the ink jet head. However, when the nozzle density of the ink jet head is increased and discharges are conducted simultaneously from all the nozzles, vibrations of the nozzles in the vicinity affect and interfere to each other and stable discharge could not be conducted by crosstalk.

In other words, as for the ink jet head, discharged ink is usually distributed to a lot of nozzles through a common liquid chamber. Therefore, when pressure is applied to a certain nozzle and a discharge operation is performed, pressure is transmitted to an ink in other nozzles near the certain nozzle. Therefore, a discharge volume from these other nozzles becomes unstable.

In addition, at one time high driving current flows when discharge from all nozzles is performed at the same time. Therefore, ink jet head has fever by Joule heat, uniformity of discharge from a nozzle is affected.

Then, in a case of preventing the crosstalk by lowering the resolution power in the discharge, a gap results in the discharged ink pattern, to cause whitening or color shading for an identical color, which also results in a problem of failure.

The invention has been achieved for solving the foregoing problems and intends to improve the discharging accuracy and the resolution power in the manufacturing method of the optical device according to the second method described above, thereby providing a method of manufacturing an optical device free of streak-like blank or unevenness.

More specifically, it intends to improve the discharging stability and the resolution power for the gap (pitch) between a specified pixel and a pixel of an identical color adjacent with the pixel described above that constitute a stripe pattern of a color filter.

SUMMARY OF THE INVENTION

In one embodiment of the present invention, an optical device is manufactured by printing a pixel, wherein said method includes deciding plural discharging positions inside each pixel of the optical device, arranging these plural discharging positions on different positions in lateral direction of the pixel respectively, specifying each of the plural nozzles by a natural number n counted sequentially from the end of the ink jet head, defining a surplus as b when dividing the natural number n with the repetitive number a (b is an integer satisfying: $0 \leqq b \leqq a-1$), corresponding the surplus b to each of the plural nozzles, repeating a unit step of discharging an ink from nozzles corresponding to the surplus b, finding "discharge coefficient" by measuring unevenness of ink discharging and changing the number of times of ink discharging.

BRIEF DESCRIPTION OF DRAWINGS

FIG. 31 is a schematic view showing an example of an arrangement for nozzles on an ink jet head and ink discharging amount.

FIG. 33 is a schematic view showing an example of an arrangement for nozzles on an ink jet head and ink discharging amount.

FIG. 37 is a table showing a relation between a discharge coefficient and an amount of discharged ink.

Figure 1:
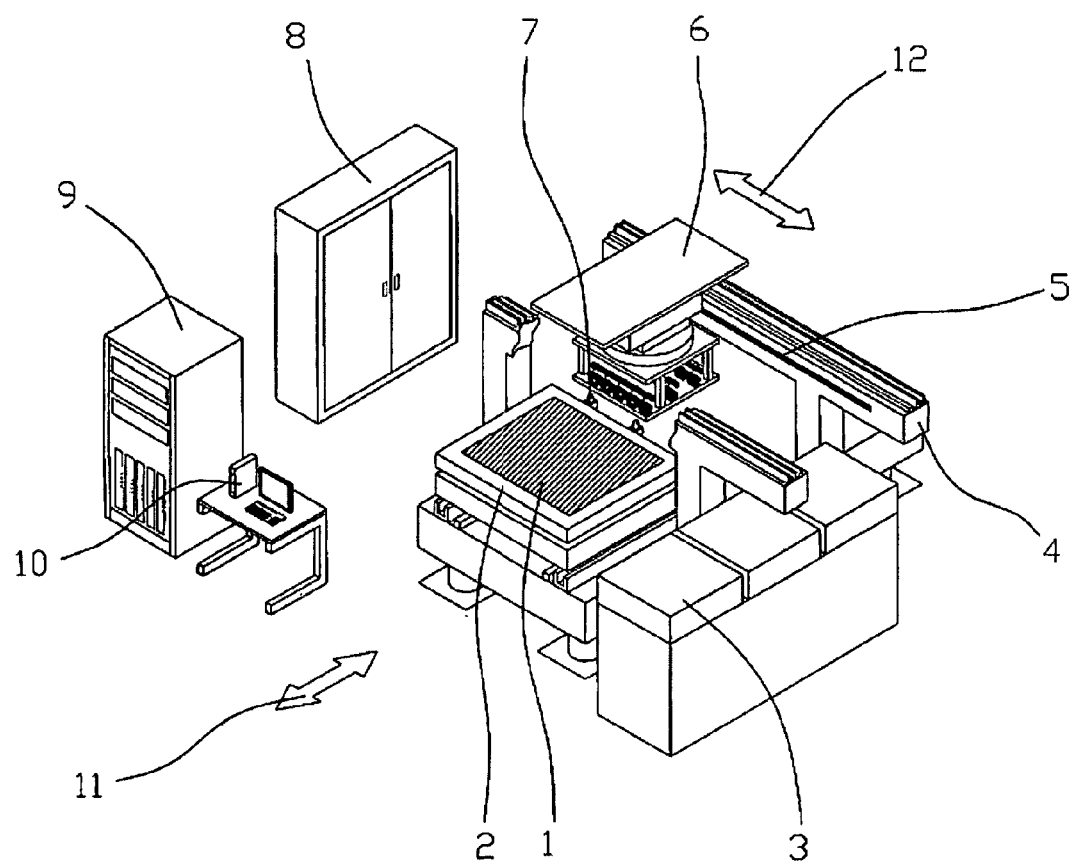
FIG. 1 is an entire view of an ink jet printing apparatus according to an embodiment of the invention.

DESCRIPTION OF THE REFERENCES 1 substrate
2 substrate transporting stage
3 maintenance station
4 ink jet head unit moving shaft (first direction)
5 linear scale
6 ink jet head unit moving base
7 inverted microscope
8 transporting stage control section
9 discharge control section
10 main controller
11 transporting direction of a substrate transporting stage (second direction)
12 moving direction of an ink jet head unit (first direction)
13 ink jet head
131 ink jet head
132 nozzle
161 nozzle gap
162 nozzle gap
14 ink jet head unit
15 θ adjusting mechanism (θ axis)
16 elevating mechanism
17 third direction
18 θ direction
19 ink jet head base plate 20 alignment mark
41 substrate
42 ink jet head
43 coloring ink layer
44 second direction
45 first direction
51 substrate
52 ink jet head
53 coloring ink layer
54 nozzle

DESCRIPTION OF THE PREFERRED EMBODIMENTS

A method of manufacturing an optical device, a method of manufacturing a color filter, and a method of manufacturing an organic EL device of the invention are to be described specifically with reference to the drawings.

(Embodiment of Apparatus)

Figure 2:
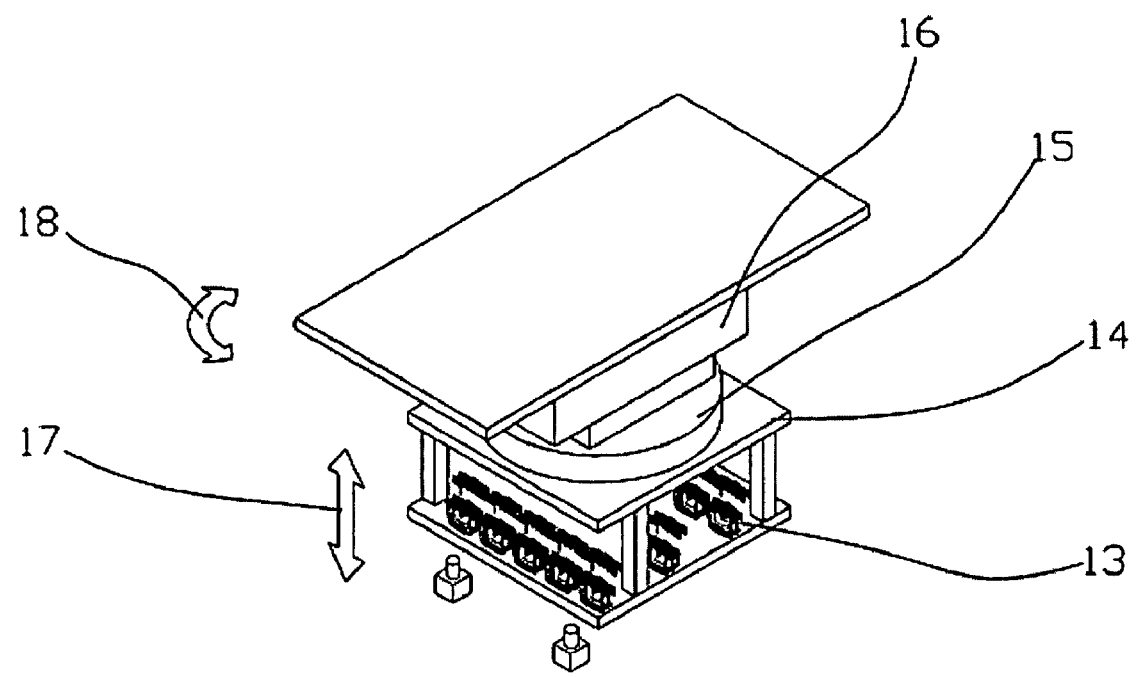
FIG. 2 is a constitutional view of an ink jet head unit.

FIG. 1 shows an entire view for an example of an ink jet printing apparatus and peripheral equipments that can be used for practicing the invention. An ink jet printing apparatus includes a substrate transporting stage 2, maintenance station 3, an ink jet head unit 14, an ink jet head unit moving shaft 4 (linear scale 5), ink jet head unit moving base 6, transporting stage control section 8, a main controller 10, and a discharge control section 9. The ink jet head unit has a single or plural ink jet heads mounted thereon. FIG. 2 shows an example of an ink jet head unit 14 mounting plural ink jet heads. The ink jet head has plural nozzles arranged substantially in a specified direction (not illustrated).

A substrate as an object of coating is mounted on the substrate transporting stage 2. The substrate includes optical devices such as a color filter and an organic electroluminescence device, as well as devices having a fine pattern such as a wiring circuit substrate, biochip, etc. The substrate transporting stage 2 moves along a predetermined transporting direction 11 of the substrate transporting stage. The transporting direction 11 of the substrate transporting stage is in parallel with a main scanning direction.

The ink jet head unit 14 moves on the ink jet head moving shaft 4 along the main scanning direction. The ink jet head unit moving shaft 4 is in perpendicular to the scanning direction 11 of the ink jet head unit. The ink jet head unit is subjected to sub-scanning along the ink jet head unit moving shaft.

Hereinafter, the direction for sub-scanning of the ink jet head unit is defined as a first direction (moving direction of an ink jet head unit 12) and the direction for main scanning of the ink jet head unit is defined as a second direction.

The substrate transporting stage 2 has vacuum attraction holes for fixing the substrate 1 which can fix the substrate with no protrusion from the surface of the substrate. This can approach the gap between the substrate 1 and the ink jet head 13 to minimum.

The discharge control section 9 incorporates a memory section (not illustrated) for storing measured values for the linearity of a trace in the movement of the ink jet head unit.

This enables to grasp the linearity at an optimal position on the first direction axis of the ink jet head unit and even when the ink jet head unit 14 is not linear relative to the first direction axis at a desired position, the coating accuracy can be amended by changing the discharge timing of the nozzle in accordance with the linearity at that position (displacement).

FIG. 2 shows details for the view of the ink jet head unit 14 and the peripheral mechanism thereof. The ink jet head unit 14 has plural ink jet heads. Ink jet head has plural nozzles for discharging an ink. The nozzles are arranged such that the positions along the first direction are each at a predetermined equal distance.

Displacement of the orientation of the ink jet head from the predetermined direction is referred to as a rotational displacement of the ink jet head. Accordingly, an ink jet coating device has a θ adjust mechanism 15 for amending the displacement in the rotating direction (hereinafter also referred to as θ direction 18). The θ adjust mechanism 15 can generally adjust a direction for the entire plural ink jet heads upon mounting the plural ink jet heads on the ink jet head unit. FIG. 2 shows elevating mechanism 16.

Two detection means (inverted microscope 7) for detecting the rotational displacement of the ink jet head are shown in FIG. 1. Further, the ink jet head is sometimes inclined to result in vertical displacement (third direction 17). For amending the displacement in the third direction, provision of a gap adjust mechanism (not illustrated) is effective.

Figure 3:
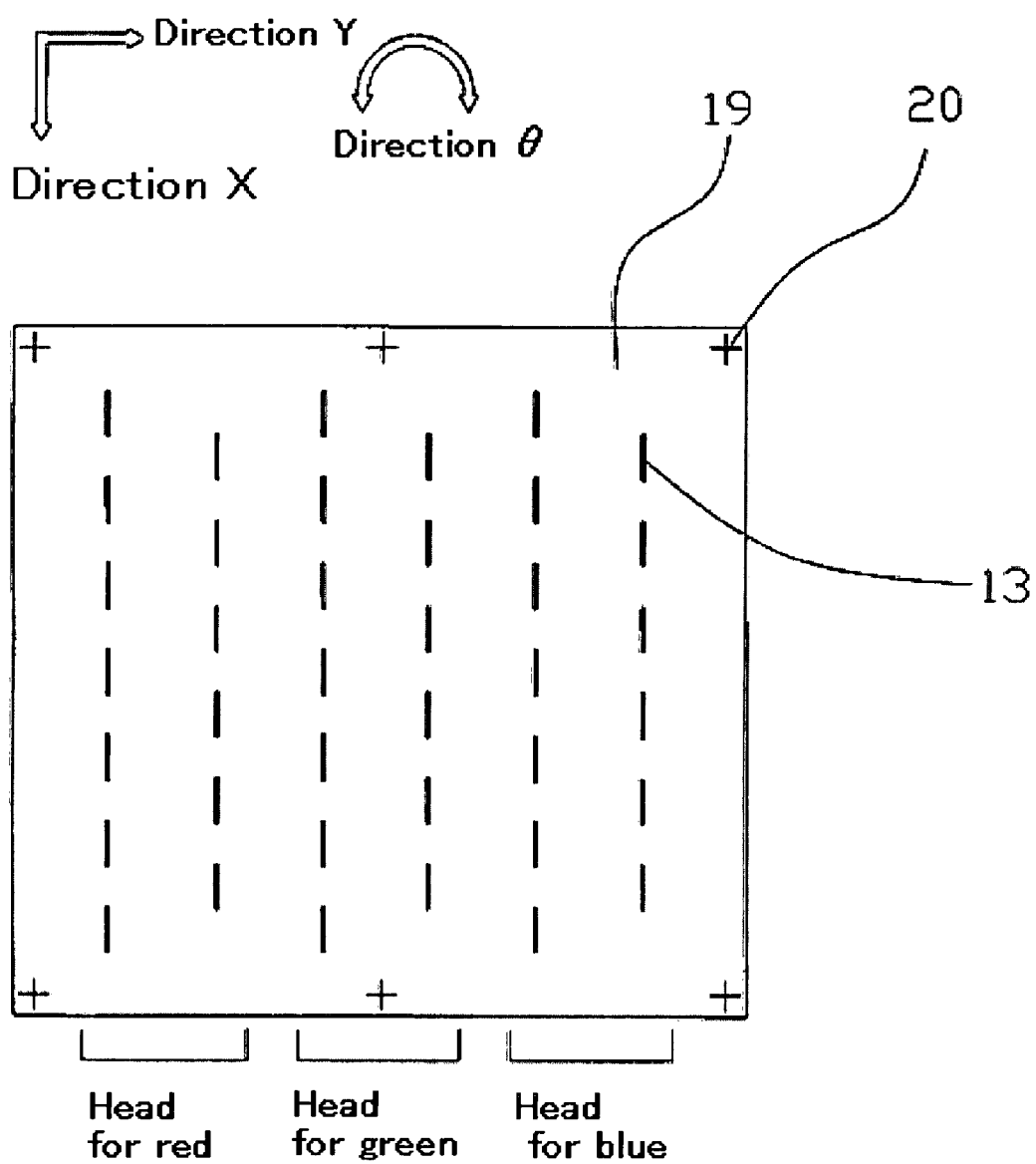
FIG. 3 is a plan view showing an example for the arrangement of the ink jet head.

FIG. 3 is a plan view showing an example for the arrangement of each ink jet head in the ink jet head unit provided with plural ink jet heads.

The ink jet heads 13 are arranged in parallel along the first direction. Further, since the width of the ink jet head main body is larger than the range for the nozzles, adjacent ink jet heads are arranged in a zig-zag state being displaced along the second direction. Accordingly, ink discharging can be made linear at a good accuracy by changing the discharging timing of nozzles belonging to the ink jet head in accordance with the distance in the second direction present between the ink jet head and an ink jet head adjacent therewith. FIG. 3 shows ink jet head base plate 19 and alignment mark 20.

Figure 10:
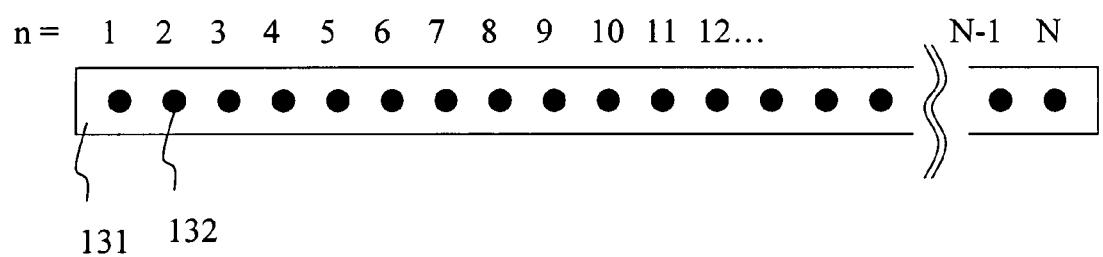
FIG. 10 is a schematic view showing an example of an arrangement for nozzles on an ink jet head.

FIG. 10 shows an example of an ink jet head 131 and nozzles 132 arranged in the ink jet head 131. It is assumed that nozzles are arranged by the number of N in the ink jet head 131 and number n of natural number is allocated sequentially as 1, 2, 3, . . . from the left end or right end to each of the nozzles for the sake of convenience.

Ink is discharged from each of the nozzles 132, and the discharging timing, the number of times and the ink discharge amount of each of the nozzles can be controlled independently.

Figure 26:
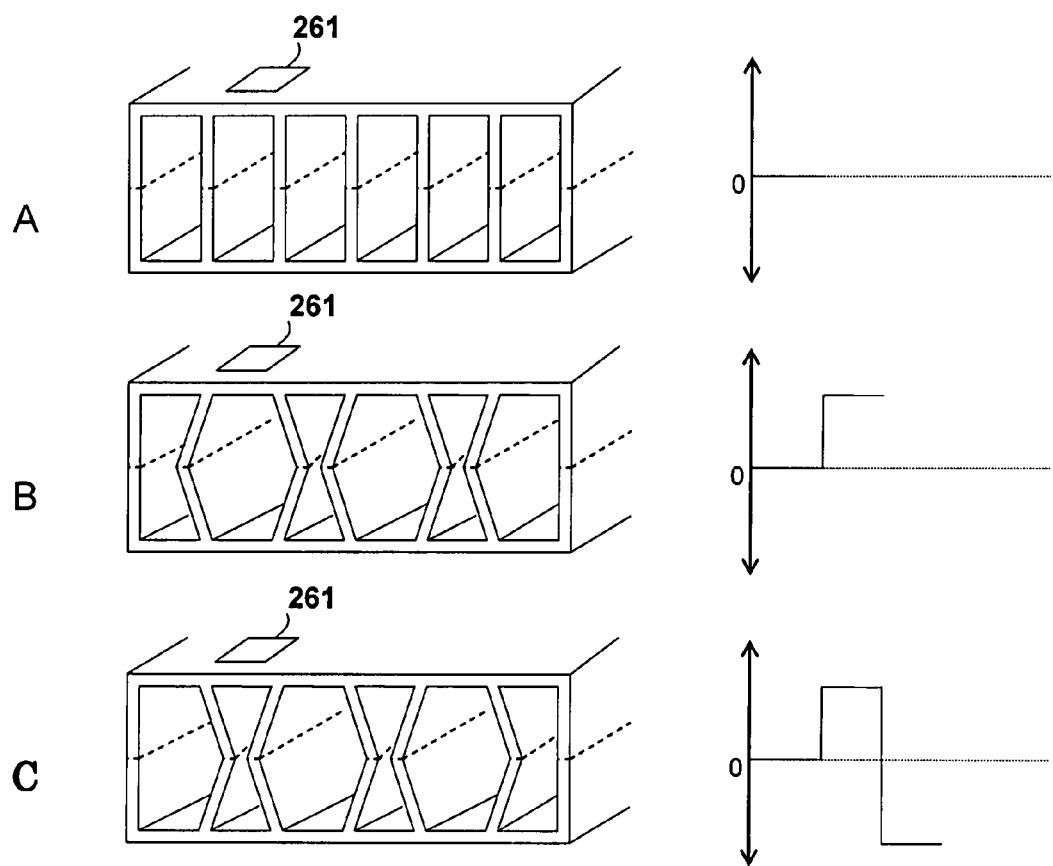
FIGS. 26 A, B and C are schematic views showing ink discharge of an ink jet head using a piezoelectric element.

In FIG. 26, structural example of such an ink jet head element is shown. Manufactured tine-shaped piezoelectric ceramics are prepared. A small pitch gap of piezoelectric ceramics is made by affixing them up and down. The ink filled in the gap is discharged.

Example of ink discharge using such an ink jet head is shown in FIG. 26. Each ink chamber is installed in ink jet head. Each ink chamber has a piezo electric element and a nozzle (an opening). Each ink chamber can discharge ink independently.

A discharge operation of piezoelectric element 261 is noted here.

When ink is discharged from piezo electric element 261, at first voltage is applied to this piezo electric element 261. This is called an active state. Then while inside of an ink liquid chamber of a piezo electric element expands, an ink liquid chamber is filled with ink.

Subsequently inside of an ink liquid chamber of a piezo electric element shrinks when reverse voltage is applied to this piezo electric element. Then ink is pressurized, ink is discharged from nozzle (not shown) of piezo electric element 261. This is called an inactive state.

In order to shrink an expanding ink liquid chamber, time for an inactive state should be longer than double of time for an active state.

In FIG. 26, a case of setting the repetitive number as: a=2 is shown. Ink is discharged from one piezo electric element which adjoins other piezo electric element alternately.

(Embodiment in the Process)

1. Applicable Range of the Invention

Now, description is to be made mainly for the manufacturing step for preferred embodiments of the invention. The optical device according to the invention includes various members used as optical parts constituting a display screen of an indication display.

For an optical device as an object of the invention, for example, a color filter constituting a display screen of a color liquid crystal display can be exemplified, in which an ink film forms a coloring ink layer for coloring transparent light, and the coloring ink layer is of plural colors having different colors on every regions.

Further, for the optical device, the organic electroluminescence device can also be exemplified, in which the discharged ink forms an organic light emitting layer. Further, according to the invention, an optical device having organic light emitting layers of plural colors having a different colors on every regions can be manufactured.

In addition, the manufacturing method of the optical device of the invention can be applied in the same manner to the manufacturing method of circuit substrates, thin film transistors, micro lenses, biochips, etc.

2. Substrate

The substrate is used as a support substrate for printed products. The kind of the substrate is different depending on the aimed optical device and, for example, known transparent substrate materials such as glass substrates, quartz substrate, plastic substrates, and dry films can be used. Among all, the glass substrate is excellent in view of transparency, strength, heat resistance, and weather proofness in the application use of color filters and organic EL devices.

3. Formation of Partition Wall

In the invention, an ink is applied to a substrate by an ink jet printing apparatus to form an optical device. For preventing color mixing (or mixing) between different types of ink to each other, a partition wall is preferably formed on the substrate.

The partition wall has a function of parting the surface of the substrate into plural regions and preventing color mixing of an ink discharged to each of the plural regions. For preventing color mixing, a partition wall showing a predetermined ink repelling effect is desirably used. There can be shown, for example, a method of forming a partition wall with a resin composition portion containing an ink repellent, a method of applying a plasma treatment to a partition wall formed with a resin composition thereby providing the ink repellency, a method of forming a partition wall together with a photocatalyst layer and providing the ink repellency to the partition wall by a photocatalytic effect.

Further, in a case where the optical device is a color filter or an organic EL device constituting the display screen of a display, contrast at the display screen can be improved by providing a light shielding property to the partition wall. In any case, it is necessary to incorporate a resin binder and an ink repellent as essential ingredients, in a case of forming the partition wall with the resin composition.

In addition, an additive having compatibility, for example, a leveling agent, a chain transfer agent, a stabilizer, a sensitizing dye, a surfactant, a coupling agent, etc. can be optionally added to the resin composition.

The partition wall can be formed using a resin composition by a printing method, a photolithographic method, or a transfer method. In a case of forming the partition wall by photolithography, a photosensitive resin composition formed by providing the photosensitivity to a resin composition is used. Further, in a case of forming the partition wall by the printing method, a resin composition such as a thermosetting resin composition can be used.

<Formation of Partition Wall by Printing Method>

At first, description is to be made to a case of forming a partition wall by the printing method. A resin composition (hereinafter referred to as a printing material) is printed on a substrate by using a printing apparatus. The printing material comprises a resin binder and an ink repellent as an essential ingredient and, further, contains a crosslinker and a solvent. Further, a black pigment and the additive described above may also be added. The critical surface tension of the printing material is, preferably, from 30 to 40 mN/m. In a case where it is less than 30 mN/m, the printed resin composition is liable to undergo the effect of unevenness on the substrate surface. In a case where it exceeds 40 mN/m, the printability is worsened. Successively, the printing material is heated within a range from 100° C. to 250° C. for 1 min to 60 min.

<Formation of Partition Wall by Photolithographic Method>

Description is to be made to a case of forming the partition wall by a photolithographic method. A resin composition (hereinafter referred to as a photosensitive resin composition) is coated on a substrate by using a spin coater, slit coater, etc. The photosensitive resin composition is generally classified into a positive type and a negative type. In a case of the negative type photosensitive resin composition, it contains a resin binder, a monomer, a photopolymerization initiator, and the ink repellent described above. In a case of the positive type photosensitive resin composition, it includes a positive type photosensitive resin, and the ink repellent described above. A crosslinker, a black pigment, a pigment, a solvent, and an additive may further be added optionally to the photosensitive resin composition. The critical surface tension of the photosensitive resin composition is, preferably, from 30 to 40 mN/m. In a case where it is less than 30 mN/m, the coated resin composition is liable to undergo the effect of unevenness on the substrate surface. In a case where it exceeds 40 mN/m, the coatability of the resin composition is worsened.

Successively, the substrate coated at one surface with the photosensitive resin composition is exposed by using a mask of the partition wall pattern. The substrate is developed by a developer to remove an unnecessary photosensitive resin composition and the partition wall is formed on the substrate. In a case where the critical surface tension of the coated resin composition is 30 to 40 mN/m or less, since the ink repellent properly concentrates to the surface during development, development for the lower portion of the resin composition proceeds more compared with an upper portion. As a result, since the partition wall is tapered inversely, it provides an effect that the shape of the ink film discharged and formed by using the ink discharging apparatus is flattened. Then, the partition wall is heated at 100° C. to 250° C. for about 3 min to 60 min.

<Resin Binder>

The resin binder contained in the ink printing material or the photosensitive resin composition secures to fix the partition wall to the substrate and provides an ink resistance to the partition wall. As the binder resin, those resins containing amino group, amide group, carboxyl group, or hydroxyl group are preferred. Specifically, they include, cresol-novolac resin, polyvinyl phenol resin, acryl resin, or methacryl resin. The resin binders may be used each alone or two or more of may be mixed.

<Ink Repellent>

The ink repellent contained in the printing material or the photosensitive resin composition provides the partition wall with the ink repellent property to the ink. As the ink repellent, a compound having a portion showing the compatibility with the resin binder and a portion having an ink repellent property for the resin composition can be used. The ink repellent having both of such portions emerges to the partition wall surface along with time or by heating. Then, it remains to the partition wall surface with the portion showing the solubility with the resin binder being on the inner side and the portion having the ink repellent property being on the outside and provides the optimal critical surface tension to the surface. For the portion having the water repellency, fluoro alkyl group can be used, perfluoroalkyl group being more preferred. For the portion showing the compatibility with the resin binder, known oleophilic polymers such as those having alkyl group or alkylene group, polyvinyl alcohol, etc. can be used.

In addition, as the ink repellent, fluoro-containing compounds or silicon-containing compounds to be described later can be used together. Examples of the fluoro-containing compounds include, specifically, vinylidene fluoride, vinyl fluoride, ethylene trifluoride or fluoro resin such as copolymers thereof. Further, each fluoro-containing compounds can be used alone or two or more of them may be used in combination. The silicon-containing compounds include those having organic silicon in the main chain or on the side chain and include silicon resins and silicone rubber containing siloxane ingredient. Further, each silicon-containing compounds can be used alone or two or more of them may be used in combination. Further, the fluoro-containing compounds and the silicon-containing compounds, or other ink repellent ingredients may also be used in combination. The ink repellent is contained in the resin composition preferably by 0.01% by weight to 10% by weight.

<Black Pigment>

The black pigment provides the partition wall with a light shielding property to improve the contrast on the display screen. As the black light shielding member, black pigment, black dye, carbon black, aniline black, graphite, iron black, titanium oxide, inorganic pigment, and organic pigment can be used. The black light shielding members may be used each alone or two or more of them may be mixed.

<Solvent>

As examples of the solvent, dichloromethane, dichloroethane, chloroform, acetone, cyclohexanone, ethyl acetate, 2-methoxy ethanol, 2-ethoxy ethanol, 2-butoxy ethanol, 2-ethyl ethoxy acetate, 2-butoxy ethyl acetate, 2-methoxy ethyl ether, 2-ethoxy ethyl ether, 2-(2-ethoxyethoxy)ethanol, 2-(2-butoxyethoxy)ethanol, 2-(2'-ethoxyethoxy)ethyl acetate, 2-(2-butoxyethoxy)ethyl acetate, propylene glycol monomethyl ether, propylene glycol monomethyl ether acetate, diethylene glycol dimethyl ether, tetrahydrofuran, etc. can be used. The amount of the solvent to be used is desirably such that it can form a uniform coating film with no pinholes or coating unevenness upon printing or coating on the substrate. For the content ratio of the solvent, it is preferred that the amount of solvent is 50 to 97% by weight based on the entire weight of the resin composition.

<Photosensitive Resin Composition>

As the monomer applicable to the photosensitive resin composition, monomers or oligomers having vinyl group or allyl group, and molecules having vinyl group or allyl group on one terminal end or on the side chain can be used. They include, specifically, (meth)acrylic acid and salt thereof, (meth)acrylic acid esters, (meth)acrylamides, maleic acids anhydride, maleic acid ester, itaconic acid ester, styrenes, vinyl ethers, vinyl esters, N-vinyl heterocyclic rings, allyl ethers, allyl esters, and derivatives thereof. Preferred compounds include, for example, relatively low molecular weight polyfunctional acrylates such as pentaerythritol triacrylate, trimethylol propane triacrylate, pentaerythritol tetraacrylate, ditrimethylol propane tetracrylate, ditrimethylol propane tetraacrylate, and dipentaerythritol penta and hexa acrylates. Monomers may be used alone or two or more of them may be mixed. The amount of the monomer can be within a range from 1 to 200 parts by weight and, preferably, from 50 to 150 parts by weight based on 100 parts by weight of the binder resin.

<Photopolymerization Initiator>

Examples of the photopolymerization initiator include benzophenone compounds such as benzophenone, 4,4'-bis(dimethylamino)benzophenone, 4,4'-bis(diethylamino)benzophenone. Further, as the photopolymerization initiator, acetophenone derivatives such as 1-hydroxycyclohexyl acetophenone, 2,2-dimethoxy-2-phenylacetophenone, and 2-methyl-1-[4-(methylthio)phenyl]-2-morpholinopropane-1-on may also be used. Further, thioxanthone derivatives such as thioxanthone, 2,4-diethylthioxantone, 2-isopropylthioxantone, or 2-chlorothioxantone may also be used. Further, they may be anthraquinone derivatives such as 2-methyl anthraquinone, 2-ethyl anthraquinone, 2-t-butyl anthraquinone, and chloro anthraquinone. Further, benzoin ether derivatives such as benzoin methyl ether, benzoin ethyl ether, or benzoin phenyl ether can also be used. Further, they include acylphosphine derivatives such as phenyl bis(2,4,6-trimethylbenzoyl)-phosphine oxide, rofin dimmers such as 2-(o-chlorophenyl)-4,5-bis(4'-methylphenyl)imidazolyl dimer, N-arylglycines such as N-phenylglycine, organic azides such as 4,4'-diazide calchone, and 3,3',4,4'-tetra(tert-butylperoxy carboxy)benzophenone, and quinone diazide group-containing compound, etc. The photopolymerization initiator may be used alone or two or more of them may be mixed together. The amount of the photopolymerization initiator can be within a range from 0.1 to 50 parts by weight and, preferably, from 1 to 20 parts by weight based on 100 parts by weight of the binder resin.

<Additive>

As the additive, for example, a leveling agent, a chain transfer agent, a stabilizer, a sensitizing dye, a surfactant, or a coupling agent can be added.

4. Ink Discharge

Successively, an ink is applied to a substrate by an ink jet printing apparatus to form an optical device. In the following, a method of manufacturing a color filter of RBG three colors having a coloring ink layer is to be described, for example, in a case of forming a color filter as an optical device. Instead of the coloring ink layer, an organic light emitting layer can also be formed.

Figure 4:
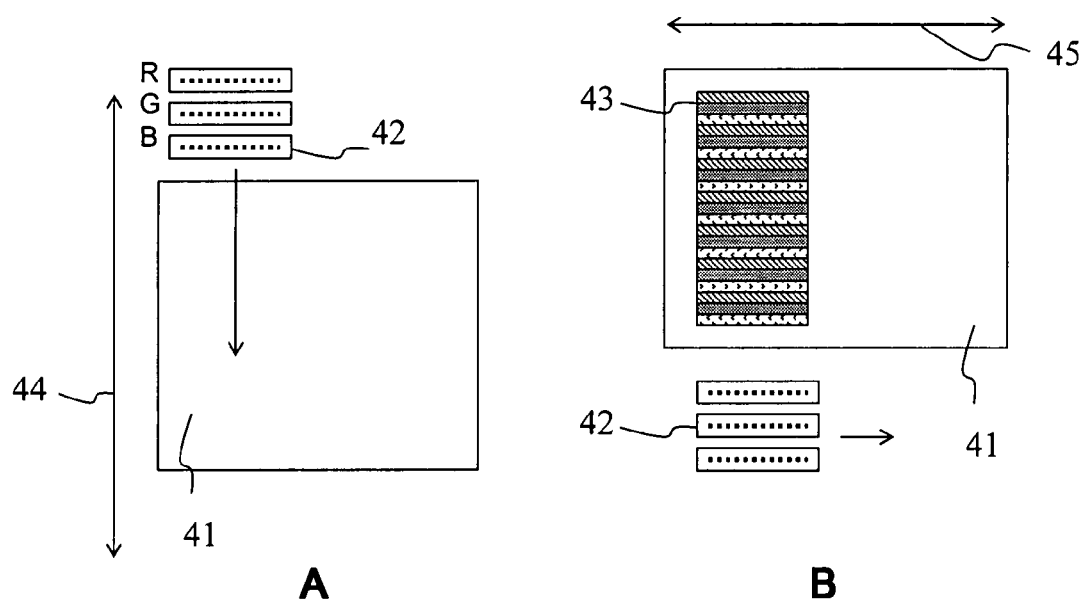
FIGS. 4 A and B are schematic views for the operation method of an ink jet printing apparatus according to a second method.

As described above, for a manufacturing method of the color filter by using the ink jet printing apparatus, a method of discharging an ink while aligning the direction of the ink applied in a stripe shape and the main scanning direction in parallel with each other (the first method described above) has been known. Further it has been known a method of discharging the ink while aligning the direction of the ink applied in a stripe shape and the main scanning direction in perpendicular to each other (second method described above). FIG. 4 shows the outline for the method of manufacturing a color filter by using the second method.

Ink jet heads 42 for jetting coloring inks of RBG three colors are arranged respectively (three in total). The ink jet head 42 is disposed such that nozzles are arranged substantially in perpendicular to the main scanning direction (second direction 44).

The three ink jet heads constitute a not separable integral single ink jet head unit. The ink jet head unit is caused to scan in the second direction to form a coloring ink layer 43 for RBG three colors (FIG. 4(a)). The coloring ink layer 43 is formed in a stripe shape such that each of the three colors is in parallel with the first direction. The coloring ink layer 43 may also be formed in a grid shape in parallel with the first direction. In a case of disposing the partition wall described above optionally on the substrate 41 previously, color mixing of the coloring ink can be prevented effectively. Further, an image receiving layer comprising a transparent resin can also be disposed on the substrate 41. Successively, the ink jet head unit can conduct sub-scanning along the first direction and then further conduct main scanning in the opposite direction (FIG. 4(b)).

Figure 5:
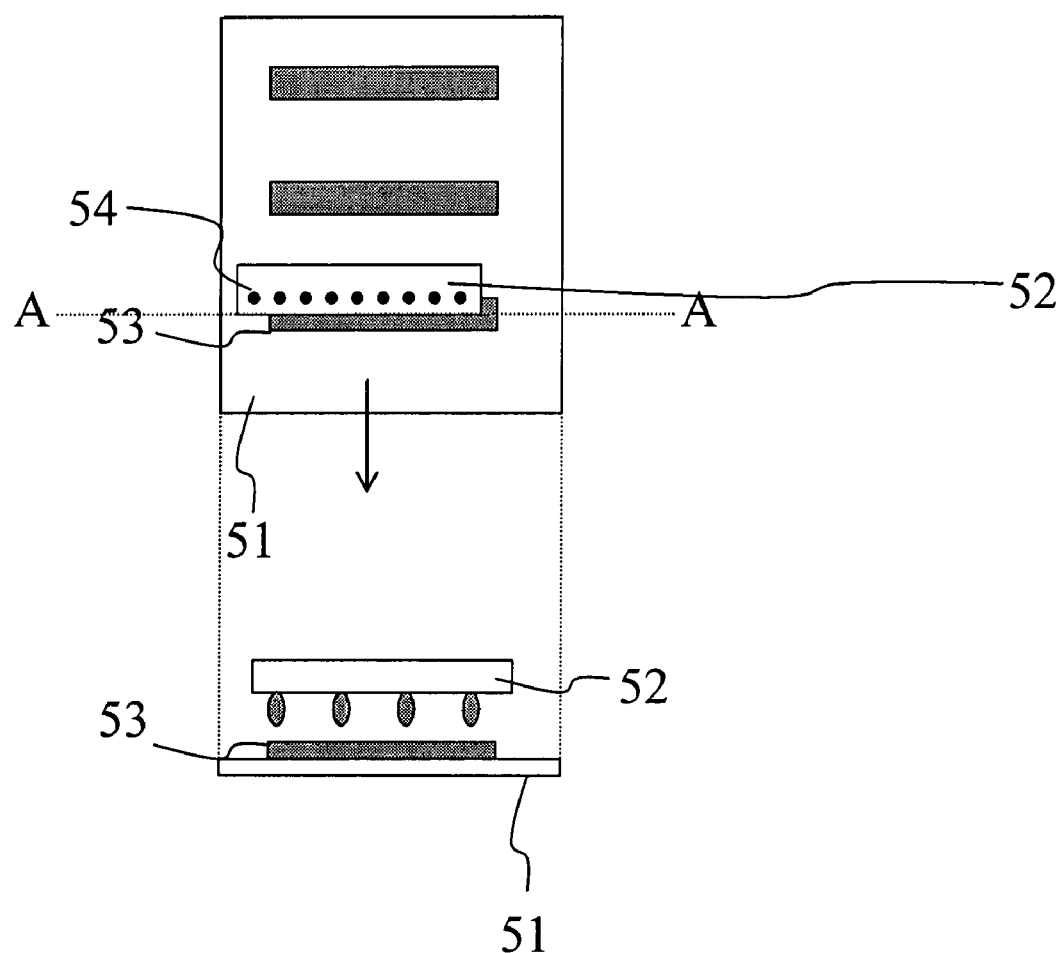
FIG. 5 is a schematic view for the operation method of an ink jet printing apparatus according to a second method.

FIG. 5 shows an operation of an ink jet head 52 taking notice on the operation of an ink jet head 52 of a single color. The ink jet head 52 is caused to scan along the second direction (in the direction of arrow in the drawing) over the substrate 51, an ink is discharged from nozzles 54 at a predetermined time interval and a stripe-like coloring ink layer 53 is formed on every gap of a predetermined distance.

In this case, upon discharge from the nozzle, it was necessary to conduct discharging operation for the adjacent nozzles simultaneously for maintaining a predetermined pixel density, this resulted in the problem of making the discharging amount instable or worsening the accuracy due to the effect of vibrations between the nozzles to each other which are present in the vicinity. The foregoing problem has been overcome according to the invention by adopting the following constitution. Details for the mechanism are shown below.

(Method 1)

At first, the invention provides a method of manufacturing an optical device of printing and forming a pixel of an optical device constituted by arranging a substrate, partition walls disposed for partition regions on the substrate into a grid shape, and plural elongate pixels portioned by the partition wall on every pixels by using an ink jet head;

arranging plural nozzles in the ink jet head such that the pitch between the adjacent nozzles along the second direction is equal, the plural nozzles discharging an ink on every nozzles, arranging the ink jet head such that the positions for the plural nozzles are at positions different from each other in the first direction, repeating the unit step of discharging and printing the ink from a portion of the plural nozzles, thereby printing the pixel, wherein the method includes:

specifying each of the plural nozzles by a natural number n counted sequentially from the end of the ink jet head, defining a surplus as b when dividing the natural number n with the repetitive number a (b is an integer satisfying: $0 \leq b \leq a-1$), and corresponding the surplus b to each of the plural nozzles, the unit step being a step of selectively discharging the ink from one or more of the nozzles corresponding to the surplus b of a specified value, and printing the same at the discharging position, and the pitch of the pattern for the grid-like partition wall along the first direction being an integer multiple of a distance for the pitch of adjacent nozzles in the ink jet head multiplied by the repetitive number a.

According to this method 1, a number n (natural number starting from 1) is sequentially allocated to the nozzles orderly from the one present at the end on every nozzles of the ink jet head (refer to FIG. 10). Then, the number to form a surplus when dividing n with a repetitive number a is determined in accordance with the number n and allocated as the surplus b to the nozzle. The surplus b is selected from the integers of less than the repetitive number a and 0 or more. That is, the surplus b can be said to be a natural number as a surplus when dividing the nozzle number n with the repetitive number a.

The repetitive number a is previously set before printing and selected from natural numbers of 2 or more.

In a case where the repetitive number a is excessively large, this results in a problem of complicating the discharging operation or worsening the accuracy, or increasing the size of the ink jet head. On the other hand, in a case where it is excessively small, effects of vibrations between each of the nozzles (crosstalk) can not be decreased sufficiently. Accordingly, the repetitive number a is preferably a natural number of any one of 3 to 5.

Then, after setting the number of discharging condition on every nozzles, an optional number ($B_1$) is selected from the natural numbers of 0 to (a−1) and the ink is selectively discharged only from the nozzles where the number is equal with the surplus (referred to as initial discharge). With such a constitution, the effect of discharging vibrations of adjacent nozzles can be lowered, compared with the case of simultaneous discharge from all the nozzles. Further, since the nozzles conducting the discharging operation simultaneously are always separated by (a)×(distance between the adjacent nozzles to each other), this does not vary the effect of the nozzle discharging vibrations, and "variation of discharge" derived from "vibration in the effect of crosstalk" can be minimized.

Further, the number set as described above is set to another number ($B_2$) again and the ink is discharged selectively only from the nozzle where another number and the parameter for the discharging condition are equal (next discharge). Then, since the nozzle used for the first discharge and the nozzle used for the next discharge are different, the effect of discharging vibrations of the nozzle can be decreased compared with the case of continuous discharge from the identical nozzle.

Figure 14:
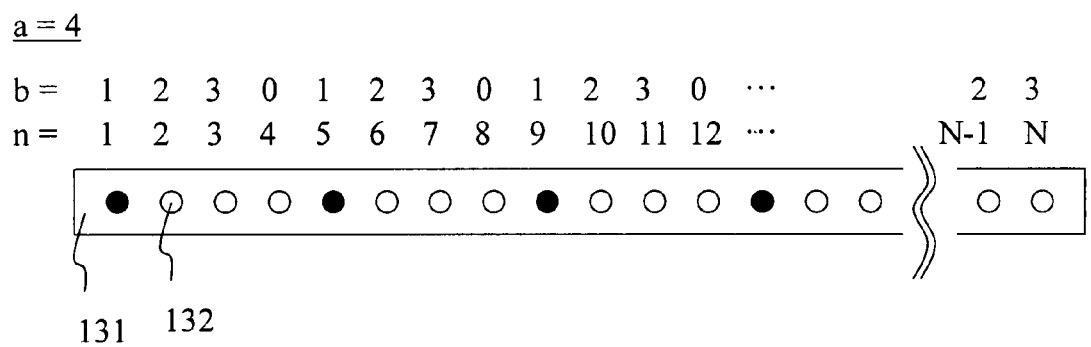
FIG. 14 is a schematic view showing an example of an arrangement for nozzles on an ink jet head.
Figure 15:
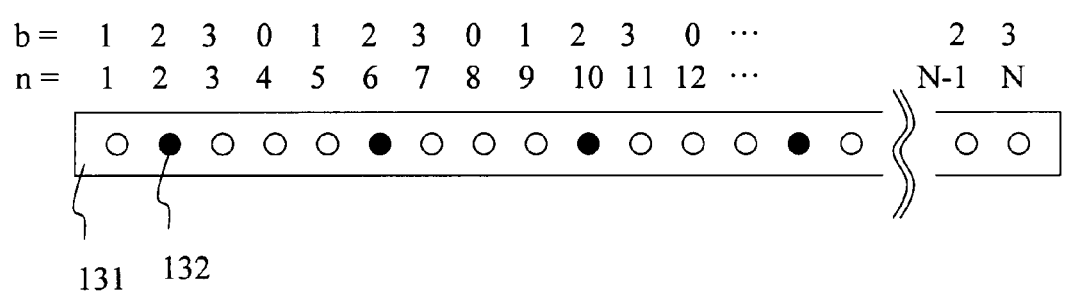
FIG. 15 is a schematic view showing an example of an arrangement for nozzles on an ink jet head.

Further, "a further number ($B_3$)" different from "another number" is selected, and discharge can be conducted in the same manner. "Further number ($B_3$)" is preferably a number that is different from the number ($B_1$) at the first discharge except for the case: a=2. By changing the number periodically stable discharge can be attained. As an example, FIG. 14 and FIG. 15 show a relation between the ink jet head and the nozzle in a case of setting the repetitive number as: a=4, "the number" for the first discharge as 0 and "another number" for the next discharge as 1. FIG. 14 shows nozzles used for the first discharge by a black circle and FIG. 15 shows nozzles used for the next discharge by a black circle.

By the way, particularly, in the printing using an ink jet head of a piezo type piezoelectric device, since vibration portions of a fluid chamber for supplying an ink to each of nozzles are closely in adjacent with each other, when an ink is discharged from a specified nozzle, there has been present a problem that the discharging amount from each of the nozzles was different depending on the selection for the discharging nozzles, discharging conditions, etc. while undergoing the effect of pressure interference between each of the nozzles (crosstalk).

For example, the ink discharging amount of a nozzle (assuming $n=n_x$) is different depending on the presence or absence of vibrations caused by discharge from adjacent plural nozzles ($n=n_{x-1}$, $n=n_{x-2}$, $n=n_{x-3}$, ..., $n=n_{x+1}$, $n=n_{x+2}$, $n=n_{x+3}$, ...).

Figure 25:
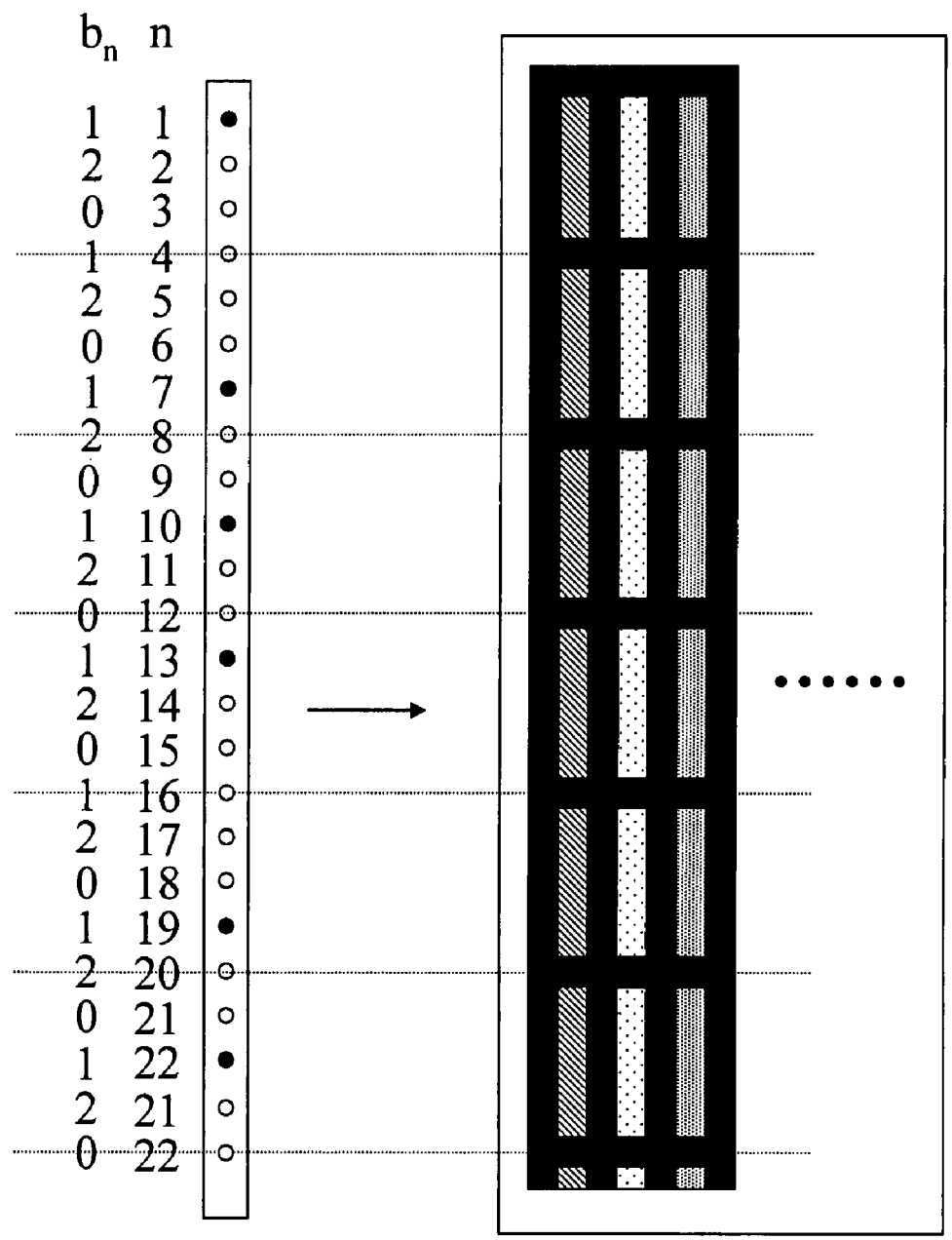
FIG. 25 is a schematic view showing a relation between nozzle gaps of an ink jet head and partition walls on a substrate.

Referring to FIG. 25 as an example, since a=3, in a case where discharge is conducted from nozzles satisfying: $b_n=1$, discharge is conducted, in principle, from nozzles at: n=1, 4, 7, ... (hereinafter, n=3m×1 (m is an integer of 3 or more)). However, in the nozzles at: n=4, 8, 12 ... (hereinafter, n=4×m (m is an integer of 4 or more)), since the ink discharged overlaps the partition wall pattern, discharge can not be conducted. Then, after all, in the nozzles, at: n=4, 16, 28, ... (hereinafter, n=12×m+4 (m is an integer of 3 or more)), discharge is not conducted although they satisfy $b_n=1$.

Accordingly, in the nozzles satisfying: n=1, 7, 13, 19, ... (hereinafter n=6×m+1 (m is an integer of 4 or more)), discharge is not conducted from five nozzles adjacent on one side and discharge is not conducted for two nozzles adjacent on the other side. On the other hand, whereas in the nozzles satisfying: n=10, 22, ... (hereinafter, n=12×m+10 (m is an integer of 2 or more)), discharge is not conducted from the two nozzles adjacent on both sides.

As described above, FIG. 25 shows a case where two types of nozzles different in the state of adjacent nozzles are present for the nozzles satisfying $b_n=1$.

As described above, in a case where the state of the adjacent nozzles is different, since the effect of vibrations undergoing from the adjacent nozzles is different, this has resulted in a problem that the amount of the ink discharged is different depending on the nozzles.

Figure 24:
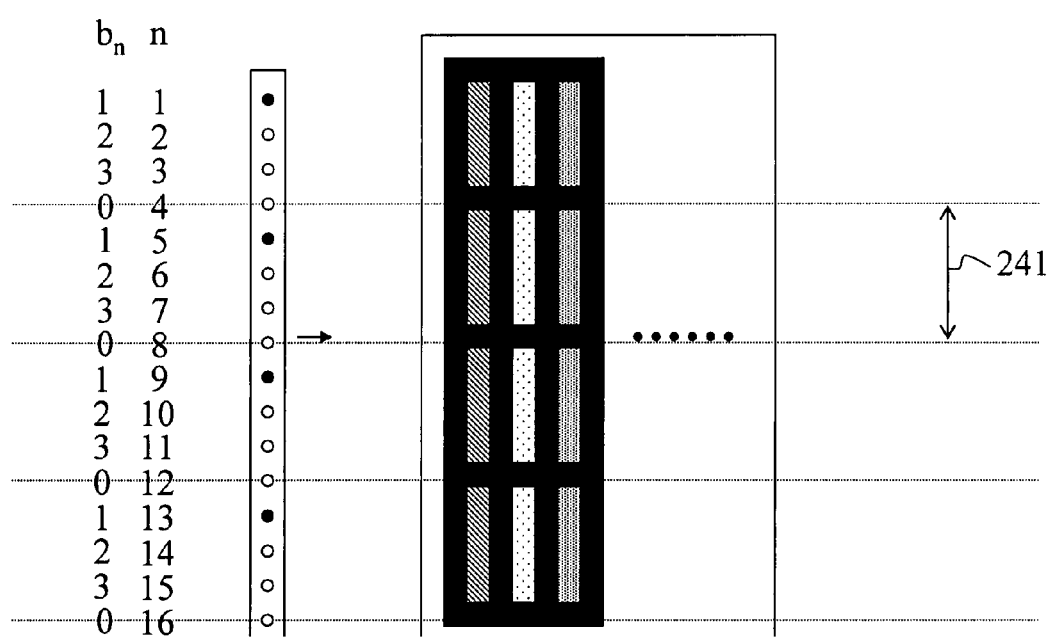
FIG. 24 is a schematic view showing a relation between nozzle gaps of an ink jet head and partition walls on a substrate.

For solving such a problem, according to the method 1, the distance for (repetitive number a×nozzle pitch) or the distance as an integer multiple thereof is made equal with the pitch of the pattern of the grid-like partition wall on the substrate along the first direction. FIG. 24 shows an example of an ink jet head and the optical pixel having the partition wall satisfying the conditions described above. In FIG. 24, the pitch 241 for the pattern of the grid-like partition wall along the first direction and the repetitive number a×nozzle pitch 241 are identical.

Then, with the constitution described above, in the step other than the single unit step where the nozzle position overlaps the pattern of the partition wall along the longitudinal direction of the pixel, among the unit steps with the repetitive number of a, since nozzles under resting for discharge are not present, the effect of the resting nozzle on the amount of the ink discharged from the nozzle can be minimized.

Accordingly, the first method can decrease the effect that the ink discharging amount varies depending on the nozzles by adopting the constitution described above and provide an effect of preventing the occurrence of color shedding or the like.

(Method 2)

Further in the second aspect of the invention, nozzles are preferably arranged as described below. In a method of printing the pixel by repeating the unit step continuously while relatively moving the plural nozzles and the substrate in the lateral direction of the pixel (the second direction), two or more nozzles having the value for the surplus b identical with each other are arranged to the ink jet head so as to reach the discharging positions at an identical timing, while the nozzles having the value for the surplus b different from each other are arranged to the ink jet head so as to reach the discharging positions at timings different from each other.

Specifically, in a case of selecting an optional nozzle n in the ink jet head, and defining the position of the nozzle along the second direction as Y(n), the position Y(n+a) for the nozzle at $(n+a)_{th}$ position from the end of the ink jet head is made equal with Y(n).

Figure 6:
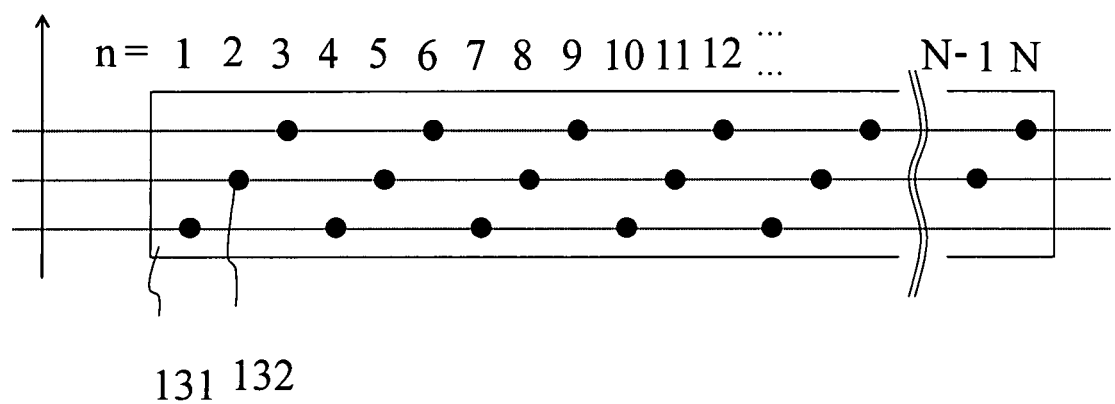
FIG. 6 is a schematic view showing an example of an arrangement for nozzles on an ink jet head.

While the nozzle position Y(n) up to n=1−a can be set optionally, it is preferably arranged by the method to be described later. As an example, FIG. 6 shows an example for the nozzle arrangement at a=3 in the ink jet head. The first nozzle, the 4th nozzle, the 7th nozzle and the 10th nozzle are arranged each at the identical position along the second direction (in the direction of arrow), the second nozzle, the 5th nozzle, the 8th nozzle, and the 11th nozzle are arranged each at an identical position along the second direction, and the third nozzle, the 6th nozzle, the 9th nozzle and the 12th nozzle are arranged each at an identical position along the second direction.

Figure 7:
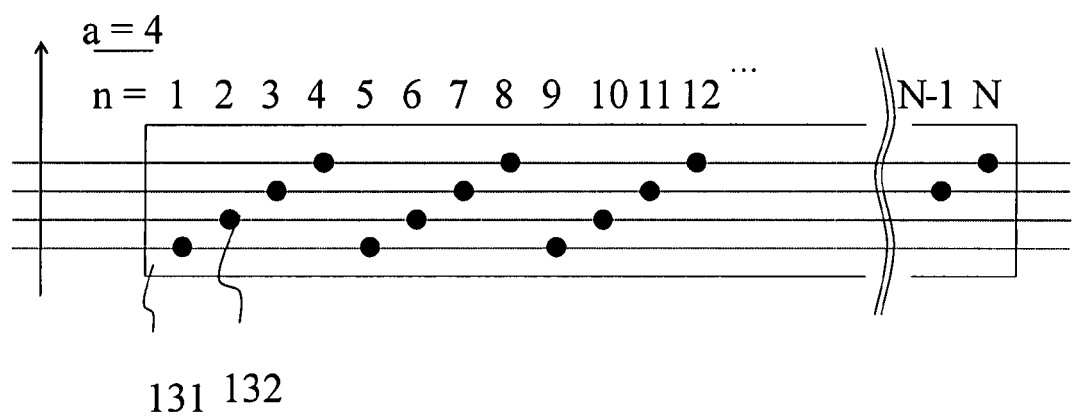
FIG. 7 is a schematic view showing an example of an arrangement for nozzles on an ink jet head.

FIG. 7 shows an example of the nozzle arrangement at a=4 in the ink jet head. The first nozzle, the 5th nozzle and the 9th nozzle are arranged each at an identical position along the second direction, the second nozzle, the 6th nozzle and the 10th nozzle are arranged each at an identical position along the second direction, and the third nozzle, 7th nozzle and the 11th nozzle are arranged each at an identical position along the second direction, and the fourth nozzle, the 8th nozzle and the 12th nozzle are arranged each at an identical position along the second direction.

As described above, since the nozzle at an optional nth position and the nozzle at the $(n+a)_{th}$ position always conduct discharge simultaneously, the discharged ink is applied linearly to the substrate at a good accuracy by arranging the nozzles as described above in the ink jet head.

Further, by arranging the adjacent nozzles being displaced from each other in the second direction, the effect that vibrations of the nozzle used for discharge remain for a while after discharge to give vibrations to the adjacent nozzle can be minimized compared with a case of arranging all the nozzles on a linear line.

The method described above is particularly effective in a case of manufacturing an optical device using a piezo type ink jet head and adopting the second method. According to the method, an optical device having a stripe pattern such as a color filter at high quality not causing color mixing, blanking failure, etc. can be provided.

Figure 8:
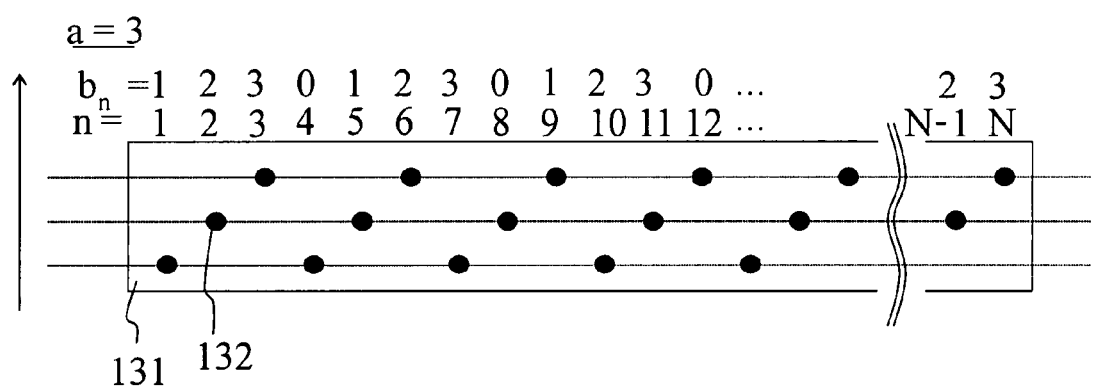
FIG. 8 is a schematic view showing an example of an arrangement for nozzles on an ink jet head.

FIG. 8 also shows an example of an arrangement for nozzles on an ink jet head.

(Method 3)

Further, discharge is preferably conducted as described below.

A method of manufacturing an optical device as in the first aspect of the invention of specifying each of the plural nozzles in the ink jet head with a natural number n counted sequentially from the end of the pixel, specifying the repetitive number a, calculating a surplus $b_n$ of a nozzle according to equation (1) and equation (2), providing a time T[sec], defining the surplus b that the ink jet head specifies at that time as a function β[T] represented by an equation (3), advancing the time T upon starting discharge, and conducting discharge from the nozzles for the entire ink jet head so as to satisfy an equation (4) at an optional time T:

$$0 \leq b_n \leq (a-1) \tag{1}$$

$$b_n = n \bmod a \tag{2}$$

$$\beta(T) = f\left(\left(\frac{1}{\pi}\right)T\right) \bmod a \tag{3}$$

$$b_n = \beta(T) \tag{4}$$

(in which (x)mod(y) is a function deriving an integer as a surplus when dividing an integer x with an integer y. f(x) is a function deriving an integer by cutting off the decimal fraction of a real number (x) and $\pi$ is a positive real number (unit: sec)).

Figure 11:
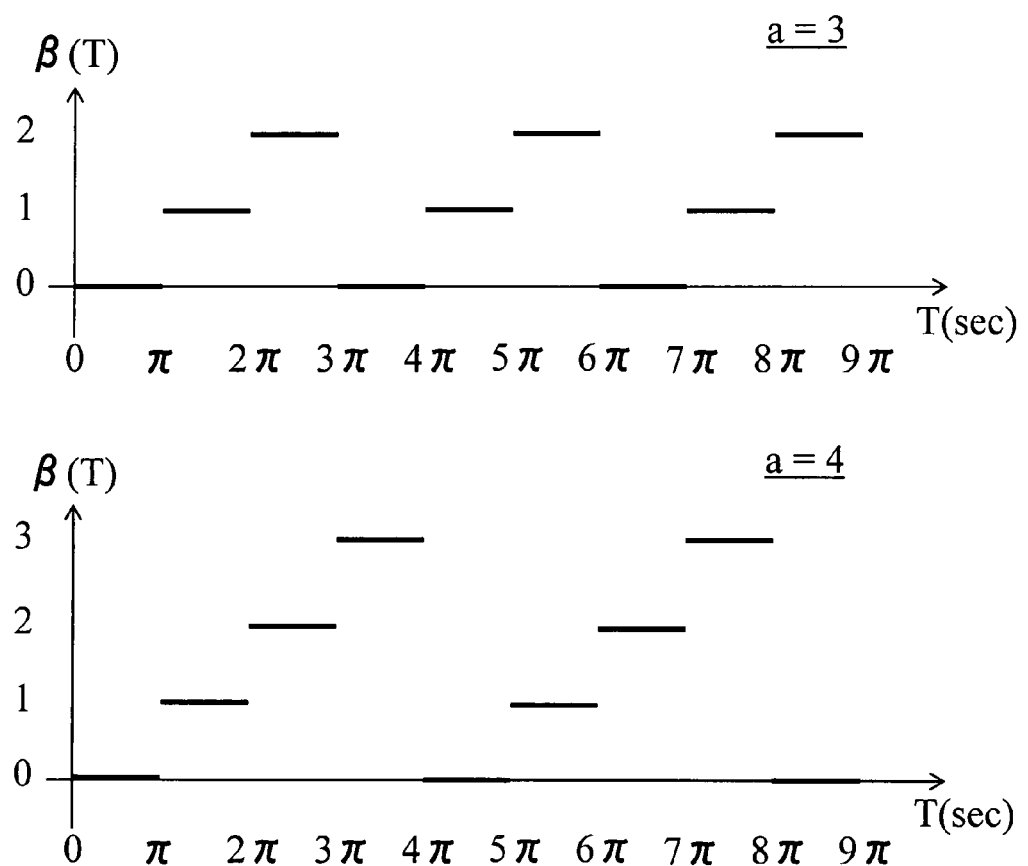
FIG. 11 is a graph showing change with time of $\beta(T)$.

According to the equation (3), $\beta(T)$ is: $\beta(T)=0$ at T=0 (sec), $\beta(T)=1$ at T=$\pi$ (sec), $\beta(T)=2$ (excluding a case where a=2) at T=$2\pi$ (sec), increases periodically each by one on every $\pi$(sec) unless exceeding: $\beta(T)=a-1$, and $\beta(T)=0$ after further lapse of $\pi$(sec) at: $\beta(T)=a-1$. As an example, FIG. 11 shows change of $\beta(T)$ in a case where a=3 and a=4. $\beta(T)$ is a function repeating integers from 0 to (a−1). The length of the time for the repeating period a$\pi$ (sec) is determined by the repetitive number a. By conducting such discharge, since the time of discharging an ink from a nozzle belonging to a discharging condition is always $\pi$(sec), an optical device with a constant ink film shape and with no occurrence of color shading, color mixing, etc. can be obtained.

(Method 4)

Further, in the method 3, it is desired to conduct discharge as described below. A method of manufacturing an optical device as described in the third aspect of the invention wherein the method includes: specifying each of the plural nozzles in the ink jet head by a natural number n counted sequentially from the end of the pixel, and defining the position of the nozzle along the second direction as Y(n), arranging the nozzle belonging to the ink jet head and situated at an $(n+a)_{th}$ position from the end of the inkjet head so as to satisfy an equation (5), conducting discharge in each of the nozzles (excluding the nozzles at n=(multiple number of a)) so as to satisfy an equation (6), defining the ingredient along the second direction in the speed of the main scanning of the ink jet head as V[m/sec], selecting an optional nozzle in the ink jet head, and defining the number counted from the nozzle present at the extreme end of the ink jet head that the nozzle belongs to:

$$Y(n+a)=Y(n) \tag{5}$$

$$Y(b_n+2)-Y(b_n+1)=V\pi \tag{6}$$

In the fourth method, nozzles are at first arranged to the ink jet head based on the same method as described above. All the nozzles are arranged such that the position Y(n) of the $n_{th}$ nozzle in the second direction is identical with the position Y(n+a) in the second direction of the next nozzle separated by the number of a in the second direction to form a pattern by nozzles repeating on every number of a in the ink jet head.

Further, $\beta(T)$ is set in the same manner as the third aspect of the invention. Then, nozzles are arranged so as to satisfy the equation (6) for all the nozzles excluding the nozzle at n=(multiple number of a) and discharge is conducted.

Figure 16:
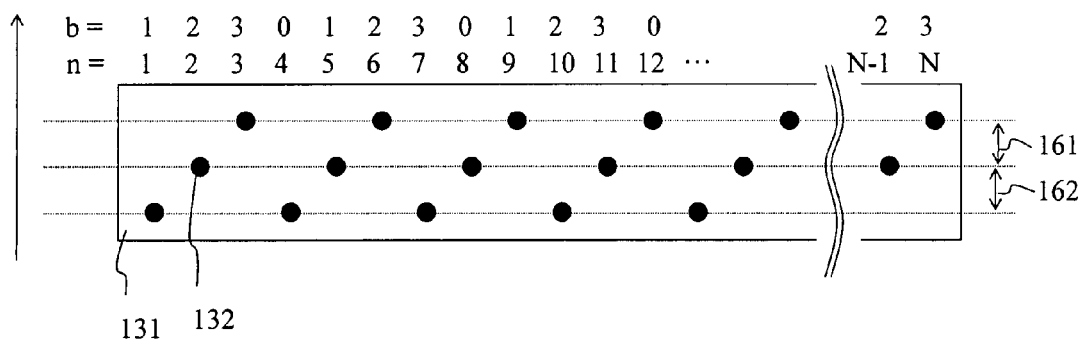
FIG. 16 is a schematic view showing an example of an arrangement for nozzles on an ink jet head.

That is, assuming the main scanning speed as V[m/sec], nozzles are arranged, in principle, such that nozzle distance (161, 162) between the adjacent nozzles in the second direction is displaced by V$\pi$[m] (FIG. 16). That is, main scanning is conducted at a speed of L/$\pi$[m/sec] when previously setting the distance between the adjacent nozzles in the second direction as L[m].

However, in a case of nozzles at: n=multiple number of a (a=3, n=3, 6, 9, 12 in a case shown in FIG. 16), nozzles are arranged not applying the equation (6) but applying the equation (5) to the adjacent nozzles (that is, nozzles at n=(multiple number of a+1 (n=4, 7, 10 in a case shown in FIG. 16)). By arranging the nozzles as described above, an ink jet head in which the positions of the nozzles in the second direction change periodically is constituted.

Figure 9:
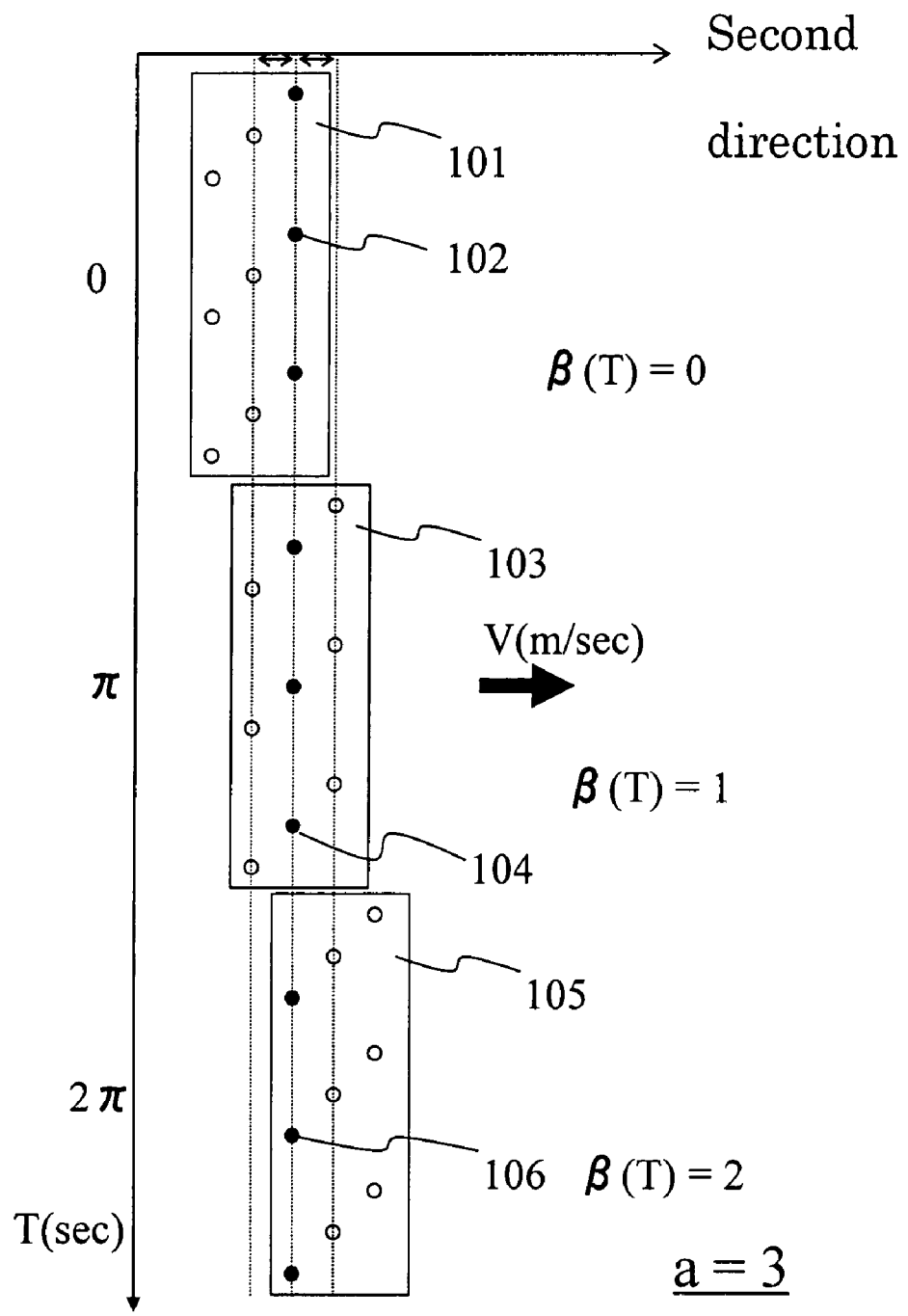
FIG. 9 is a schematic view showing change with time of nozzle discharging.

FIG. 9 shows an example of change with time of an ink jet head in the manufacturing method of an optical device using the fourth method. FIG. 9 shows an ink jet head at a repetitive number: a=3 and n=1 to 9 is shown (the uppermost nozzle in the ink jet head is defined as: n=1, and lower nozzles are defined as: n=2, n=3, . . . n=9). Three ink jet heads illustrated in FIG. 9 show the state of discharging nozzles with change of time. The ink jet head at the uppermost portion shows an ink jet head at any instance: $0 \leq T \leq \pi$. The ink jet head at the middle portion shows an ink jet head at any instance: $\pi \leq T \leq 2\pi$. The ink jet head in the lowermost portion shows an ink jet head at any instance: $2\pi \leq T \leq 3\pi$. In the example, $b_1=1$, $b_2=2$, $b_3=0$, $b_4=1$, $b_5=2$, $b_6=0$, $b_7=1$, $b_8=2$, $b_9=0$. In the first state (T=0), discharge is conducted simultaneously only from the nozzle 102 at surplus $b_n=1$ in the ink jet head 101. Since the nozzles at: surplus $b_n=1$ are arranged at the identical position along the second direction, a stripe pattern could be formed at a good accuracy.

Successively, after lapse of time n into a next state (T=$\pi$), discharge is conducted simultaneously only from the nozzle 104 at surplus $b_n=2$ in the ink jet head 103. In this case, the ink jet head 103 has moved from the initial state by a distance (V$\pi$[m]) of the speed component V along the second direction of the main scanning speed multiplied by time $\pi$ (sec). Accordingly, by previously arranging for the nozzle 102 and the nozzle 104 at the positions along the second direction being displaced by V$\pi$[m], the ink could be applied to the identical position in the second direction also in the discharge at the next state (T=$\pi$) with that of the ink discharged in the initial state. Further, also in the discharge in the next state (T=$2\pi$), discharge is conducted simultaneously only from the nozzle 106 at surplus $b_n=0$ in the ink jet head 105. In this case, the ink jet head 105 has moved by a distance (2 V$\pi$) of the speed component V along the second direction of the main scanning speed multiplied by time $2\pi$ (sec). Then, by arranging the nozzle 102 and the nozzle 106 at the positions along the second direction being previously displaced by 2 V$\pi$, the ink could be applied to the identical position in the second direction with that for the ink discharged in the initial state.

According to the invention, a stripe pattern could be formed accurately while suppressing the occurrence of crosstalk by not conducting discharge simultaneously from the nozzles in the ink jet head and by displacing the nozzle position by a predetermined position depending on the surplus for the nozzle and the main scanning speed.

Successively, a fifth method is to be described. According to the method, the pixel is printed in the second method described above while controlling the timing of ink discharge based on the length of the pixel width, the distance between the plural nozzles to each other, and the moving speed of the nozzle and the substrate.

Specifically, in this aspect the invention provides a method of manufacturing an optical device of specifying each of nozzle projection images upon projection of the plural nozzles on a line showing the second direction (lateral direction of pixel) with a sequence U as counted from the top end in the second direction (lateral direction of pixel), defining the distance between each of the nozzle projection images as D, the width of the pixel as L, the moving speed as V and the timing at which ink is started to discharge from the nozzle with the value "1" for the sequence U as $T^1_{start}$ and starting discharge from a nozzle corresponding to the sequence U of a specified value at a timing $T^U_{start}$ satisfying the following equation (7), printing the ink to the position described above, and then stopping the discharge thereof at a timing $T^U_{stop}$ satisfying a following equation (8):

$$T_{Start}^{U} = T_{Start}^{1} + (U-1) \times D/V \quad (7)$$

$$T_{Stop}^{U} = T_{Start}^{U} + L/V \quad (8)$$

Figure 20:
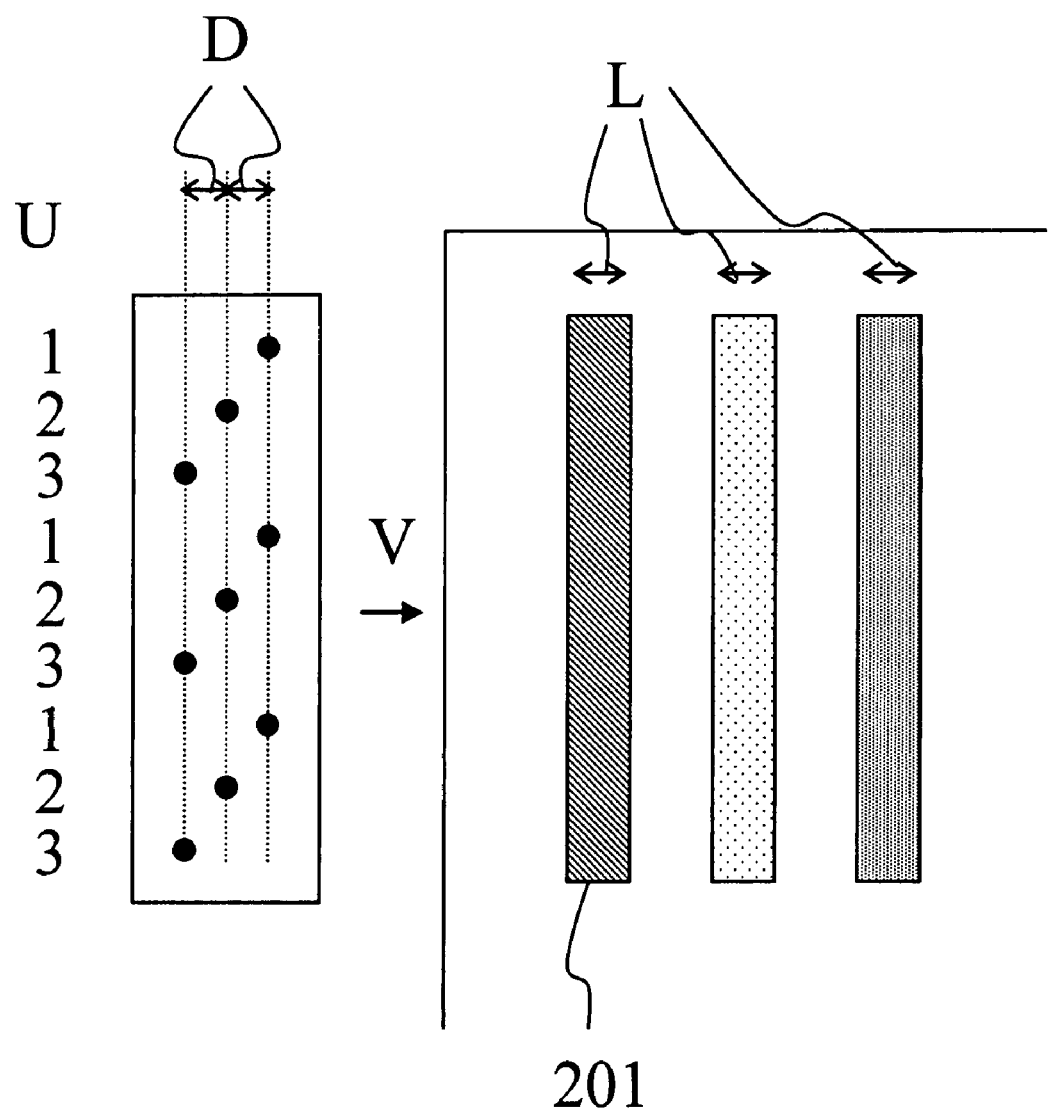
FIG. 20 is a schematic view showing a relation for nozzle distance, pixel width, and operation speed of an ink jet head.

According to the fifth method, plural nozzles are projected on a line showing the second direction for all the nozzles. Then, the sequence of the respective nozzle projection images in the second direction is defined as sequence U. In this case, the sequence U at the nozzle discharging for the first time is defined as 1. FIG. 20 shows an example of a relation for an ink jet head, nozzles provided in the ink jet head, an elongate pixel 201 to be formed, a pixel width L, an inter-nozzle projected area distance D, a moving direction of the ink jet head and a moving speed V of the ink jet head.

According to the method, since the timing $T^U_{start}$ for starting the discharge from the nozzle at the sequence U is displaced in accordance with the sequence U from $T^1_{start}$ by an (inter-nozzle projection image distance D)/V, discharge can be started in any nozzle always at the instance the nozzle reaches an aimed pixel.

Further, according to the method, since the discharge stopping timing $T^U_{stop}$ for the sequence U is displaced from $T^U_{start}$ by a (pixel width L)/V in accordance with the sequence U, discharge can be stopped in any nozzle always at the instance where passage of the nozzle on the aimed pixel has been completed. Then, in any nozzle, the discharge time ($T^U_{stop} - T^U_{start}$) is equal with L/V.

According to the method, an elongate pixel can be formed at high accuracy and with no occurrence of failure such as "whitening" or "color shading" while displacing the timing at which each of the nozzles substantially conducts discharge and reducing the interference of vibrations between the nozzles to each other.

Figure 36:
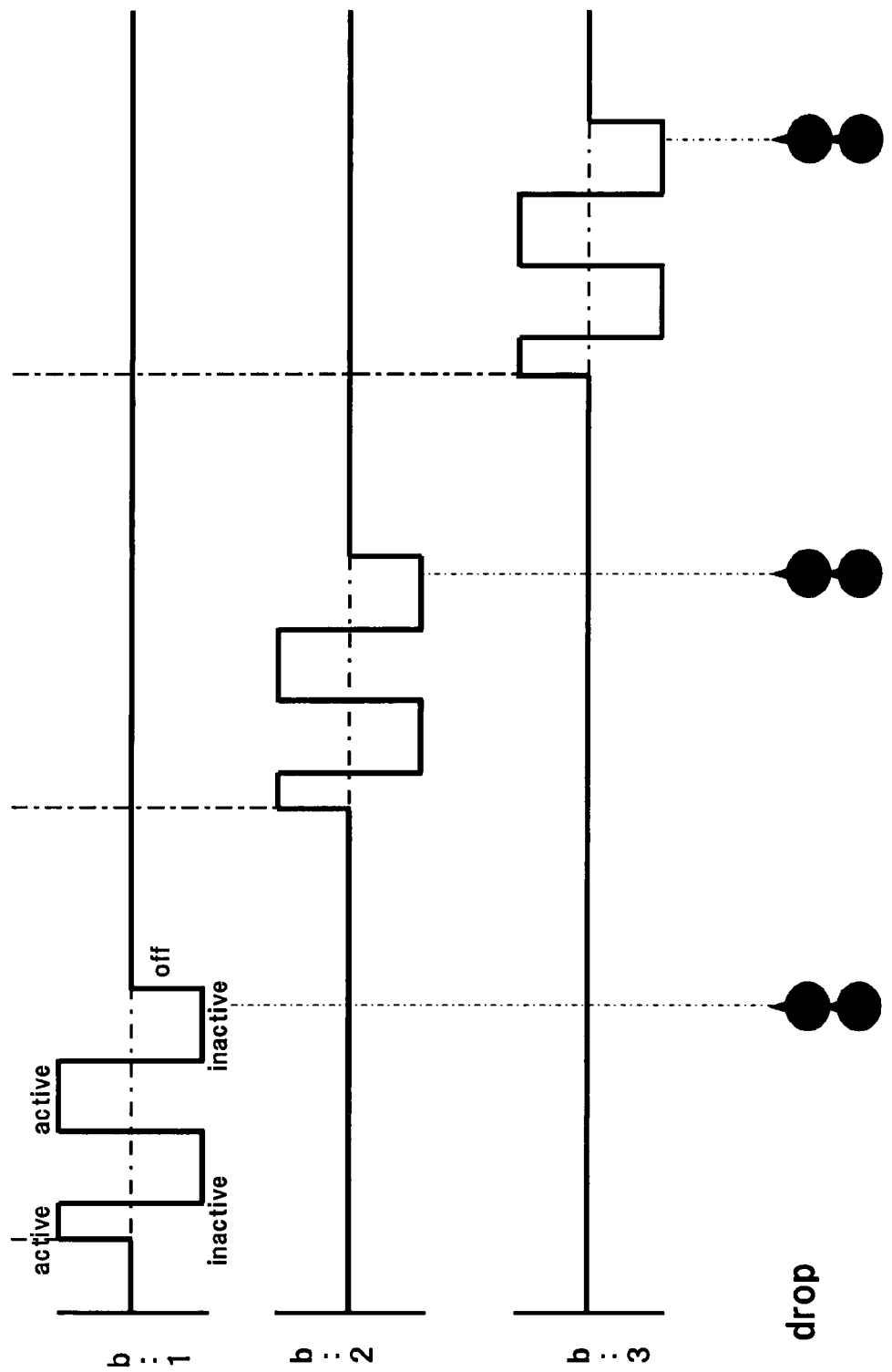
FIG. 36 is an example showing pulsed a voltage applied to a piezo electric element in a case where plural droplet are discharged.

Subsequently a sixth method is to be described. In a unit step, plural ink droplet is discharged from a nozzle. FIG. 36 shows an example of an applied voltage in a case where two droplets is discharged from each nozzle at one discharging. In FIG. 36, at first one discharging is conducted by a unit step of discharging two droplets from a nozzle satisfying b=1. Successively, one discharging is conducted by a unit step of discharging two droplets from a nozzle satisfying b=2. Successively, one discharging is conducted by a unit step of discharging two droplets from a nozzle satisfying b=3.

"An amount (6.0 pl) of one ink droplet discharged from a specified nozzle in a case where an ink droplet discharge from the specified nozzle is synchronization with that from the $a_{th}$ nozzle from the specified nozzle" is different from "an amount (6.2 pl) of one ink droplet discharged from a specified nozzle in a case where an ink droplet discharge from the specified nozzle is not synchronization with that from the $a_{th}$ nozzle from the specified nozzle". The sixth method is a method of manufacturing an optical device including a step of discharging a desired amount of an ink inside a pixel by using this ratio (6.2/6.0=1.0333) as discharge coefficient.

An amount of an ink discharged from a specified nozzle is found by multiplying discharge coefficient, the number of ink discharging and an amount of an ink in a standard state where an ink is synchronously discharged from an adjacent nozzle discharging an ink at the same time as the specified nozzle. A precise discharging of a desired amount of an ink inside a pixel is possible by using the above mentioned amount.

Inventors found that, in this unit step, as for an amount of one ink droplet discharged from a specified nozzle, a certain difference occurs depending on a difference between the number of droplets discharged from the specified nozzle and that from an adjacent nozzle discharging droplets at the same time as the specified nozzle. "An adjacent nozzle discharging droplets at the same time as the specified nozzle" is not a neighboring nozzle of the specified nozzle, but is a nozzle adjacent to the specified nozzle among nozzles discharging droplets at the same time as the specified nozzle.

Figure 30:
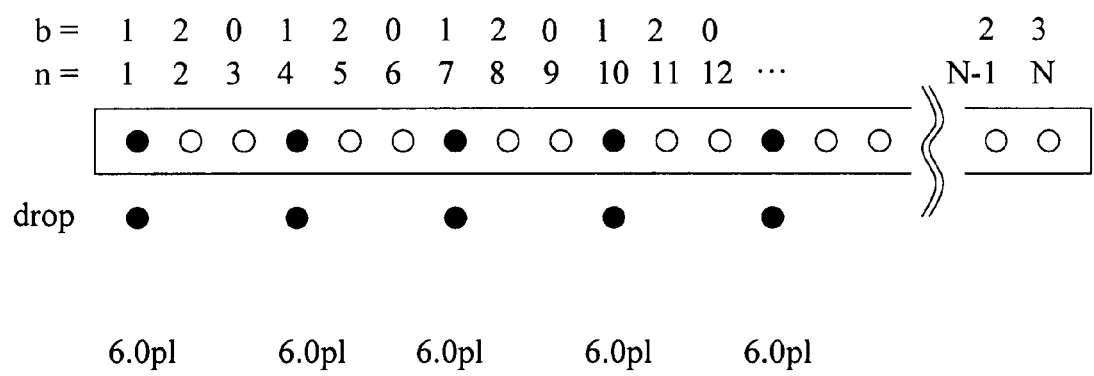
FIG. 30 is a schematic view showing an example of an arrangement for nozzles on an ink jet head and ink discharging amount.

A nozzle adjacent to a nozzle at nth position is not a nozzle at (n+1)th position or (n−1)th position, but is a nozzle at (n+a)th position or (n−a)th position. In FIG. 30, "An adjacent nozzle discharging droplets at the same time as the specified nozzle" in a case where n=4 is a nozzle at n=1 or 7.

As described above, as for nozzles corresponding to an identical surplus b, an ink is discharged at the same time, but the number of ink droplets discharged from each nozzle is not always same with each other. The number of ink droplets discharged from each nozzle can be independently controlled every nozzle.

As for all nozzles belonging to a certain surplus b, in a case where the identical number of ink droplets is discharged, there is not a case where an ink is solely discharged only from a certain nozzle.

However, when the numbers of ink droplets discharged from nozzles belonging to a certain surplus b at one discharge are different from each other, there is a case where an ink is solely discharged only from a specified nozzle. For example, FIG. 31 shows a case where one ink droplet is discharged from a specified nozzle at one discharge and two ink droplets are discharged from "an adjacent nozzle discharging droplets at the same time as the specified nozzle".

In FIG. 31, a first ink droplet is synchronously discharged from nozzles in right and left sides, but a second ink droplet is discharged only from a nozzle in a left side. As for the nozzle in a left side, dynamic situation of an ink in surroundings at the time of discharging of the first ink droplet is different from that at the time of discharging of the second ink droplet. So, an amount of the first ink droplet is different from an amount of the second ink droplet.

According to FIG. 31, two droplets are discharged from the nozzle in a left side, and a total amount of the ink droplet is 12.2 pl. On the other hand, one droplet is discharged from the nozzle in a right side, and amount of the droplet is 6.0 pl. As for the nozzle in a left side, the first droplet of 6.0 pl is discharged in synchronization with discharging of a droplet from the nozzle in a right side. Further, the second ink droplet of 6.2 pl is discharged from the nozzle in a left side. Since the discharging of the first droplet from the nozzle in a left side is in synchronization with the discharging of a droplet from the nozzle in a right side, an amount of the first droplet from the nozzle in a left side is equal to that from the nozzle in a right side.

It is thought that since a droplet is not discharged from the nozzle in a right side at the time of the second droplet discharging from the nozzle in a left side, a part of an ink in an ink chamber of the nozzle in a right side is discharged from the nozzle in a left side and an amount of the second droplet discharged from the nozzle in a left side increases.

In addition, in the unit step, an ink is selectively discharged from the plural nozzles corresponding to the surplus b of a specified value except for nozzles (resting nozzles) placed at a position corresponding to repeated patterns included in the lattice-shaped partition wall along a breadthwise direction of a pixel.

Figure 27:
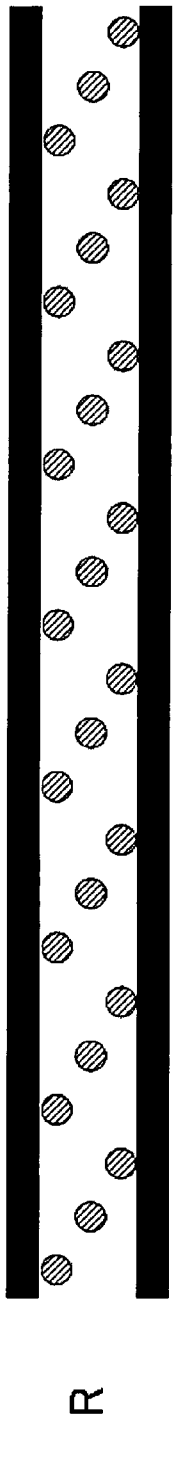
FIGS. 27 A and B are schematic views showing ink discharging amount from an ink jet head.
Figure 27:
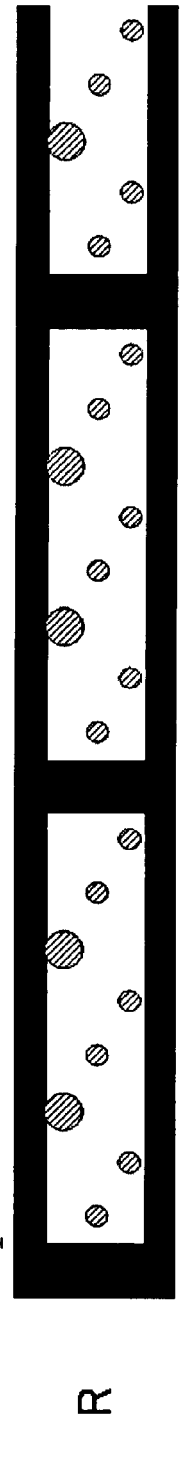

However, uniformity of an amount of a discharged ink in a case where an ink is discharged from nozzles including resting nozzles falls compared with a case where an ink is discharged from all the nozzles corresponding a surplus b of a specified value FIG. 27 shows the comparison of an amount of a discharged ink per once in a case where an ink is discharged from all the nozzles corresponding to a surplus b=0 with an amount of a discharged ink per once in a case where an ink is discharged from nozzles corresponding to a surplus b=0 except for resting nozzles.

FIG. 27 (a) shows an example where a stripe R pixel pattern is formed by using all nozzles of R (for red) ink jet head. In this example, the repetitive number is set as: a=3, an ink jet head is scanned for a lower direction, and an ink is discharged only once from each nozzle. At first ink is discharged from a nozzle of $b_n=1$, ink is discharged from a nozzle of $b_n=2$ next, ink is discharged from a nozzle of $b_n=0$ next. Then, as shown in FIG. 27, an almost same amount of an ink is discharged from nozzles of n=1-24, because a discharge condition of neighboring nozzles does not vary.

On the other hand, FIG. 27 (b) shows an example where a stripe R pixel pattern is formed by using a part of nozzles of R (for red) ink jet head. In this example, the repetitive number is set as: a=3, an ink jet head is scanned for a lower direction, and an ink is discharged only once from each nozzle.

In this example, an ink is not discharged from nozzles (n=1, 10 and 19) placed at a position corresponding to pattern-shaped partition wall. All of non-discharge nozzles belong to a surplus $b_n=1$.

Therefore, an amount of a discharged ink from nozzles belonging to a surplus $b_n=1$ vary compared with an amount of a discharged ink in a case where an ink is discharged from all nozzles. As shown in FIG. 27(b), an amount of a discharged ink from nozzles belonging to a surplus $b_n=1$ is 6 pl. That is, the amount of a discharged ink increased by 1 pl compared with a case (FIG. 27(a)) where an ink is discharged from all the nozzles. This is mainly because, as for nozzles belonging to a surplus $b_n=1$, influence of vibration of vicinity nozzles and cross talk decrease. As for nozzles at a surplus $b_n=0$ or 2, since there is not any resting nozzles, an amount of a discharged ink is uniform. As described above, when there is a resting nozzle among nozzles having an identical surplus $b_n$, an amount of a discharged ink changes depending on a surplus $b_n$ and this change of an amount of a discharged ink may cause "color shading" inside a pixel.

Figure 29:
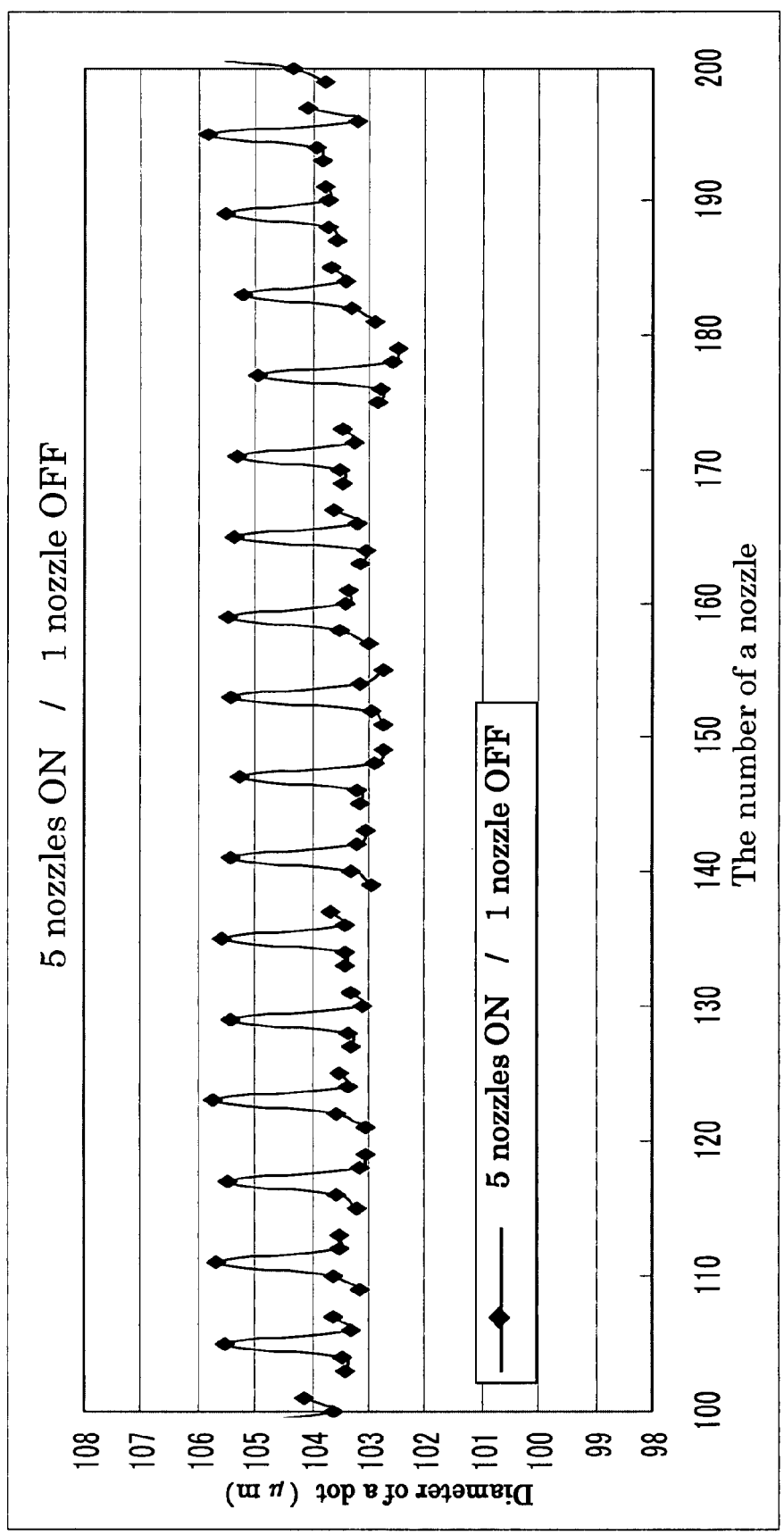
FIG. 29 is a schematic view showing ink discharging amount from each of nozzles of an ink jet head.

FIG. 29 shows a dot diameter of a pixel discharged from each nozzle per one shot in a case where one resting nozzle is added every five nozzles in nozzle arrangement. In this example, repetitive numbers a=3, five nozzles among six nozzles are used for forming a pixel and one nozzle is rested periodically. According to FIG. 29, as for nozzles belonging to a surplus $b_n$ corresponding to a resting nozzle, an amount of discharged ink increased outstandingly from nozzles except for resting nozzles.

In addition, the following problems are exemplified as a cause of "color shading" as well as cross talk in ink discharging. A property of a surface of an ink may change depending on whether an ink is flowing or not. In other word, generally, flowability of an ink inside a nozzle falls and an amount of discharged ink decreases after a certain time passed from beginning of vibration, compared with that just after beginning of vibration.

In addition, an amount of discharged ink from nozzles belonging to a surplus $b_n$ where continuous ink discharge begins decreases, compared with that from nozzles belonging to other surplus (not $b_n$).

An example is shown below. Ink discharge starts from nozzles of a surplus $b_n=1$, and subsequently ink discharge from nozzles of surpluses $b_n=2$ and 0 is conducted in this order. Flowability of an ink inside nozzles of surpluses $b_n=2$ and 0 has increased by influence of vibration of previous ink discharge. On the other hand, as for an ink inside nozzles of a surplus $b_n=1$, a change of a property of a surface (meniscus) on an ink near a nozzle occurs (for example, increasing of viscosity of an ink by drying) because long time has passed from ink discharge from nozzles of a surplus $b_n=0$. This is called "lying down and getting up phenomena" or the like. Because of this "lying down and getting up phenomena", an amount of discharged ink changes and color shading occurs, according to a surplus $b_n$.

In addition, actually, a structure of a piezo electric element is not always uniform. An error occurs due to accuracy of finishing of a ceramics chamber, a piezo electric element, nozzle diameter or the like, and it is thought that color shading may occur thereby.

Then, according to this invention, occurrence of "color shading" is avoided by measuring influence of a non-discharge nozzle placed at a position corresponding to the pattern-shaped partition wall and corresponding to a surplus b on an amount of a discharged ink from a nozzle, and deciding an amount of a discharged ink by reflecting the measured influence (information) so that an amount of a discharged ink becomes constant.

For example, influence of a resting nozzle according to a pattern of a partition wall on an amount of discharged ink from a nozzle.

For example, an amount of discharged ink in a case where all nozzles discharge ink alone is defined as an ideal amount of discharged ink. A ratio of "an ideal amount of discharged ink" to "an actual amount of discharged ink which is actually measured by reflecting influence of a resting nozzle" is defined as "discharge coefficient (a)".

"discharge coefficient(a)"="an actual amount of discharged ink"/"an ideal amount of discharged ink"

Here, color shading due to a resting nozzle can disappear by manufacturing an optical device by reflecting inverse number of discharge coefficient (a).

Figure 28:
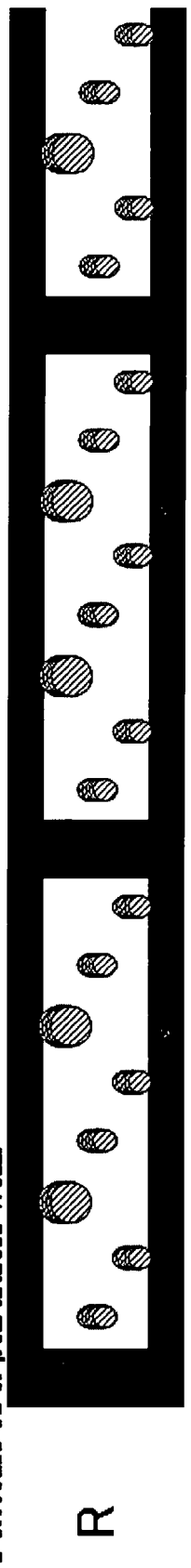
FIG. 28 is a schematic view showing ink discharging amount from an ink jet head.

In example of FIG. 27(b), as for nozzles belonging to a surplus $b_n=1$, since there are resting nozzles (n=1, 10, 19 . . . 18+9×m (m is a optional natural number)), an amount of a discharged ink per one shot from nozzles belonging to a surplus $b_n=1$ is 1.2 times as much as that from nozzles except for nozzles belonging to a surplus $b_n=1$. That is, discharge coefficient=1.2. Then, in example of FIG. 28, it is decided that the number of times of ink discharging from nozzles belonging to a surplus $b_n=1$ is $1/1.2$ (5/6) times as many as that from other nozzles, so a total amount of a discharged ink from each nozzle becomes equal to each other. In this example, an amount of discharged ink is adjusted to be constant by adjusting the number of times of ink discharging. Besides, an amount of discharged ink per one shot from a nozzle can be adjusted by changing a voltage or a waveform of a pulsed current applied to a piezo electric element so that an amount of discharged ink or the number of times of ink discharging is proportional to a inverse number of discharge coefficient.

Ink discharging from nozzles except for a resting nozzle is a special case where the number of times from a resting nozzle is 0 in a case where ink is simultaneously discharged from nozzles of identical surplus b.

As described above, when the numbers of droplets simultaneously discharged from adjacent nozzles are different from each other, an amount of droplet discharged from a nozzle fluctuates depending on the difference of the number of discharged droplets. In a case where a nozzle adjacent to a certain nozzle is to discharge ink at same time as the certain nozzle is a resting nozzle, the number of droplets discharged from the certain nozzle is "a difference of the number of discharged droplets". In addition, discharge coefficient (a) at a nozzle n has a certain value depending on difference between the number of droplets discharged from nozzle n and the number of droplets discharged from nozzles of same surplus bn which are adjacent to the nozzle n on right side and on left side.

If $\Delta D(Dn-Dn\pm1)$ increases, discharge coefficient increases. Here Dn means the number of times of ink discharging of nozzle n. $Dn\pm1$ means the number of times of ink discharging of nozzles of same surplus bn which are adjacent to the nozzle n on right side and on left side. $\Delta D$ means Dn minus $Dn\pm1$. The number of times of ink discharging Dn and calculation method of $\Delta D$ are described below.

In FIG. 30, an ink is discharged from nozzles which is corresponding to a surplus $b_n=1$ and which is at: n=1, 4, 7, 10 . . . . As for all nozzles, the number of times of ink discharging is one and a total amount of discharged ink is 6.0 pl. That is, as for all nozzles, an amount of discharged ink per one discharge is 6.0 pl.

FIG. 31 shows a nozzle arrangement drawing where only nozzles of a surplus $b_n=1$ are noted.

The number of times of ink discharging from a left side nozzle is two (two drops) and the number of times of ink discharging from a right side nozzle is one (one drop). Here, as for the left side nozzle, since second ink discharging is influenced by a state of resting of ink discharging from the right side nozzle, an amount of discharged ink increases. So an amount of discharged ink per one time is 6.1 pl (=12.2 pl/2). Discharge coefficient (a) is 1.017 (=6.1/6.0).

On the other hand, as for the right side nozzle, since first ink discharging is conducted at the same time as ink discharging from the left side nozzle, the first ink discharging is not influenced by a resting nozzle. So an amount of discharged ink is 6.0 pl and discharge coefficient (a) is 1.00.

Figure 32:
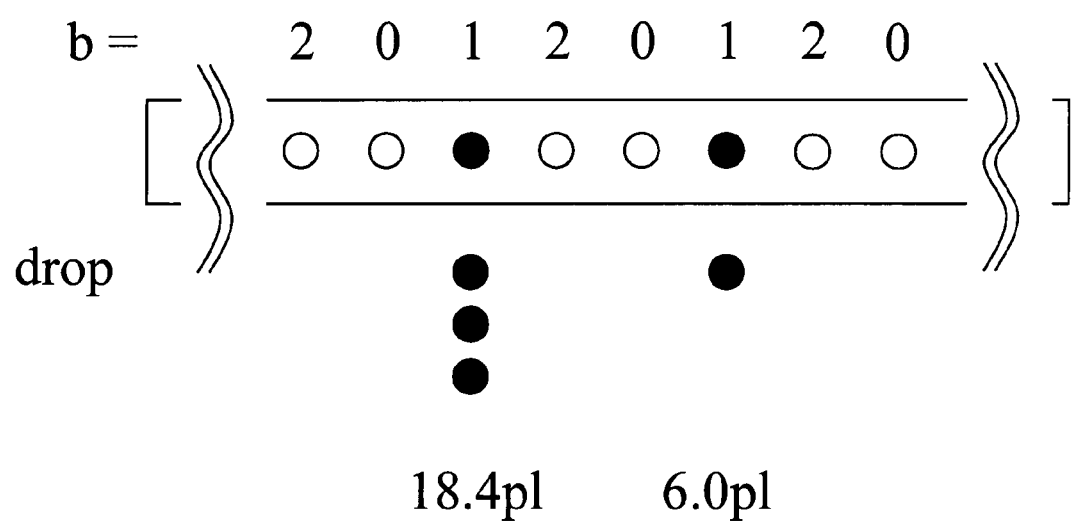
FIG. 32 is a schematic view showing an example of an arrangement for nozzles on an ink jet head and ink discharging amount.

FIG. 32 shows a nozzle arrangement drawing where only nozzles of a surplus $b_n=1$ are noted.

The number of times of ink discharging from a left side nozzle is three (three drops) and the number of times of ink discharging from a right side nozzle is one (one drop). Here, as for the left side nozzle, since second and third ink discharging is influenced by a state of resting of ink discharging from the right side nozzle, an amount of discharged ink increases. So an amount of discharged ink per one time is 6.13 pl (=18.4 pl/3). Discharge coefficient (a) is 1.022 (=6.13/6.0).

On the other hand, as for the right side nozzle, since first ink discharging is conducted at the same time as ink discharging from the left side nozzle, the first ink discharging is not influenced by a resting nozzle. So an amount of discharged ink is 6.0 pl and discharge coefficient (a) is 1.00.

Figure 33:
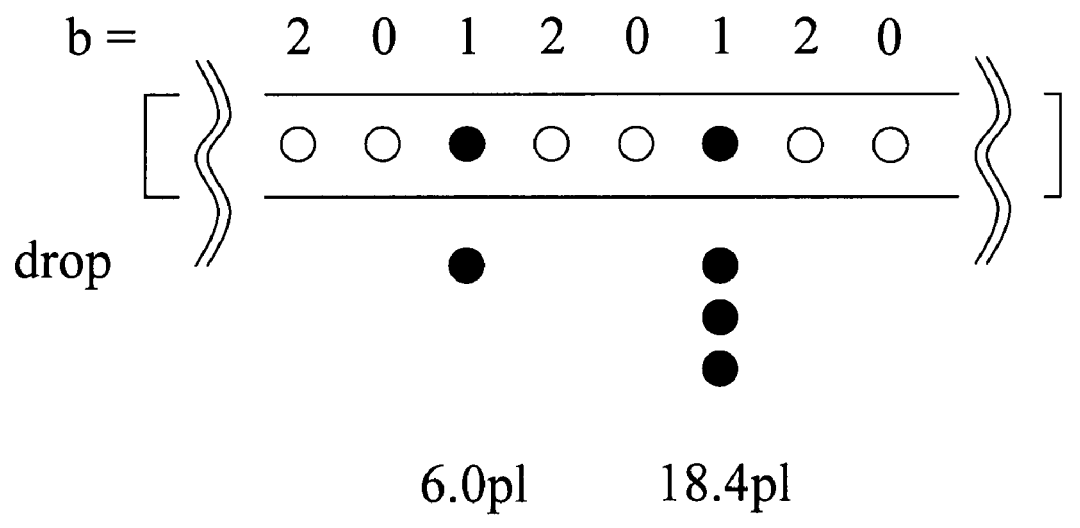

FIG. 33 shows a case where the number of times of ink discharging from a right side nozzle is more than that from a left side nozzle. Same as the case of FIG. 32, discharge coefficient (a) of a right side nozzle is higher than 1.0.

As described above, in a case where the numbers of times of ink discharging from a certain nozzle and other nozzle adjacent to the certain nozzle in right or left side are different from each other, discharge coefficient (a) of a nozzle of which the number of times of ink discharging is more among the both nozzles shifts from 1.00. Discharge coefficient (a) generated by resting of an adjacent nozzle can be quantitatively measured.

Figure 34:
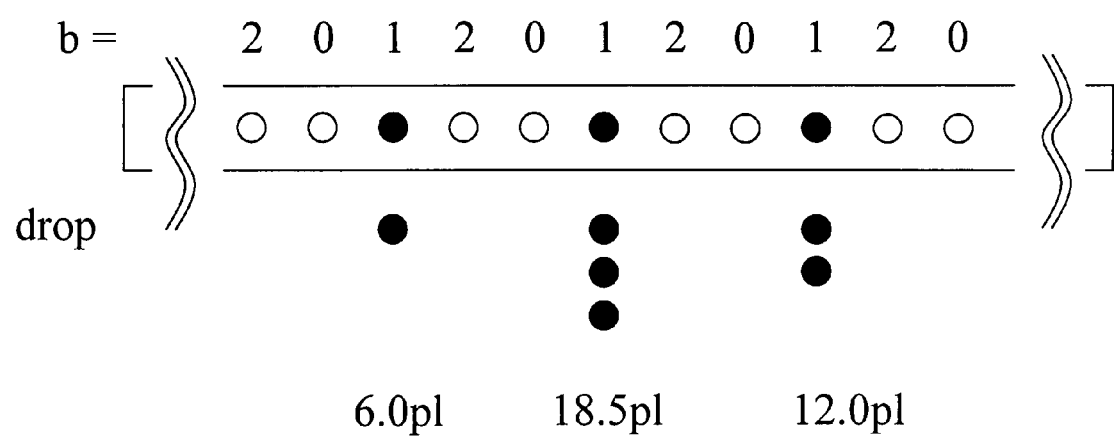
FIG. 34 is a schematic view showing an example of an arrangement for nozzles on an ink jet head and ink discharging amount.

FIG. 34 shows a case where the number of times of ink discharging from a certain nozzle is different from both the numbers of times of ink discharging from adjacent nozzles in right and left sides. The number of times of ink discharging from the certain nozzle (a center nozzle) is three. On the other hand, the number of times of ink discharging from the adjacent nozzle in left side is one and that from the adjacent nozzle in right side is two.

In a case where, as described above, the number of times of ink discharging from a certain nozzle of a certain surplus $b_n$ is different from both the numbers of times of ink discharging from adjacent nozzles of same surplus $b_n$ in right and left sides, discharge coefficient (a) of the certain nozzle is calculated by reflecting both influence of the left side nozzle and influence of the right side nozzle.

Discharge coefficient (a) of the certain nozzle can be found by multiplying "discharge coefficient (a, Left) based on the left side nozzle" by "discharge coefficient (a, Right) based on the right side nozzle".

That is,

"discharge coefficient(a)of a nozzle"="discharge coefficient(a,Left)based on a left side nozzle"×"discharge coefficient(a,Right)based on a right side nozzle".

However, all coefficients are near 1.0. So, an approximate value of "discharge coefficient (a) of a nozzle" can be found by the following expression:

"discharge coefficient(a)of a nozzle"="discharge coefficient(a,Left)based on a left side nozzle"+"discharge coefficient(a,Right)based on a right side nozzle"−1.

Here, for example, discharge coefficient (a, Left) found by the method described above is 1.02 and discharge coefficient (a, Right) found by the method described above is 1.01. In this case, discharge coefficient (a) of a central nozzle shown in FIG. 34 can be found by the following expression:

discharge coefficient(a)of the center nozzle=1.02×1.01≈1.02+1.01−1=1.03.

As described above, by finding discharge coefficient (a), a step of measuring influence of non-discharging of an ink from a nozzle at a position corresponding to the pattern shaped partition wall and corresponding to a surplus b on an amount of discharged ink from a usable nozzle can be conducted.

Besides, while considering discharge coefficient (a), an ink is uniformly discharged from an ink jet head by a step of reflecting this measured data so that an amount of discharged ink from a nozzle which discharge an ink, and a fine optical device can be manufactured by preventing color shading.

Figure 35:
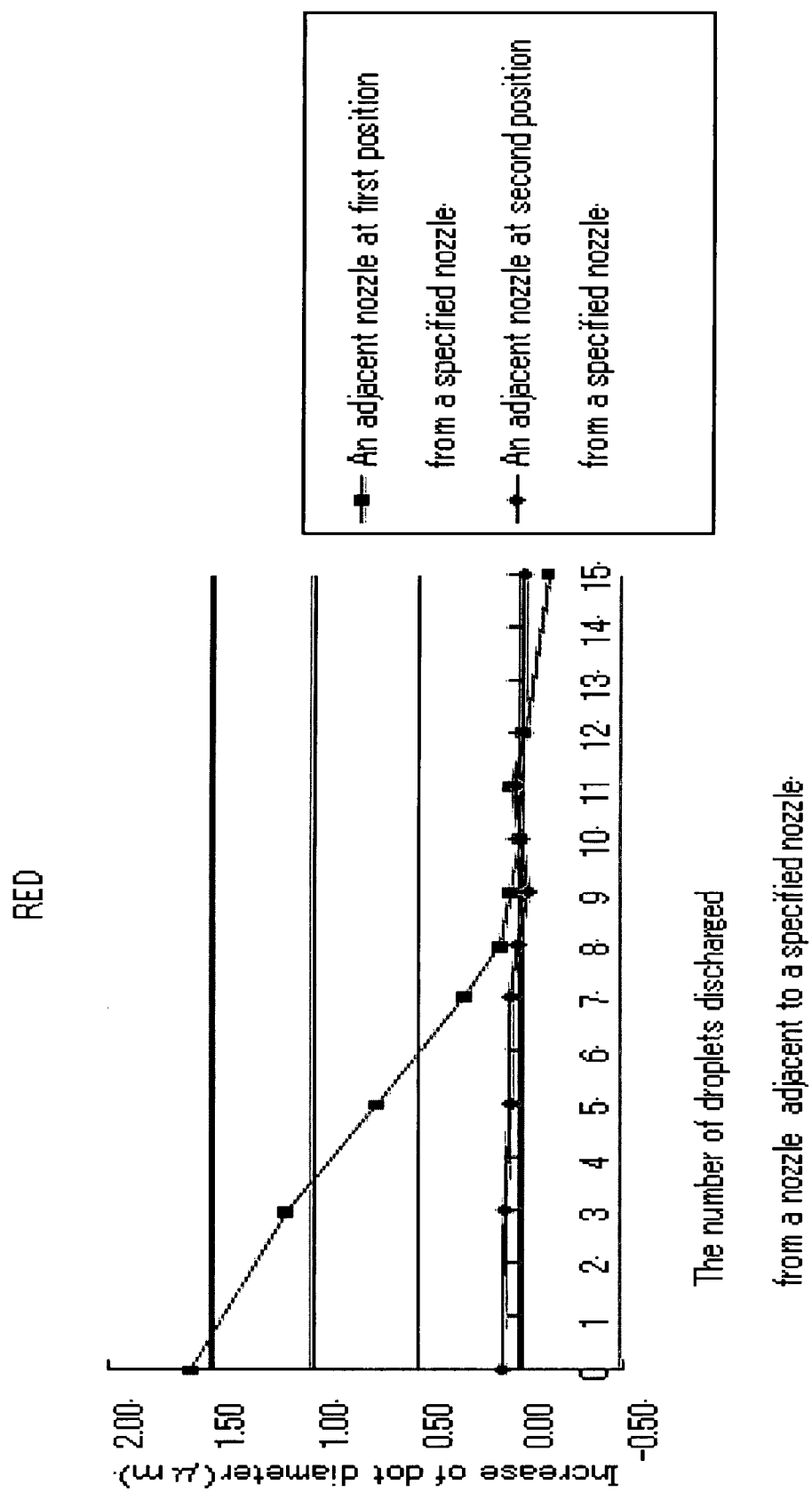
FIG. 35 is a graph showing a relation between "a difference between the numbers of droplets from adjacent nozzles" and "an amount of droplets".

By the way, according to FIG. 35, when a difference between the number of droplets discharged from a certain nozzle and that from a nozzle adjacent to the certain nozzle increases, a difference between discharge coefficient (a) and 1.00 becomes big. This fact shows that when a difference between the number of droplets discharged from a certain nozzle and that from a nozzle adjacent to the certain nozzle increases, uniformity of an amount of discharged ink becomes low.

When a difference between discharge coefficient (a) and 1.00 becomes big, uniformity of an amount of discharged ink from a nozzle falls and reliability of discharge coefficient falls.

Therefore, in a case where ink is discharged from an ink jet head by a step of reflecting this measured data so that an amount of discharged ink becomes constant, it is desirable that a difference between the number of droplets discharged from a certain nozzle and that from a nozzle adjacent to the certain nozzle is small, from the following aspects: discharge coefficient (a) should be near 1.00; and color shading should be prevented. For example, as for all nozzles, the number of times of ink discharging from an adjacent nozzle of a certain nozzle is 60%-140% of that from the certain nozzle. More preferably, it should be 80%-120%.

Besides, as for all nozzles discharging an ink on one pixel sectioned by a partition wall, the number of times of ink discharging from a nozzle adjacent to a certain nozzle should be 60%-80% of that from the certain nozzle. More preferably, it should be 80%-120%.

In addition, for example, an amount of discharged ink from a certain nozzle in a case where the certain nozzle discharges an ink continuously alone is defined as an ideal amount of discharged ink. The ratio of an ideal amount of discharged ink to an actually measured amount of discharged ink in a case where an ink is discharged after non-discharging for some time is defined as discharge coefficient (b). For example, this is shown as the following expression.

discharge coefficient($b$)=an actual amount of discharged ink/an ideal amount of discharged ink The problem such as color shading due to "lying down and getting up phenomena" can be dissolved by manufacturing an optical device by reflecting inverse number of discharge coefficient (b).

In addition, for example, an average of amounts of discharged ink from all nozzles is defined as an ideal amount of discharged ink. The ratio of an ideal amount of discharged ink to actually measured amount of discharged ink from each nozzle is defined as discharge coefficient (n) for each nozzle. For example, this is shown as the following expression.

discharge coefficient($n$)=an actual amount of discharged ink from nozzle $n$/an ideal amount of discharged ink The problem such as color shading due to uneven machining accuracy of a nozzle can be dissolved by manufacturing an optical device by reflecting inverse number of discharge coefficient (n).

In addition, in this invention, more accurate ink discharging can be conducted by using some coefficients which discharge coefficient (a), discharge coefficient (b) and discharge coefficient (n) are combined with each other.

FIG. 37 shows an example where color ink of about 402 pl was discharged inside a certain pixel surrounded with a partition wall by using discharge coefficient (a) and discharge coefficient (n).

When "the number of discharged droplets" from each nozzle corresponding to a specified pixel is decided, a difference between the number of times of ink discharging from a certain nozzle and that from a nozzle adjacent to the certain nozzle is found. According to a table prepared beforehand or coefficient k measured beforehand and to this difference, discharge coefficient (a) is found by adding discharge coefficient (a, left) based on left adjacent nozzle to discharge coefficient (a, right) based on a right adjacent nozzle. Further, a total coefficient is found by multiplying discharge coefficient (a) by discharge coefficient (n) which is unique to a nozzle. Then, an amount on an ink is calculated by the following expression for every nozzle.

"An ideal amount of discharged ink per one drop"×"a total coefficient"×"the number of times of ink discharging"

Then, a solution of combination of the number of times of ink discharging is found by repeating trial and error so that a total of amounts of discharged ink from all nozzles corresponding to a specified pixel is equal to or near 402 pl.

In this case, plural solutions are found, but, as described above, it is desirable that a difference between the numbers of times of ink discharging from every nozzle should be within a certain value.

Besides, the following method can be adopted:

a method of manufacturing an optical device by using an ink jet head with plural nozzles arranged at an uniform distance substantially in a first direction, said method includes coloring pixels by discharging an ink on a substrate with pattern shaped partition walls so that colors of pixels adjacent in a second direction are different from each other while conducting main scanning of an ink jet head discharging an ink from the nozzles relatively in a second direction which is substantially in perpendicular to a first direction, wherein each nozzle discharges an ink respectively, discharging an ink to a pixel from selected nozzle(s) from all usable nozzles, discharging an ink to a pixel from other selected nozzle(s) from all usable nozzles, repeating the discharging steps once or more times, wherein a ratio of "an amount of one ink droplet discharged from a specified nozzle among the selected nozzle(s) in a case where an ink droplet discharge from the specified nozzle is synchronization with that from a nozzle adjacent to the specified nozzle among the selected nozzle(s)" to "that in a case where an ink droplet discharge from the specified nozzle is not synchronization with that from a nozzle adjacent to the specified nozzle among the selected nozzle(s)" is found, a desired amount of an ink is found by multiplying "an amount of an ink droplet in a case where an ink droplet discharge from the specified nozzle is synchronization with that from a nozzle adjacent to the specified nozzle among the selected nozzle(s)" by inverse number of the ratio (as discharge coefficient), and the desired amount of an ink is discharged in a pixel.

In addition, the selected nozzles may be two or more spaced nozzles. That is, there may be a non-selected nozzle(s) between the selected nozzles.

In a case of forming a color filter as an optical device, discharge is conducted by using a coloring ink from a ink jet printing apparatus. The coloring ink can optionally contain a coloring pigment, a solvent, and a resin binder. As the solvent and the resin binder, same materials as those described for "Formation of partition wall" can be used.

<Coloring Pigment>

The followings can be used as the coloring pigment in accordance with the color.

The red coloring pigment includes, C.I. Pigment Violet 19, C.I. Pigment Violet 23, C.I. Pigment Violet 29, C.I. Pigment Violet 30, C.I. Pigment Violet 37, C.I. Pigment Violet 40, C.I. Pigment Violet 50, C.I. Pigment Red 7, C.I. Pigment Red 9, C.I. Pigment Red 14, C.I. Pigment Red 41, C.I. Pigment Red 48:1, C.I. Pigment Red 48:2, C.I. Pigment Red 48:3, C.I. Pigment Red 48:4, C.I. Pigment Red 97, C.I. Pigment Red 122, C.I. Pigment Red 123, C.I. Pigment Red 146, C.I. Pigment Red 149, C.I. Pigment Red 177, C.I. Pigment Red 178, C.I. Pigment Red 180, C.I. Pigment Red 184, C.I. Pigment Red 185, C.I. Pigment Red 187, C.I. Pigment Red 192, C.I. Pigment Red 200, C.I. Pigment Red 202, C.I. Pigment Red 208, C.I. Pigment Red 210, C.I. Pigment Red 216, C.I. Pigment Red 220, C.I. Pigment Red 221, C.I. Pigment Red 223, C.I. Pigment Red 226, C.I. Pigment Red 227, C.I. Pigment Red 240, C.I. Pigment Red 246, C.I. Pigment Red 255, C.I. Pigment Red 264, C.I. Pigment Red 272, etc. Further, a mixture of C.I. Pigment Red 254 and C.I. Pigment Red 177 can also be used.

Further, as the green coloring pigment, C.I. Pigment Green 7, and C.I. Pigment Green 36 can be used. Further, a mixture of C.I. Pigment Green 36 and C.I. Pigment Yellow 150, C.I. Pigment Yellow 139, or C.I. Pigment Yellow 13 can be used.

Further, the blue coloring pigment includes C.I. Pigment Blue 15, C.I. Pigment Blue 15:3, C.I. Pigment Blue 15:4, C.I. Pigment Blue 15:6, C.I. Pigment Blue 22, C.I. Pigment Blue 60, etc. Further, the pigments mentioned above may also be used as a mixture of two or more of them.

In a case of forming an organic EL device as the optical device, an ink containing an organic light emitting material is used and discharged from a ink jet printing apparatus. The ink may optionally contains an organic light emitting material, a solvent, and a resin binder. For the solvent and the resin binder, same materials as those described above for (Formation of partition wall) can be used.

<Organic Light Emitting Material>

The organic light emitting material includes organic light emitting material soluble to organic solvent such as coumarin, perylene, pyran, anthrone, porphylene, quinacrydone, N,N'-dialkyl substituted quinacridone, nathalimide, N,N'-diaryl substituted pyrolopyrrole, iridium complex type, those organic light emitting materials dispersed in polymers such as polystyrene, polymethyl methacrylate, and polyvinyl carbazole, and polymeric organic light emitting materials such as polyarylene, polyarylene vinylene or polyfluorene types.

(First Aspect of the Invention)

The first aspect of the invention provides a method of manufacturing an optical device by using an ink jet head having plural nozzles arranged at an uniform distance substantially in a first direction, said method includes coloring pixels by discharging an ink on a substrate with pattern shaped partition walls so that colors of pixels adjacent in a second direction are different from each other while conducting main scanning of an ink jet head discharging an ink from the nozzles relatively in a second direction which is substantially in perpendicular to a first direction, wherein each nozzle discharges an ink respectively, wherein a unit step of discharging and printing an ink from a portion of plural nozzles is repeated, thereby printing the pixels, wherein each of the plural nozzles is specified with a natural number n counted sequentially from the end of the ink jet head, a surplus is defined as b when dividing the natural number n with a repetitive number a (b is an integer satisfying: $0 \leq b \leq a-1$), and the surplus b corresponds to each of the plural nozzles, and wherein the unit step is a step of selectively discharging the ink from one or more of the nozzles corresponding to the surplus b of a specified value, and wherein, in the unit step, a ratio of "an amount of one ink droplet discharged from a specified nozzle of the surplus b in a case where an ink droplet discharge from the specified nozzle is synchronization with that from the $a_{th}$ nozzle from the specified nozzle" to "that in a case where an ink droplet discharge from the specified nozzle is not synchronization with that from the $a_{th}$ nozzle from the specified nozzle" is found, a desired amount of an ink is found by multiplying "an amount of an ink droplet in a case where an ink droplet discharge from the specified nozzle is synchronization with that from the $a_{th}$ nozzle from the specified nozzle" by an inverse number of the ratio (as discharge coefficient), and the desired amount of an ink is discharged in a pixel.

The first aspect of the invention concerns a method used in a case of manufacturing an optical device by the second method using an ink jet printing apparatus having a single or two or more ink jet heads.

Figure 19:
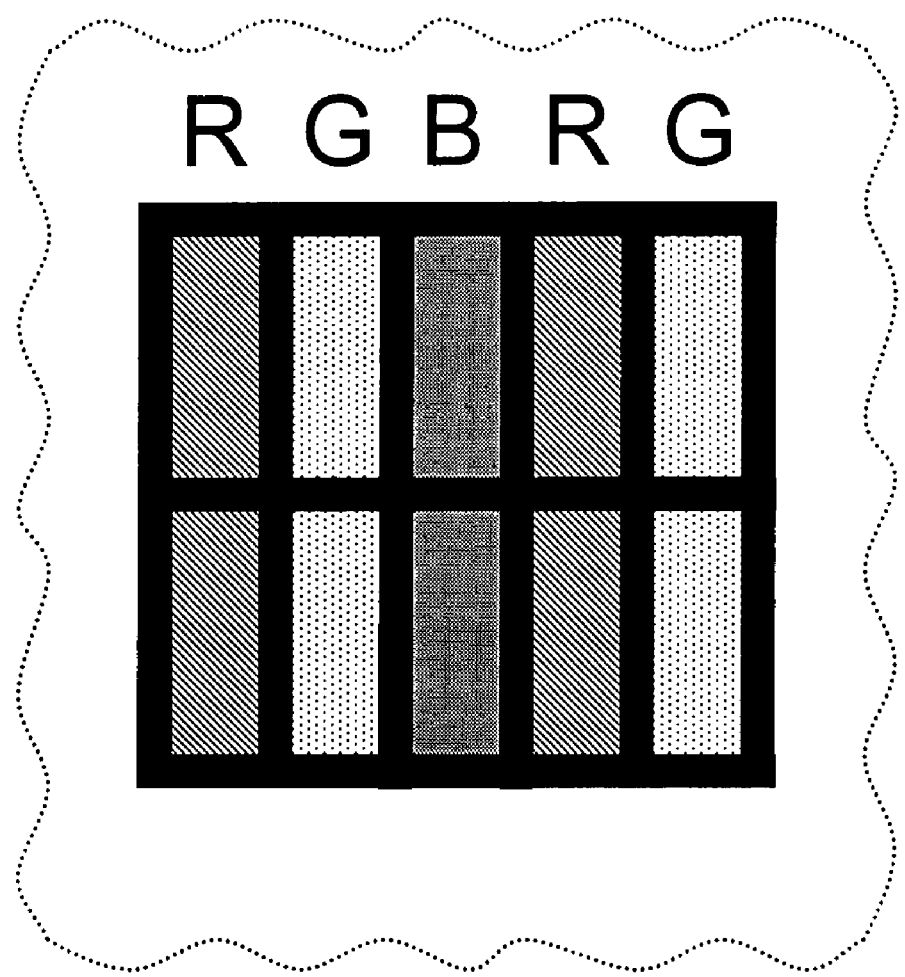
FIG. 19 is a schematic view showing an example of a pixel pattern of a color filter.

The first aspect of the invention provides a method of manufacturing an optical device constituted with a substrate, grid-like partition walls disposed for partition the substrate and plural elongate pixels partitioned by the partition walls. An example of this optical device (here, color filter) is shown in FIG. 19.

In the first feature of the invention, plural nozzles are arranged in the ink jet head such that the pitch between the adjacent nozzles along the second direction is equal.

Further, in the first aspect of the invention, a repetitive number a is at first set. Further, a number n from 1 to N is allocated sequentially to the nozzles arranged by the number of N to the ink jet head from the nozzle present at an extreme end. (N is the total number of nozzles belonging to an ink jet head.)

Figure 13:
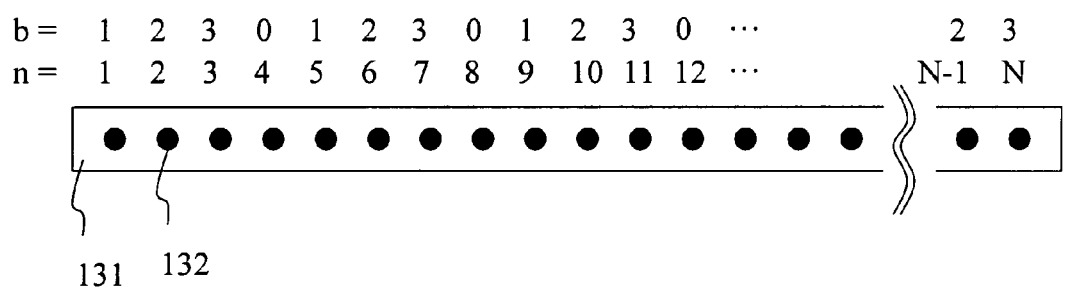
FIG. 13 is a schematic view showing an example of an arrangement for nozzles on an ink jet head.

Then, a surplus b is allocated to each of nozzles such that the nozzles by the number of N belong to any of predetermined repetitive numbers a. Specifically, n is divided with the repetitive number a to determine a surplus, which is set as a surplus b to each of the nozzles. In this way, the surplus b selected from 0 to (a−1) is provided to all the nozzles 1 to N. FIG. 13 shows an example of a state of indicating the surplus b allocated to the nozzles in the ink jet head having the nozzles by the number of N corresponding to the nozzle number n at the repetitive number a of 4.

Among the nozzles belonging to the ink jet head, discharge is conducted only from the nozzle having a surplus b equal with an optional integer (as $B_1$) selected from integers of 0 or more and (a−1) or less.

"Ink discharging" means discharging one or more ink droplet continuously at one time. Here, ink is independently discharged from nozzles of a surplus b and the number of droplets discharged from each nozzle at one time is also independently controlled. In the following description, a step of ink discharging from a nozzle performed at a time when an ink jet head passes once over a certain pixel in main scanning is described as an unit step.

FIG. 25 shows nozzles conducting discharge by black circles and nozzles not conducting discharge by blanc circles at $B_1=1$.

Successively, discharge is conducted from the nozzles having the surplus b equal with an optional integer (as $B_2$) different from $B_1$ selected from integers of 0 or more and (a−1) or less, except for resting nozzles.

Further, discharge can be conducted successively from the nozzles having a surplus b equal with an optical integer (as $B_3$) different from $B_2$ selected from integers of 0 or more and (a−1) or less.

Then, the unit step is conducted for an assembly $B=\{b|0 \leq b \leq a-1\}$ for all the surplus b satisfying: $0 \leq b \leq a-1$.

Here, inventors found that, in this unit step, as for an amount of one ink droplet discharged from a specified nozzle, a certain difference occurs depending on a difference between the number of droplets discharged from the specified nozzle and that from an adjacent nozzle discharging droplets at the same time as the specified nozzle. "An adjacent nozzle discharging droplets at the same time as the specified nozzle" is not a neighboring nozzle of the specified nozzle, but is a nozzle adjacent to the specified nozzle among nozzles discharging droplets at the same time as the specified nozzle.

A nozzle adjacent to a nozzle at nth position is not a nozzle at (n+1)th position or (n−1)th position, but is a nozzle at (n+a)th position or (n−a)th position. In FIG. 30, "An adjacent nozzle discharging droplets at the same time as the specified nozzle" in a case where n=4 is a nozzle at n=1 or 7.

As described above, as for nozzles corresponding to an identical surplus b, an ink is discharged at the same time, but the number of ink droplets discharged from each nozzle is not always same with each other. The number of ink droplets discharged from each nozzle can be independently controlled every nozzle.

As for all nozzles belonging to a certain surplus b, in a case where the identical number of ink droplets is discharged, there is not a case where an ink is solely discharged only from a certain nozzle.

However, when the numbers of ink droplets discharged from nozzles belonging to a certain surplus b at one discharge are different from each other, there is a case where an ink is solely discharged only from a specified nozzle. For example, FIG. 31 shows a case where one ink droplet is discharged from a specified nozzle at one discharge and two ink droplets are discharged from "an adjacent nozzle discharging droplets at the same time as the specified nozzle".

In FIG. 31, a first ink droplet is synchronously discharged from nozzles in right and left sides, but a second ink droplet is discharged only from a nozzle in a left side. As for the nozzle in a left side, dynamic situation of an ink in surroundings at the time of discharging of the first ink droplet is different from that at the time of discharging of the second ink droplet. So, an amount of the first ink droplet is different from an amount of the second ink droplet.

According to FIG. 31, two droplets are discharged from the nozzle in a left side, and a total amount of the ink droplet is 12.2 pl. On the other hand, one droplet is discharged from the nozzle in a right side, and amount of the droplet is 6.0 pl. As for the nozzle in a left side, the first droplet of 6.0 pl is discharged in synchronization with discharging of a droplet from the nozzle in a right side. Further, the second ink droplet of 6.2 pl is discharged from the nozzle in a left side. Since the discharging of the first droplet from the nozzle in a left side is in synchronization with the discharging of a droplet from the nozzle in a right side, an amount of the first droplet from the nozzle in a left side is equal to that from the nozzle in a right side.

It is thought that since a droplet is not discharged from the nozzle in a right side at the time of the second droplet discharging from the nozzle in a left side, a part of an ink in an ink chamber of the nozzle in a right side is discharged from the nozzle in a left side and an amount of the second droplet discharged from the nozzle in a left side increases.

FIG. 32 shows a case where one ink droplet is discharged from a specified nozzle at one discharging and three ink droplets is discharged from "an adjacent nozzle discharging droplets at the same time as the specified nozzle".

Same as a case shown in FIG. 31, an amount of a first droplet discharged from a nozzle in a left side is 6.0 pl which is equal to an amount of a droplet discharged from a nozzle in a right side. An amount of a second or a third droplet is 6.2 pl which is more than an amount of the first droplet. As shown in FIG. 32, a total amount of an ink including three droplets discharged from the nozzle in a left side is 18.4 pl.

FIG. 34 shows a case where one ink droplet is discharged from a specified nozzle (a nozzle in a left side) at one discharging, three ink droplet are discharged from "an adjacent nozzle (a center nozzle) discharging droplets at the same time as the specified nozzle" and two ink droplet are discharged from "an adjacent nozzle (a nozzle in a right side) discharging droplets at the same time as the specified nozzle".

Same as a case shown in FIG. 31, an amount of a droplet discharged from the center nozzle is 6.0 pl which is equal to an amount of a droplet discharged from the nozzles in a right and a left side. The second droplet discharging from the center nozzle is in synchronization with the droplet discharging from the nozzle in a right side. Therefore, an amount of a droplet discharged from the center nozzle is influenced by only the nozzle in a right side and the amount increases (6.2 pl). The third droplet discharging from the center nozzle is influenced by both the nozzles in a right and a left side and the amount of the third droplet further increases (6.4 pl). It is thought that the center nozzle is synergistically influenced by both the nozzles in a right and a left side.

In FIG. 34, a total amount of an ink including three droplets discharged from the center nozzle is 18.6 pl.

As described above, in the unit step, "an amount (6.0 pl) of one ink droplet discharged from a specified nozzle in a case where an ink droplet discharge from the specified nozzle is synchronization with that from the $a_{th}$ nozzle from the specified nozzle" is different from "an amount (6.2 pl) of one ink droplet discharged from a specified nozzle in a case where an ink droplet discharge from the specified nozzle is not synchronization with that from the $a_{th}$ nozzle from the specified nozzle"

The first aspect of the invention is a method of manufacturing an optical device including a step of discharging a desired amount of an ink inside a pixel by using the ratio (6.2/6.0=1.0333) as discharge coefficient.

An amount of an ink discharged from a specified nozzle is found by multiplying discharge coefficient, the number of ink discharging and an amount of an ink in a standard state where an ink is synchronously discharged from an adjacent nozzle discharging an ink at the same time as the specified nozzle.

A precise discharging of a desired amount of an ink inside a pixel is possible by using the above mentioned amount.

(Second Invention)

The second aspect of the invention provides a method of manufacturing an optical device of repeating the unit step continuously while relatively moving the plural nozzles and the substrate in the lateral direction (the second direction) of pixel in the method of printing the pixel as described above, wherein, the plural nozzles are disposed in the ink jet head, the ink jet head and the substrate are moved relatively in the lateral direction of the pixel, thereby moving the plural nozzles and the substrate relatively in the lateral direction of the pixel, two or more of nozzles having the values of the surplus b identical with each other are disposed in the ink jet head so as to reach the discharge positions at an identical timing, while the nozzles having the values of the surplus b are different from each other are disposed in the ink jet head so as to reach the discharging positions at timings different from each other, and the unit step is a step of starting ink discharge selectively from two or more of the nozzles reaching the discharging positions and conducting printing at the discharging positions along with relative movement of the ink jet head and the substrate in the lateral direction, at the timing where two or more of the nozzles having values of the surplus b identical with each other reach the discharging positions.

That is, in the second aspect of the invention, the ink jet head is moved relatively in the lateral direction of the elongate pixel on the basis of simultaneously conducting discharge from plural nozzles having an identical surplus b.

Then, in the second aspect of the invention, not only the discharge is conducted at the same timing from two or more of the nozzles where the values of surplus b are identical with each other upon ink discharge but also the operation is conducted such that they reach the discharging positions simultaneously.

The second aspect of the invention can be practiced by arranging the nozzles belonging to the ink jet head while periodically displacing them in the lateral direction of the pixel (hereinafter referred to also as a second direction) in accordance with the surplus b of the nozzle on the basis of arranging them at a uniform distance substantially in the longitudinal direction of the pixel (hereinafter referred to as first direction) as a whole. With such an arrangement, since the positional components in the second direction are equal in each of the positional components of the nozzles where the surplus b is equal, the discharging timing is identical with the nozzles having the equal surplus b upon scanning the ink jet head along the second direction.

In other words, nozzles are arranged such that two or more of the nozzles where the values of surplus b are identical reach the discharging positions at an identical timing. Specifically, the position of the $n_{th}$ nozzle along the second direction when allocating the number to the nozzle is made identical or substantially identical with the position of the $(n+a)_{th}$ nozzle along the second direction by the method described above.

Then, expressing the position of the nozzle in the second direction when the number n is allocated to the nozzle by the method described above as $Y(n)$, $Y(n+a)$ is made equal with $Y(n)$. Further, an optional position can be set from the position ($Y(1)$) of the first nozzle along the second direction to the position ($Y(a-1)$) of the $(a-1)_{th}$ nozzle along the second direction.

Figure 12:
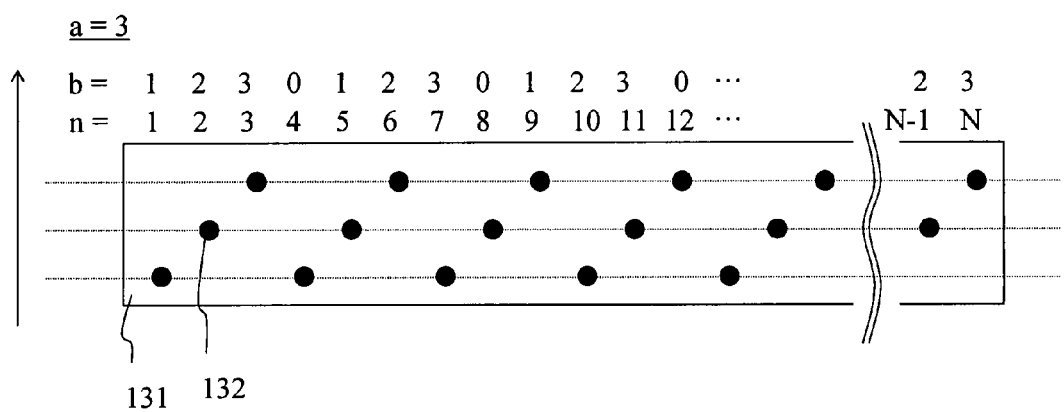
FIG. 12 is a schematic view showing an example of an arrangement for nozzles on an ink jet head.

FIG. 12 shows an example of the arrangement for the nozzles of the ink jet head used in the second aspect of the invention.

According to the second aspect of the invention, in "the step of conducting discharge simultaneously only from the nozzles having a specified surplus b" of the first aspect of the invention, an ink discharged in the step has been applied linearly to the substrate at a good accuracy. Accordingly, in the manufacture of an optical device having a stripe pattern such as a color filter, a product at high quality with no occurrence of color mixing or whitening failure can be provided.

The third aspect of the invention provides a method of manufacturing an optical device according to the first or the second aspect, wherein the method includes, specifying each of the plural nozzles in the ink jet head with a natural number n counted sequentially from the end of the pixel, specifying a repetitive number a, calculating a surplus $b_n$ of a nozzle according to an equation (1) and an equation (2), providing a time T[sec], defining the surplus b that the ink jet head specifies at that time as a function β[T] represented by an equation (3), advancing the time T upon starting discharge, and conducting discharge from the nozzles for the entire ink jet head so as to satisfy an equation (4) at an optional time T:

$$0 \leq b_n \leq (a-1) \tag{1}$$

$$b_n = n \bmod a \tag{2}$$

-continued $$\beta(T) = f\left(\left(\frac{1}{\pi}\right)T\right) \bmod a \tag{3}$$

$$b_n = \beta(T) \tag{4}$$

(in which (x)mod(y) is a function deriving an integer as a surplus when dividing an integer x with an integer y. f(x) is a function deriving an integer by cutting off a decimal fraction of a real number (x) and π is a positive real number (unit: sec)).

That is, in the third aspect of the invention, the surplus b for the $n_{th}$ nozzle is set as $b_n$ when allocating the number to the nozzle by the method described above. Further, the surplus b for discharge is defined as a function β(T) that changes with time T. π can be selected from optional real numbers previously.

Then, at a certain time T, discharge is conducted simultaneously only from the nozzles at the positions satisfying the equation (4). In this case, β(T) is represented by the equation (3). FIG. 11 shows an example where the function β(T) is at: a=3, a=4. As described above, β(T) is a function of repeating integers from 0 to (a−1). The repeating period is determined by the repetitive number a. The unit time for the period of changing the discharging condition is an identical time (sec) with the constant π. By conducting such discharge, since the ink discharging time from nozzles belonging to a certain discharging condition is always π (sec), an optical device at a constant ink film shape and with no occurrence of color shading, color mixing, etc. could be obtained.

The fourth aspect of the invention provides a method of manufacturing an optical device of specifying the plural nozzles in the ink jet head with a natural number n counted sequentially from the end of the pixel, defining the position of the nozzle in the second direction as $Y(n)$, arranging nozzles belonging to the ink jet head and situated at $(n+a)_{th}$ position from the end of the in jet head so as to satisfy an equation (5), conducting discharge in each of the nozzles (excluding the nozzles at n=(multiple number of a)) so as to satisfy an equation (6), defining the ingredient along the second direction in the speed of the main scanning of the ink jet head as V[m/sec], selecting an optional nozzle in the ink jet head, and defining the number counted from the nozzle present at the extreme end of the ink jet head that the nozzle belongs to:

$$Y(n+a)=Y(n) \tag{5}$$

$$Y(b_n+2)-Y(b_n+1)=V\pi \tag{6}$$

That is, in the fourth aspect of the invention nozzles are at first arranged in the ink jet head based on the same method as described in the second aspect of the invention. All the nozzles are arranged such that the position Y(n) in the second direction of the $n_{th}$ nozzle is identical with the position Y(n+a) in the second direction of the next nozzle separated by the number of a to form a pattern of nozzles repeating on every number of a in the ink jet head.

Further, β(T) is set in the same manner as the third aspect of the invention. Then, nozzles are arranged so as to satisfy the equation (5) for all the nozzles excluding the nozzle at n=(multiple number of a) and discharge is conducted.

That is, assuming the main scanning speed as V[m/sec], nozzles are arranged, in principle, such that nozzle distance (161, 162) between the adjacent nozzles in the second direction are displaced by Vπ[m] (FIG. 16). That is, main scanning is conducted at a speed of L/π[m/sec] when previously setting the distance between the adjacent nozzle in the second direction as L[m].

However, in a case of nozzles at: n=multiple number of a (a=3, n=3, 6, 9, 12 in a case shown in FIG. 16), nozzles are arranged not applying the equation (6) but applying the equation (5) to the adjacent nozzles (that is, nozzles at n=(multiple number of a+1 (n=4, 7, 10 in a shown in FIG. 16)). By arranging the nozzles as described above, an ink jet head in which the positions of the nozzles in the second direction change periodically is constituted.

FIG. 9 shows an example of change with time of an ink jet head in the manufacturing method of an optical device using the fourth aspect of the invention. FIG. 9 shows an ink jet head at a repetitive number: a=3, and n=1 to 9 (the uppermost nozzle in the ink jet head is defined as: n=1, and lower nozzles are defined as: n=2, n=3, . . . n=9). Three ink jet heads described in FIG. 9 show the state of discharging nozzles with change of time. The ink jet head at the uppermost portion shows an ink jet head at any instance: 0≦T≦π. The ink jet head at a middle portion shows an ink jet head at any instance: π≦T≦2π. The ink jet head in the lowermost portion shows an ink jet head at any instance: 2π≦T≦3π. In the example, $b_1$=0, $b_2$=1, $b_3$=2, $b_4$=0, $b_5$=1, $b_6$=2, $b_7$=0, $b_8$=1, $b_9$=2. In the first state (T=0), discharged is conducted simultaneously only from the nozzles 102 at surplus $b_n$=0 in the ink jet head 101. Since the nozzles for surplus $b_n$=0 are arranged at the identical position along the second direction, a stripe pattern could be formed at a good accuracy.

Successively, in the next state (T=π) after lapse of time π (sec), discharge is conducted simultaneously only from the nozzles 104 at surplus $b_n$=1 in the ink jet head 103. In this case, the ink jet head 103 has moved from the initial state by a distance (Vπ[m]) of the speed component V along the second direction of the main scanning speed multiplied by time π (sec). Accordingly, by arranging the nozzle 102 and the nozzle 104 at the positions along the second direction being previously displaced by Vπ[m], the ink could be applied also in the discharge in the next time (T=2π) to the identical position in the second direction with that for the ink discharged in the initial state. Further, also in the discharge in the next state (T=2π), the ink is discharged simultaneously only from the nozzles 106 at the surplus $b_n$=2 in the ink jet head 105. In this case, the ink jet head 105 has moved by a distance (2Vπ) for the speed component V along the second direction of the main scanning speed multiplied by a time 2π (sec). Then, by arranging the nozzle 102 and the nozzle 106 at the position along the second direction being previously displaced by 2Vπ, the ink could be applied also in the discharge in the next state (T=2π) to the identical position in the direction with that for the ink discharged in the initial state.

According to the invention, since discharged is not conducted simultaneously from the nozzles in the ink jet head, a stripe pattern could be formed accurately while suppressing the occurrence of crosstalk and by displacing the nozzle position by a predetermined position depending on the discharging condition parameter and the main scanning speed.

The fifth aspect of the invention provides a method of manufacturing an optical device by using an ink jet head having plural nozzles arranged at an uniform distance substantially in a first direction, said method includes coloring pixels by discharging an ink on a substrate with pattern shaped partition walls so that colors of pixels adjacent in a second direction are different from each other while conducting main scanning of an ink jet head discharging an ink from the nozzles relatively in a second direction which is substantially in perpendicular to a first direction, wherein each nozzle discharges an ink respectively, wherein a unit step of discharging and printing an ink from a portion of plural nozzles is repeated, thereby printing the pixels, wherein each of the plural nozzles is specified with a natural number n counted sequentially from the end of the ink jet head, a surplus is defined as b when dividing the natural number n with a repetitive number a (b is an integer satisfying: 0≦b≦a−1), and the surplus b corresponds to each of the plural nozzles, and wherein the unit step is a step of discharging one or more droplets from the nozzle corresponding to the surplus b of a specified value, measuring an amount of droplet (L1) and an amount of droplet (L2), finding discharge coefficient k satisfying the following expression:

$$L2-L1=k\times(n2-n3)+\text{constant},$$

and discharging an predetermined amount of an ink by reflecting the discharge coefficient k, wherein an amount of droplet (L1) is an amount of droplet discharged from a specified nozzle of the surplus b in a case where the same number of droplets is discharged from all the nozzles, and wherein an amount of droplet (L2) is an amount of droplet discharged from a nozzle adjacent to the specified nozzle in a case where the identical number (n2) of droplets is discharged from all the nozzles except for the specified nozzle of the surplus b and the number (n3:n3<n2) of droplets is discharged from the specified nozzle.

That is, as described in the first invention, in the unit step, an ink is selectively discharged from the plural nozzles corresponding to the surplus b of a specified value except for nozzles (resting nozzles) placed at a position corresponding to repeated patterns included in the lattice-shaped partition wall along a breadthwise direction of a pixel.

However, uniformity of an amount of a discharged ink in a case where an ink is discharged from nozzles including resting nozzles falls compared with a case where an ink is discharged from all the nozzles corresponding a surplus b of a specified value FIG. 27 shows the comparison of an amount of a discharged ink per once in a case where an ink is discharged from all the nozzles corresponding to a surplus b=0 with an amount of a discharged ink per once in a case where an ink is discharged from nozzles corresponding to a surplus b=0 except for resting nozzles.

FIG. 27 (a) shows an example where a stripe R pixel pattern is formed by using all nozzles of R (for red) ink jet head. In this example, the repetitive number is set as: a=3, an ink jet head is scanned for a lower direction, and an ink is discharged only once from each nozzle. At first ink is discharged from a nozzle of $b_n$=1, ink is discharged from a nozzle of $b_n$=2 next, ink is discharged from a nozzle of $b_n$=0 next. Then, as shown in FIG. 27, an almost same amount of an ink is discharged from nozzles of n=1-24, because a discharge condition of neighboring nozzles does not vary.

However, in a case where the number of times of droplet discharging of a specified nozzle is different from that of a nozzle adjacent to the specified nozzle discharging at the same time as the specified nozzle, an amount of droplets discharged from a nozzle having more discharging times increases compared with that from other nozzle.

FIG. 35 is a graph showing a relation between the number of droplet discharged from a nozzle adjacent to a observed nozzle (the number of times of ink discharging is 10) in lateral axis and increase of a dot amount of droplets (increase of a dot diameter) due to a difference between the numbers of droplets discharged from the observed nozzle and the adjacent nozzle.

As shown in the graph, in a case where the number of droplet discharged from the observed nozzle is different from that from the adjacent nozzle discharging droplets at the same time as the observed nozzle, an amount of one discharged droplet (a dot diameter) is substantially in proportion to the difference between the numbers of discharged droplets.

Then, in this invention, an amount of droplets discharged from a nozzle adjacent to a specified nozzle (L2) in a case where the identical number (n2) of droplets is discharged from all the nozzles except for the specified nozzle of the surplus b and the number (n3:n3<n2) of droplets is discharged from the specified nozzle is measured. Then, discharge coefficient k satisfying the following expression is found: L2−L1=k×(n2−n3)+constant. An amount of one droplet discharged from a nozzle in a case where the identical number of droplet is simultaneously discharged from adjacent nozzles is defined as a standard amount L*. The number of droplets from one discharge is defined as n. A total amount of an ink discharged from a nozzle in one unit step is found by the following expression: n×[L*+[k×(the number of discharging times of a nozzle−the number of discharging times of an adjacent nozzle)+constant]]. In the present invention, as described above, the number of discharging times n is found so as to obtain a desired amount of an ink for a pixel and an amount of discharged ink is adjusted by the number of ink discharging so that an amount of discharged ink becomes constant.

The sixth aspect of the invention provides a method of manufacturing an optical device by using an ink jet head with plural nozzles arranged at an uniform distance substantially in a first direction, said method includes coloring pixels by discharging an ink on a substrate with pattern shaped partition walls so that colors of pixels adjacent in a second direction are different from each other while conducting main scanning of an ink jet head discharging an ink from the nozzles relatively in a second direction which is substantially in perpendicular to a first direction, wherein each nozzle discharges an ink respectively, discharging an ink to a pixel from selected nozzle(s) from all usable nozzles, discharging an ink to a pixel from other selected nozzle(s) from all usable nozzles, repeating the discharging steps once or more times, wherein a ratio of "an amount of one ink droplet discharged from a specified nozzle among the selected nozzle(s) in a case where an ink droplet discharge from the specified nozzle is synchronization with that from a nozzle adjacent to the specified nozzle among the selected nozzle(s)" to "that in a case where an ink droplet discharge from the specified nozzle is not synchronization with that from a nozzle adjacent to the specified nozzle among the selected nozzle(s)" is found, a desired amount of an ink is found by multiplying "an amount of an ink droplet in a case where an ink droplet discharge from the specified nozzle is synchronization with that from a nozzle adjacent to the specified nozzle among the selected nozzle(s)" by inverse number of the ratio (as discharge coefficient), and the desired amount of an ink is discharged in a pixel.

According to present invention, an amount of droplets discharged from a specified nozzle can be found by multiplying "discharge coefficient", "the number of ink discharging" and "an amount of an droplet in a standard state where an ink is simultaneously and synchronously discharged from adjacent nozzles". A desired amount of an ink can be precisely discharged in a pixel based on the above mentioned amount of an ink.

The seventh aspect of the invention provides a method of manufacturing an optical device according to claim 6, wherein the selected nozzles may be two or more spaced nozzles. That is, there is a non-selected nozzle(s) between the selected nozzles.

According to present invention, an amount of droplets discharged from a specified nozzle can be found by multiplying "discharge coefficient", "the number of ink discharging" and "an amount of an droplet in a standard state where an ink is simultaneously and synchronously discharged from adjacent nozzles". A desired amount of an ink can be precisely discharged in a pixel based on the above mentioned amount of an ink.

The eighth aspect of the invention provides a method of manufacturing a color filter of forming a coloring ink layer on a substrate by using the manufacturing method of the optical device according to the first aspect of the invention described above.

According to this aspect of the invention, a color filter having a good linear accuracy of the coloring ink layer can be manufactured in the manufacture of the color filter having a stripe-like coloring ink layer using the second method described above. Accordingly, "color mixing", "whitening", and "color shading" in the coloring ink layer caused by the failure of the hitting accuracy of the ink could be prevented.

The ninth aspect of the invention provides a method of manufacturing a color filter according to the eighth aspect described above wherein the substrate is a glass substrate. A color filter excellent in heat resistance, whether proofness, and chemical resistance could be provided by the containment of the pigment in the ink.

The tenth aspect of the invention provides a method of manufacturing a color filter according to the eighth aspect described above, wherein the ink is a coloring ink containing a coloring pigment of a color selected from red, blue and green. A color filter excellent in the heat resistance, weather proofness and chemical resistance could be provided by the incorporation of the pigment in the ink.

The eleventh aspect of the invention provides a method of manufacturing a color filter according to the eighth aspect described above, wherein inks for red, blue, and green are discharged simultaneously as the coloring layers by using an ink jet head unit having ink jet heads discharging coloring inks of red (R), blue (B), and green (G). A color filter of a RGB three colors not causing color shading, color mixing, and whitening for any of the colors could be manufactured by using the manufacturing method of the optical device described above in the discharge of any of RGB three colors.

The twelfth aspect of the invention provides a method of manufacturing a color filter according to the eighth aspect described above, wherein partition walls for parting the surface of the substrate into plural regions are disposed on the substrate, and inks are discharged into plural regions from the ink jet head. A color filter of high quality while reliably preventing the occurrence of color mixing by disposing the partition walls for parting into the plural regions on the substrate and discharging the coloring inks into the plural regions.

The 13th aspect of the invention is a method of manufacturing a color filter according to the twelfth aspect described above, wherein the partition wall is formed of a resin containing a black pigment. Since the partition wall shields the light passing through the partition wall by the incorporation of the black pigment in the partition wall, it has an effect acting as a black matrix. Accordingly, a color filter of good contrast could be provided.

The 14th aspect of the invention provides a method of manufacturing a color filter according to the twelfth aspect described above wherein the partition wall is formed of a resin containing an ink repellent ingredient. Since the partition wall includes the ink repellent ingredient, the effect of the partition wall of preventing color mixing is enhanced and a color filter of higher quality could be provided.

In addition, by setting the viscosity of the coloring ink to 2 mPa·s or more, the effect of the crosstalk in the ink jet head can be decreased to prevent color mixing or the like. Further, by setting the viscosity of the coloring ink to 20 mPa·s or less, the shape of the coloring ink layer can be made favorable to decrease the color shading.

The 15th aspect of the invention provides a method of manufacturing a color filter according to the eighth aspect described above, wherein the coloring ink layer is formed into a stripe-like repetitive pattern or a grid-like repetitive pattern such that the pattern for each of colors is in parallel with the first direction (direction perpendicular to the main scanning direction). By forming the coloring ink layer into a stripe-like repetitive pattern or a grid-like repetitive pattern in parallel with the first direction, a coloring ink layer could be formed at a good accuracy and efficiently by using the method of manufacturing the optical device described above.

The 16th aspect of the invention provides a method of manufacturing an organic electroluminescence device as described above, wherein an organic light emitting layer is formed on the substrate by the method of manufacturing the optical device according to first aspect described above. According to this aspect, an organic electroluminescence device of good linear accuracy for the organic light emitting layer could be prepared in the manufacture of the organic electroluminescence device having the stripe-like organic light emitting layer using the second method described above. Accordingly, "color mixing", "whitening", and "color shading" in the organic light emitting layer caused by the failure of the hitting accuracy of the ink could be prevented.

The 17th aspect of the invention provides a method of manufacturing an organic electroluminescence device according to the 16th aspect described above, wherein the substrate is a glass substrate or a film-like substrate. An organic electroluminescence device of excellent heat resistance, weather proofness and chemical resistance could be provided by the use of the glass substrate. Further, it was possible to manufacture an organic EL device having flexibility by the use of the film-like substrate.

The 18th aspect of the invention provides a method of manufacturing an organic electroluminescence device according to the 16th aspect described above, wherein the ink is an ink containing an organic light emitting material of a color selected from red, blue and green. By using the method of manufacturing the optical device described above in the discharge of at least one of RGB three colors, an organic EL device of RGB three colors not causing color shading (light emission unevenness), color mixing, whitening for each of the colors could be manufactured by using the method of manufacturing the optical device described above.

The 19th aspect of the invention provides a method of manufacturing an organic electroluminescence device according to the 18th aspect described above, wherein inks for red, blue and green are discharged simultaneously as the organic light emitting layers by using an ink jet head unit having ink jet heads for discharging red, blue and green inks. By using the method of manufacturing the optical device also for the discharging any of the RGB three colors, an organic EL device of RGB three colors not causing color shading (light emitting unevenness), color mixing, and whitening in the organic light emitting layer for all the colors could be manufactured.

The 20th aspect of the invention provides a method of manufacturing an organic electroluminescence device according to the 16th aspect described above, wherein partition walls for parting the surface of the substrate into plural regions are disposed on the substrate, and inks are discharged into plural regions from the ink jet head. By providing the partition walls for parting into plural regions on the substrate and discharging inks into the plural regions, an organic EL device of high quality could be provided while reliably preventing color mixing.

The 21st aspect of the invention is a method of manufacturing an organic electroluminescence device according to the 20th aspect described above, wherein the partition wall is formed of a resin containing a black pigment.

Since the partition wall shields the light passing through the partition wall by the incorporation of the black pigment in the partition wall, it has an effect acting as a black matrix. Accordingly, an organic EL device filter of good contrast could be provided.

The 22nd aspect of the invention provides a method of manufacturing an organic electroluminescence device according to the 20th aspect described above wherein the partition wall is formed of a resin containing an ink repellent ingredient. Since the partition wall includes the ink repellent ingredient, the effect of the partition wall of preventing color mixing is enhanced and an organic EL device of higher quality could be provided.

The 23rd aspect of the invention provides a method of manufacturing an organic electroluminescence device according to the 16th aspects described above, wherein the viscosity of the coloring ink is from 2 to 20 mPa·s. By setting the viscosity of the coloring ink to 2 mPa·s or more, the effect of the crosstalk in the ink jet head can be decreased to prevent color mixing or the like. Further, by setting the viscosity of the coloring to 20 mPa·s or less, the shape of the organic light emitting layer can be made favorable to decrease the color shading.

The 24th aspect of the invention provides a method of manufacturing an organic electroluminescence device according to the 16th aspect described above, wherein the organic light emitting layer is formed into a stripe-like repetitive pattern or a grid-like repetitive pattern such that the pattern for each of colors is in parallel with the first direction (direction perpendicular to the main scanning direction). By forming the organic light emitting layer into a stripe-like repetitive pattern or a grid-like repetitive pattern in parallel with the first direction, the organic light emitting layer could be formed at a good accuracy and efficiently by using the method of manufacturing the optical device described above.

Example

The method of manufacturing the optical device of the invention is to be described specifically for a method of manufacturing a color filter as an example with reference to the drawings.

FIG. 19 shows a portion of a color filter as an object of the manufacture in this example in an enlarged scale. The color filter is attached to the frontal surface of a liquid crystal display apparatus, a white light source EL display apparatus, etc. The color filter is constituted by arranging coloring ink layers colored to R (red), G (green), B (blue) in a stripe-like or grid-like shape.

Figure 18:
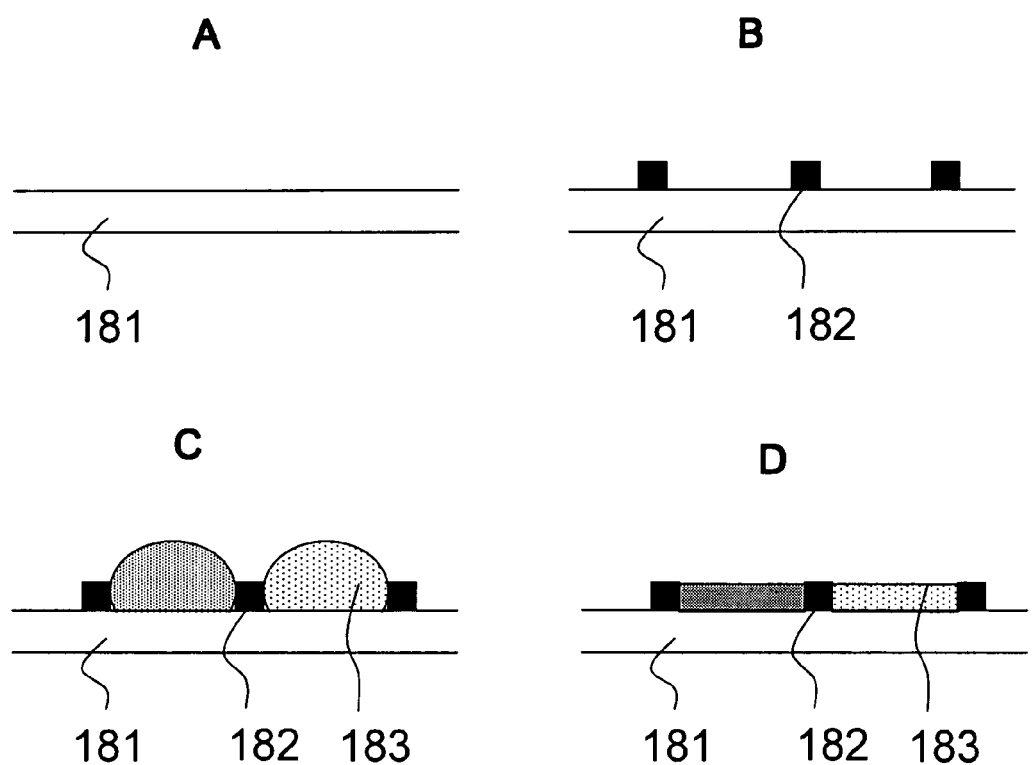
FIGS. 18 A, B, C and D are schematic views showing manufacturing steps of a color filter using an ink jet printer.

FIG. 18 shows a side elevational cross sectional view for a step of manufacturing a color filter. As a substitute 181, a glass substrate is used (FIG. 18(a)). At first, for improving the accuracy of the patterning of the color filter, the substrate is cleaned. Then, partition walls 182 are disposed on the substrate 181 (FIG. 18(b)). The partition wall is formed by a photolithographic method. Specifically, the partition wall is coated on the substrate 181 by using a resin composition containing a black pigment (carbon black), and an ink repellent (fluoro-compound) to a thickness of about 1 μm on the substrate 181. The critical surface tension of the resin composition used in this case is desirably from 30 to 40 mN/m.

The resin composition is exposed to a stripe-like or grid-like pattern through a photomask. Further, development is conducted by applying a liquid developer to the substrate. The partition walls 182 are formed so as to form predetermined regions for preventing color mixing of inks in the subsequent discharge by an ink jet printing apparatus.

Further, a heat treatment is applied to the substrate 181 in an oven at 200° C. for 10 min (post bake) to harden the partition wall 182. In this step, the ink repellent contained in the partition wall 182 is localized to the upper surface of the partition wall to enhance the color mixing preventive effect of the partition wall 182.

Successively, as shown in FIG. 18(c), coloring inks of red, blue, and green were discharged and applied to the open portions of the partition walls 182 by using an ink jet head as shown in FIG. 18(c).

The coloring ink layer 183 just after discharge has a shape raised upwards due to the surface tension thereof as shown in FIG. 18(c). A specific method of coating the coloring ink layer 183 on the substrate 181 is to be described specifically later.

Successively, the entire substrate was heat treated (post bake) being heated at 190° C. for 30 min to evaporate the solvent. Then, as shown in FIG. 18(d), the solvent is evaporated from the coloring ink pixel 183 to moderate the convex shape at the central portion. The color filter was obtained as described above.

Successively, an example of manufacturing an organic EL device as an optical device is to be described specifically for an embodiment of the invention.

| (Preparation of a photosensitive resin composition for forming partition wall) | |
|---|---|
| Binder resin: V259 (manufactured by Nippon Steel Chemical Co., Ltd) | 100 g |
| Compound having unsaturated double bond: pentaerythritol tetraacrylate | 1.65 g |
| Photopolymerization initiator: oxime type polymerization initiator (CGI-124 manufactured by Ciba Speciality Chemical) | 4.95 g |
| Dispersant: commercial solution in which a black pigment is dispersed together with a dispersant in a solvent: EX-2906 (manufactured by Mikuni Color Co.) | 159 g |
| Ink repellent "Modiper F2020" (manufactured by NOF corp.) | a little |
| Solvent: propylene glycol monoethyl ether acetate | 201 g |
| Leveling agent: BYK-330 (manufactured by Byk-Chemi Co.) | 0.003 g |

Each of the ingredients was mixed in the ratio described above and stirred and dissolved to prepare a photosensitive resin composition A used for forming partition walls.

(Formation of Anode)

Non-alkali glass ("#1737" manufactured by Coning Co.) was used as a substrate. After forming an ITO film on the substrate by a sputtering method to 150 nm thickness, the ITO film was patterned by a photolithographic method and a wet etching method to form an electrode layer on the side of the substrate.

(Formation of Partition Wall)

The photosensitive resin composition A was coated on the substrate over the entire surface in a thin film shape of 5.0 μm thickness and then pre-baked. Then, using a photomask having a grid-like pattern, exposure was conducted at 50 mJ/cm$^2$ by a super high pressure mercury lamp. Development was conducted with an aqueous 10% sodium carbonate solution for 30 sec to form the partition wall of the resin composition into a stripe shape. The substrate was placed in an oven and applied with heat hardening treatment.

(Preparation of a PEDOT Layer)

An aqueous solution of 3,4-polyethylene dioxythiophene (PEDOT) was coated on the substrate by a spin coating method to form a hole transporting material layer.

(Formation of an Organic Light Emitting Layer)

A toluene solution of 1.0 wt % polyarylenevinylene having polyarylenevinylene as an organic light emitting material was prepared as an ink. The ink was printed to the opening of the partition wall disposed on the substrate by using an ink jet printing apparatus to form an organic light emitting layer.

(Formation of Organic EL Device)

Then, a Ca film was formed as an electron injection layer of a sealing side electrode layer to a thickness of 5 nm on the organic light emitting medium layer. Then, an ITO film was formed as a transparent electrode layer on the organic light emitting medium layer formed with the Ca film by a sputtering method to 100 nm thickness. Finally, sealing was conducted by using a UV-curable resin to form an organic EL device.

Figure 17:
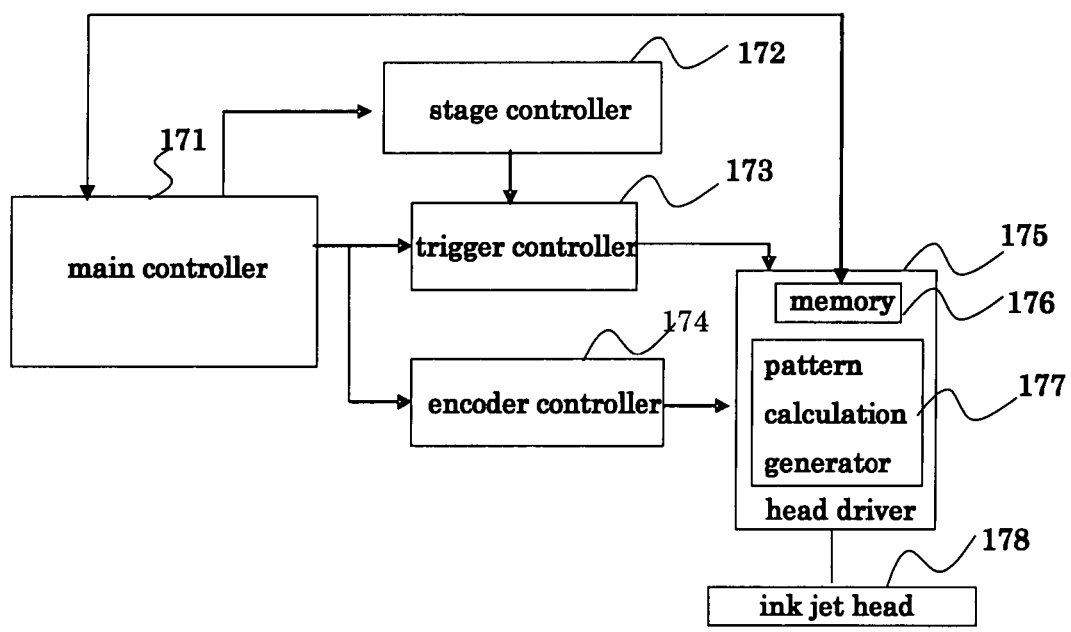
FIG. 17 is a driving flow chart for an ink jet head of the invention.

Then, FIG. 17 is a block diagram showing the constitution of an ink jet printing apparatus used for the manufacture of a color filter or an organic EL device of the example.

In FIG. 17, 171 represents a main controller for conducting entire control. Aside from the drawing, a discharging pattern information prepared based on the drawing information of a color filter are stored in a host personal computer (hereinafter referred to as host PC). Then, before discharge, the discharging pattern information are transferred from the host PC by way of the main controller 171 to a head driver 175 and then stored in a memory 176 on the head driver 175.

172 represents a stage controller for controlling a substrate transporting stage. 173 represents a trigger controller for controlling the timing for starting discharge. 174 represents an encoder controller for controlling the positional information of the substrate transporting stage. 175 represents a head driver for controlling driving and operation of an ink jet head (or ink jet head unit). 176 represents a memory for storing the discharge pattern information. 177 represents a pattern calculation generator for sending the discharge pattern information stored in the memory 176 to the ink jet head 178 based on the information from a trigger controller 173 and the encoder controller 174.

Figure 21:
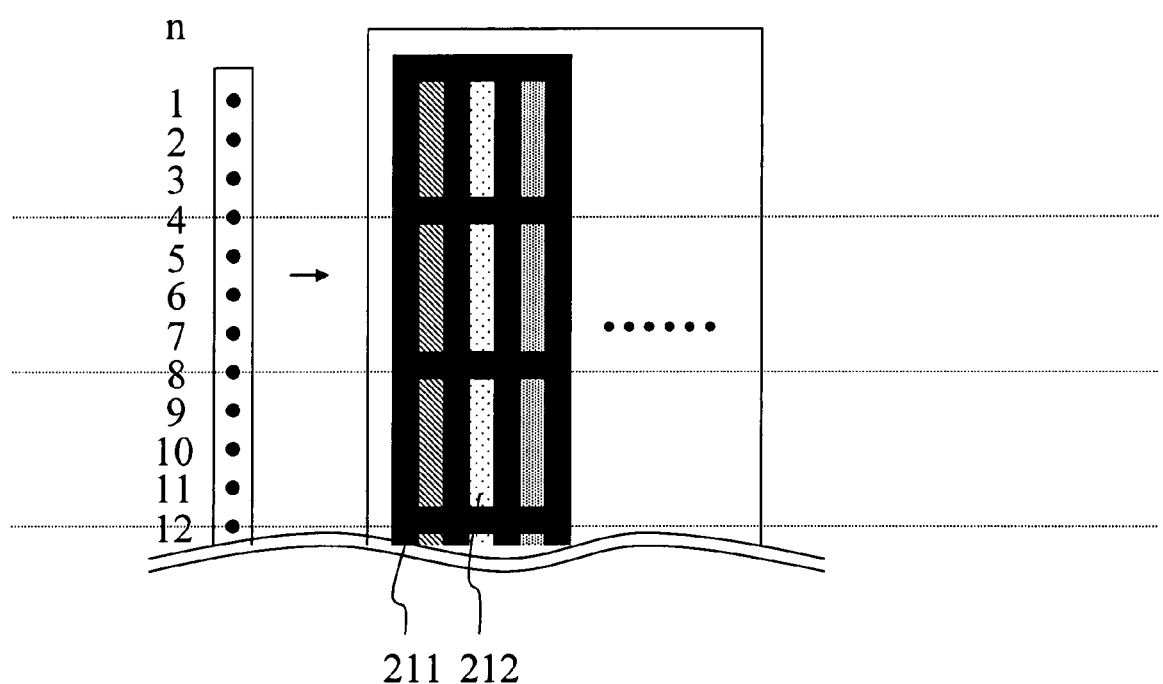
FIG. 21 is a schematic view showing nozzles and pixels of an ink jet head.

FIG. 21 shows another embodiment of the invention as an example of a color filter. Elongate pixels 212 and partition walls 211 are formed on a glass substrate. The partition wall is in a grid-like shape including not only a linear pattern along the longitudinal direction of the pixel 212 but also a linear pattern along the lateral direction of the pixels 212. In a case of forming the partition wall in the grid-like shape, the contrast ratio is improved and the effect of color mixing, if occurs, can be controlled to minimum compared with the case of forming the partition wall into the stripe-like shape.

In a case of manufacturing a color filter described above, it is necessary that a portion of plural nozzles arranged in the ink jet head does not conduct discharge. When discharge is conducted from all the nozzles, an ink discharged from the nozzle present on a line along the lateral direction of the pixel for the grid-like partition wall rides over the partition wall to cause occurrence of failure such as "color mixing".

Accordingly, in a case of FIG. 21, nozzles at n=4, n=8, n=12 are preferably not used for discharge.

Particularly, in a case of a piezoelectric device type (piezo type) ink jet head, the amount of the ink discharged from the nozzles undergoes the effect by vibrations of nozzles present in the vicinity and increases or decreases.

Accordingly, among plural nozzles present in the vicinity of a certain nozzle, in a case where one or more of nozzles stand still, the discharging amount changes as compared with the case where all the nozzles in the vicinity conduct discharge. Accordingly, in a case where the nozzles conducting discharge and the nozzles not conducting discharge are present unevenly, the amount of the ink discharged is different depending on the position of the nozzle to cause color shading.

Figure 22:
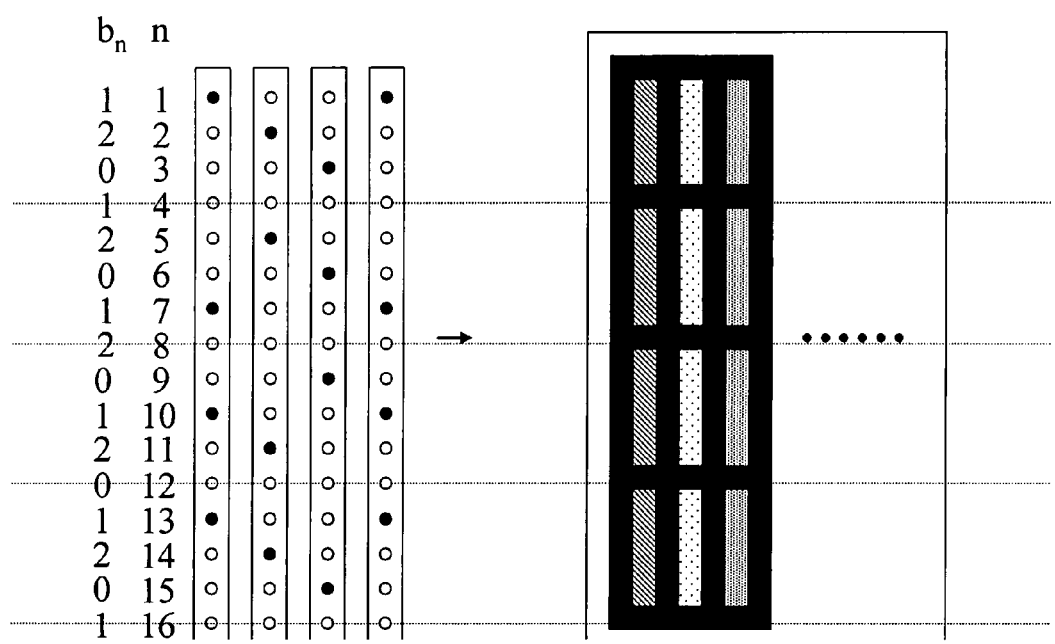
FIG. 22 is a schematic view showing a relation between change with time of a nozzle discharging state and a pixel pattern in an ink jet head.

FIG. 22 shows an example where the color shading occurs. FIG. 22 illustrates a state of nozzle discharge when taking notice on a specified ink jet head. n represents the number for each nozzle and $b_n$ represents the surplus for each nozzle. Since this is a case of an example where the repetitive number a is 3, $b_n$ is selected from 0 to 2. Further, $\beta(T)$ is an integer for specifying nozzles used for discharge among the nozzles in the ink jet head, which changes with time periodically as 0, 1, 2, 0, 1, 2.

Further, since the shape of the partition wall includes a linear pattern along the lateral direction of the pixels, nozzles at n=4, 8, 12 do not conduct discharge for preventing color mixing.

In the initial state, among the nozzles of the ink jet head, nozzles at $b_n$=1 are selected as nozzles used for discharge. However, the nozzles at n=4 can not be used for discharge since they situate at the position overlapping the linear pattern wall. After all, nozzles at n=1, 7, 10, 13 are used for discharge. Then, while not discharging nozzles are adjacent continuously by the number of five for the nozzles at n=1, 7, 13 (nozzles of the same discharging pattern are present in plurality also below the nozzle at n=16), not discharging nozzles are present in adjacent only by the number of three for the nozzles at n=7.

Then, since the discharging state of the continuously adjacent nozzles are different between the nozzles at n=1, 7, 13 (nozzles satisfying: n=2a×m (integer of 0 or more)+1) and nozzles at n=10 (nozzles satisfying: n=2a×m+4), the ink discharging amounts are different from each other to cause color shading.

Further, in the next state, among the nozzles in the ink jet head, nozzles at $b_n$=2 are selected as the discharging nozzles. However, since the nozzles at n=8 are present at the position overlapping the linear pattern of the partition wall, they can not be used. After all, the nozzles at n=2, 5, 11, 14 are used for discharging. Then, while not discharging nozzles are adjacent continuously by the number of five for the nozzles at n=5, 11, not discharging nozzles are present in adjacent only by the number of three for the nozzles at n=2, 14.

Then, since the discharging state of the continuously adjacent nozzles are different between the nozzles at n=5, 11 (nozzles satisfying: n=2a×m (integer of 0 or more)+5) and nozzles at n=2, 14 (nozzles satisfying: n=2a×m+2), the amounts of ink discharged are different from each other to also cause color shading.

In the further subsequent state, among the nozzles in the ink jet head, nozzles at $b_n$=0 are selected as the discharging nozzles. However, nozzles at n=12 can not be used for discharge since they are present at the positions overlapping the linear pattern of the partition wall. After all, nozzles at n=3, 6, 9, 15 are used for discharge. Then, while not discharging nozzles are in adjacent continuously by the number of five for the nozzles at n=3, 9, 12, not discharging nozzles are present in adjacent only by the number of three for the nozzles at n=10.

Then, since the discharging state of continuously adjacent nozzles are different between the nozzles at n=3, 9, 12 (nozzles satisfying: n=2a×m (integer of 0 or more)+3) and the nozzles at n=10 (nozzles satisfying: n=2a×m+4), the amounts of ink discharged are different to each other and it also causes color shading.

Figure 23:
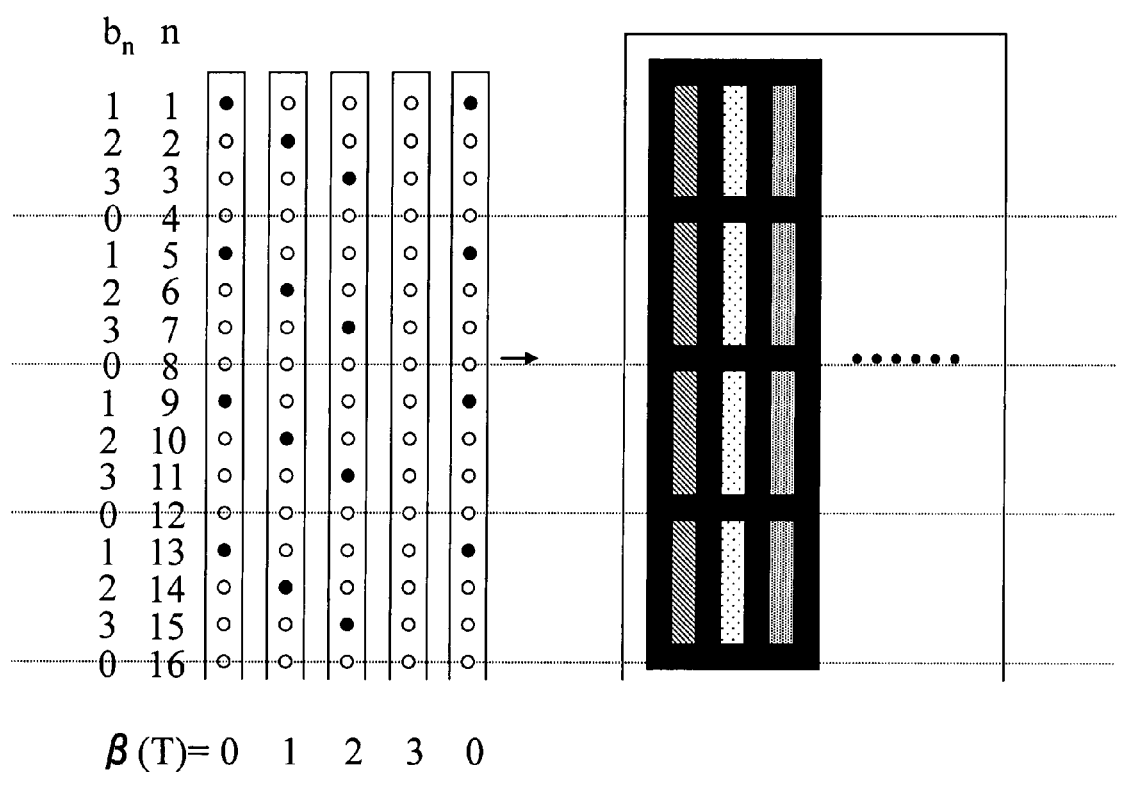
FIG. 23 is a schematic view showing a relation between change with time of a nozzle discharging state and a pixel pattern in an ink jet head.

FIG. 23 shows another example for the state of discharge from the nozzles when taking notice on a specified ink jet head. This is an example in a case of setting the repetitive number a as 4. $b_n$ is selected from 0 to 3. Further, $\beta(T)$ is an integer for specifying nozzles used for discharge among the nozzles in the ink jet heads and changes periodically with time as 0, 1, 2, 3, 0, 1, 2, 3.

Further, since the shape of the partition wall includes a linear pattern along the lateral direction of the pixels, nozzles at n=4, 8, 12 do not conduct discharge for preventing color mixing.

That is, in this case, for the shape of the partition walls, the distance between the linear patterns along the lateral direction of the pixels in the longitudinal direction of the pixel and (repetitive number a)×distance between adjacent nozzles) are made equal.

In the initial state, among the nozzles in the ink jet head, nozzles at $b_n$=1 are selected as the discharging nozzles. Accordingly, nozzles at n=1, 5, 9, 13 are used for discharge.

Not discharging nozzles for preventing color mixing are not included in the nozzles discharging in the initial state.

In the next state, among the nozzles in the ink jet head, nozzles at $b_n$=2 are selected as nozzles used for discharge. Accordingly, nozzles at n=2, 6, 10, 14 are used for discharge. Not discharging nozzles for preventing color mixing are not included in the discharging nozzles in the initial state.

In a further subsequent state, among the nozzles in the ink jet head, nozzles at $b_n$=3 are selected as the nozzles used for discharge. Accordingly, nozzles at n=3, 7, 11, 15 are used for discharge. The not discharging nozzles for preventing color mixing are not included in the nozzles discharging in the initial state.

In a further subsequent step, among the nozzles in the ink jet head, nozzles at $b_n$=0 are selected as the nozzles used for discharge. Accordingly, nozzles at n=4, 8, 12, 16 are selected. However, since all the nozzles are those not used for discharge for preventing color mixing and, after all, none of the nozzles conducts discharge in a state where $b_n$=3.

As described above, by making the substantial distance between the nozzles used for charging to each other equal with the distance of the linear patterns of the partition wall shape to each other along the lateral direction of the pixel in the longitudinal direction of the pixel, any of the nozzles used for discharge is in a uniform state with a view point of the effects of vibrations undergoing from the nozzles in the vicinity. Accordingly, the discharging amount of ink discharged does not fluctuate depending on the nozzles and color shading or the like is not caused.

FIG. 23 shows an example in which nozzles used for discharge in a state $b_n$ are completely synchronized with the linear pattern of the partition walls along the lateral direction of the pixel, and discharge is not conducted from all the nozzles at $b_n$, but the effect of the method can be obtained with no restriction to the example described above.

That is, even when the discharging nozzle and the partition wall pattern are not completely aligned, the effect of the method can be provided so long as the distance between the patterns of the partition wall is a several integer multiple of the distance between the discharging nozzles at a state $b_n$.

What is claimed is:

1. A method of manufacturing an optical device by using an ink jet head having plural nozzles arranged at an uniform distance or substantially uniform distance in a first direction, the method comprising:

coloring pixels by discharging ink on a substrate with pattern shaped partition walls so that colors of pixels adjacent in a second direction are different from each other while conducting main scanning of the ink jet head discharging ink from the nozzles in the second direction which is perpendicular or substantially perpendicular to the first direction, wherein each nozzle discharges an ink, wherein a unit step of discharging and printing an ink from a portion of the plural nozzles is repeated, thereby printing the pixels, wherein each of the plural nozzles is specified with a natural number n counted sequentially from the end of the ink jet head, a surplus is defined as b when dividing the natural number n with a repetitive number a, b being an integer satisfying: $0 \leq b \leq a-1$, and the surplus b corresponds to each of the plural nozzles, and wherein the unit step is a step of selectively discharging ink from one or more of the nozzles corresponding to the surplus b of a specified value, and wherein, in the unit step, a ratio of A to B is found, wherein "an amount of one ink droplet discharged from a specified nozzle of the surplus b in a case where an ink droplet discharge from the specified nozzle is synchronized with an ink droplet discharge from $a_{th}$ nozzle from the specified nozzle"

is defined as A, and wherein

"an amount of one ink droplet discharged from a specified nozzle of the surplus b in a case where an ink droplet discharge from the specified nozzle is not synchronized with an ink droplet discharge from the $a_{th}$ nozzle from the specified nozzle"

is defined as B, a desired amount of ink is found by multiplying C by D, wherein "an amount of an ink droplet in a case where an ink droplet discharge from the specified nozzle is synchronized with an ink droplet discharge from the $a_{th}$ nozzle from the specified nozzle"

is defined as C, and wherein an inverse number of the ratio is defined as D, and the desired amount of ink is discharged in a pixel.

2. A method of manufacturing an optical device of repeating the unit step continuously while relatively moving the plural nozzles and the substrate in the second direction of pixel in the method of printing the pixel according to claim 1, wherein the ink jet head and the substrate are moved relatively in the second direction of the pixel, thereby moving the plural nozzles and the substrate relatively in the second direction of the pixel, two or more of nozzles having the values of the surplus b identical with each other are disposed in the ink jet head so as to reach the discharge positions at an identical timing, while the nozzles having the values of the surplus b are different from each other are disposed in the ink jet head so as to reach the discharging positions at timings different from each other, and the unit step is a step of starting ink discharge selectively from two or more of the nozzles reaching the discharging positions and conducting printing at the discharging positions along with relative movement of the ink jet head and the substrate in the second direction, at the timing where two or more of the nozzles having values of the surplus b identical with each other reach the discharging positions.

3. A method of manufacturing an optical device according to claim 1, specifying each of the plural nozzles in the ink jet head with a natural number n counted sequentially from the end of the pixel, specifying the repetitive number a, calculating a surplus $b_n$ of a nozzle according to equation (1) and equation (2), providing a time T[sec], defining the surplus b that the ink jet head specifies at that time as a function β[T] represented by an equation (3), advancing the time T upon starting discharge, and conducting discharge from the nozzles for the entire ink jet head so as to satisfy an equation (4) at an optional time T:

$$0 \leq b_n \leq (a-1) \quad (1)$$

$$b_n = n \bmod a \quad (2)$$

$$\beta(T) = f\left\{\left(\left(\frac{1}{\pi}\right) - T\right) \bmod a\right\} \quad (3)$$

$$b_n = \beta(T) \quad (4)$$

wherein (x)mod(y) is a function deriving an integer as a surplus when dividing an integer x with an integer y and f(x) is a function deriving an integer by cutting off the decimal fraction of a real number (x) and it is a positive real number (unit: sec)).

4. A method of manufacturing an optical device according to claim 3, wherein the method comprises: specifying each of the plural nozzles in the ink jet head by a natural number n counted sequentially from the end of the pixel, and defining the position of the nozzle along the second direction as Y(n), arranging the nozzle belonging to the ink jet head and situated at an $(n+a)_{th}$ position from the end of the inkjet head so as to satisfy an equation (5), conducting discharge in each of the nozzles (excluding the nozzles at n=(multiple number of a)) so as to satisfy an equation (6), defining the ingredient along the second direction in the speed of the main scanning of the ink jet head as V[m/sec], selecting an optional nozzle in the ink jet head, and defining the number counted from the nozzle present at the extreme end of the ink jet head that the nozzle belongs to:

$$Y(n+a)=Y(n) \quad (5)$$

$$Y(b_n+2)-Y(b_n+1)=V\pi \quad (6).$$

5. A method of manufacturing an optical device by using an ink jet head having plural nozzles arranged at an uniform distance or substantially uniform distance in a first direction, the method comprising:
coloring pixels by discharging ink on a substrate with pattern shaped partition walls so that colors of pixels adjacent in a second direction are different from each other while conducting main scanning of the ink jet head discharging ink from the nozzles in the second direction which is perpendicular or substantially perpendicular to the first direction,
wherein each nozzle discharges an ink,
wherein a unit step of discharging and printing an ink from a portion of the plural nozzles is repeated, thereby printing the pixels,
wherein each of the plural nozzles is specified with a natural number n counted sequentially from the end of the ink jet head, a surplus is defined as b when dividing the natural number n with a repetitive number a b being an integer satisfying: $0 \leq b \leq a-1$, and the surplus b corresponds to each of the plural nozzles, and
wherein the unit step is a step of discharging one or more droplets from the nozzle corresponding to the surplus b of a specified value,
measuring an amount of droplet (L1) and an amount of droplet (L2),
finding discharge coefficient k satisfying the following expression:

$$L2-L1=k \times (n2-n3)+\text{constant},$$

and discharging an predetermined amount of an ink by reflecting the discharge coefficient k,
wherein an amount of droplet (L1) is an amount of droplet discharged from a specified nozzle of the surplus b in a case where the same number of droplets is discharged from all the nozzles,
and wherein an amount of droplet (L2) is an amount of droplet discharged from a nozzle adjacent to the specified nozzle in a case where the identical number (n2) of droplets is discharged from all the nozzles except for the specified nozzle of the surplus b and the number (n3: n3<n2) of droplets is discharged from the specified nozzle.

6. A method of manufacturing an optical device by using an ink jet head with plural nozzles arranged at an uniform distance or substantially uniform distance in a first direction, the method comprising:
coloring pixels by discharging ink on a substrate with pattern shaped partition walls so that colors of pixels adjacent in a second direction are different from each other while conducting main scanning of the ink jet head discharging ink from the nozzles in the second direction which is perpendicular or substantially perpendicular to the first direction, wherein each nozzle discharges an ink,
discharging an ink to a pixel from selected nozzle(s) from all usable nozzles,
discharging an ink to a pixel from other selected nozzle(s) from all usable nozzles,
repeating the discharging steps one or more times,
wherein
a ratio of E to F is found
wherein
"an amount of one ink droplet discharged from a specified nozzle among the selected nozzle(s)
in a case where an ink droplet discharge from the specified nozzle is synchronized with an ink droplet discharge from a nozzle adjacent to the specified nozzle among the selected nozzle(s)"
is defined as E,
and
wherein
"an amount of one ink droplet discharged from a specified nozzle among the selected nozzle(s)
in a case where an ink droplet discharge from the specified nozzle is not synchronized with an ink droplet discharge from a nozzle adjacent to the specified nozzle among the selected nozzle(s)"
is defined as F,
a desired amount of an ink is found by multiplying G by H,
wherein
"an amount of an ink droplet
in a case where an ink droplet discharge from the specified nozzle is synchronized with an ink droplet discharge from a nozzle adjacent to the specified nozzle among the selected nozzle(s)"
is defined as G,
and
wherein
inverse number of the ratio is defined as H,
and
the desired amount of an ink is discharged in a pixel.

7. A method of manufacturing an optical device according to claim 6, wherein the selected nozzles are two or more spaced nozzles.

8. A method of manufacturing a color filter of forming a coloring ink layer on a substrate by using the manufacturing method of the optical device according to claim 1.

9. A method of manufacturing a color filter according to claim 8, wherein the substrate is a glass substrate.

10. A method of manufacturing a color filter according to claim 8, wherein the ink is a coloring ink containing a coloring pigment of a color selected from red, blue and green.

11. A method of manufacturing a color filter according to claim 10, wherein inks for red, blue, and green are discharged simultaneously as the coloring layers by using an ink jet head unit having ink jet heads discharging coloring inks of red, blue, and green.

12. A method of manufacturing a color filter according to claim 8, wherein partition walls for parting the surface of the substrate into plural regions are disposed on the substrate, and inks are discharged into plural regions from the ink jet head.

13. A method of manufacturing a color filter according to claim 12, wherein the partition wall is formed of a resin containing a black pigment.

14. A method of manufacturing a color filter according to claim 12, wherein the partition wall is formed of a resin containing an ink repellent ingredient.

15. A method of manufacturing a color filter according to claim 8, wherein the coloring ink layer is formed into a stripe-like repetitive pattern or a grid-like repetitive pattern such that the pattern for each of colors is in parallel with the first direction.

16. A method of manufacturing an organic electroluminescence device, wherein an organic light emitting layer is formed on the substrate by the method of manufacturing the optical device according to claim 1.

17. A method of manufacturing an organic electroluminescence device according to claim 16, wherein the substrate is a glass substrate or a film-like substrate.

18. A method of manufacturing an organic electroluminescence device according to claim 16, wherein the ink is an ink containing an organic light emitting material of a color selected from red, blue and green.

19. A method of manufacturing an organic electroluminescence device according to claim 18, wherein inks for red, blue and green are discharged simultaneously as the organic light emitting layers by using an ink jet head unit having ink jet heads for discharging red, blue and green inks.

20. A method of manufacturing an organic electroluminescence device according to claim 16, wherein partition walls for parting the surface of the substrate into plural regions are disposed on the substrate, and inks are discharged into plural regions from the ink jet head.

21. A method of manufacturing an organic electroluminescence device according to claim 20, wherein the partition wall is formed of a resin containing a black pigment.

22. A method of manufacturing an organic electroluminescence device according to claim 20, wherein the partition wall is formed of a resin containing an ink repellent ingredient.

23. A method of manufacturing an organic electroluminescence device according to claim 16, wherein the viscosity of the coloring ink is from 2 to 20 mPa·s.

24. A method of manufacturing an organic electroluminescence device according to claim 16, wherein the organic light emitting layer is formed into a stripe-like repetitive pattern or a grid-like repetitive pattern such that the pattern for each of colors is in parallel with the first direction.

* * * * *